(12) United States Patent
Demadrille et al.

(10) Patent No.: US 9,171,676 B2
(45) Date of Patent: Oct. 27, 2015

(54) ORGANIC COLOURANT AND USES THEREOF IN PHOTOVOLTAIC CELLS

(71) Applicant: COMMISSARIAT A L'ENERGIE ATOMIQUE ET AUX ENERGIES ALTERNATIVES, Paris (FR)

(72) Inventors: Renaud Demadrille, Saint Egreve (FR); Yann Kervella, Saint Verand (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/356,031

(22) PCT Filed: Nov. 12, 2012

(86) PCT No.: PCT/EP2012/072401
§ 371 (c)(1),
(2) Date: May 2, 2014

(87) PCT Pub. No.: WO2013/068588
PCT Pub. Date: May 16, 2013

(65) Prior Publication Data
US 2014/0290748 A1 Oct. 2, 2014

(30) Foreign Application Priority Data

Nov. 10, 2011 (FR) ...................................... 11 60276
Nov. 21, 2011 (FR) ...................................... 11 60600

(51) Int. Cl.
*H01L 51/00* (2006.01)
*H01G 9/20* (2006.01)
*C09B 57/00* (2006.01)
*H01L 51/42* (2006.01)

(52) U.S. Cl.
CPC ............ *H01G 9/2027* (2013.01); *C09B 57/008* (2013.01); *H01L 51/0059* (2013.01); *H01L 51/0061* (2013.01); *H01L 51/0064* (2013.01); *H01L 51/0068* (2013.01); *H01L 51/0071* (2013.01); *H01L 51/0072* (2013.01); *H01L 51/0074* (2013.01); *H01G 9/2059* (2013.01); *H01L 51/4226* (2013.01); *Y02E 10/549* (2013.01)

(58) Field of Classification Search
CPC ............................ C09B 57/008; H01G 9/2027
USPC ........................................................ 548/126
See application file for complete search history.

(56) References Cited

U.S. PATENT DOCUMENTS

| 2010/0168444 A1 | 7/2010 | Chen et al. |
| 2010/0174095 A1 | 7/2010 | Koumura et al. |
| 2011/0112289 A1 | 5/2011 | Giraud et al. |

FOREIGN PATENT DOCUMENTS

| CN | 101029182 A | 9/2007 |
| CN | 101407639 A | 4/2009 |
| CN | 101475568 A | 7/2009 |
| CN | 101967301 A | 2/2011 |
| CN | 102002037 A | 4/2011 |
| JP | 2007149570 A | 6/2007 |
| JP | 2009269987 A | 11/2009 |
| WO | 2009109499 A1 | 9/2009 |

OTHER PUBLICATIONS

Carpel, U., et al., "Dye Regeneration by Spiro-MeOTAD in Solid State Dye-Sensitized Solar Cells Studied by Photoinduced Absorption Spectroscopy and Spectroelectrochemistry", "J. Phys. Chem. C", Mar. 19, 2009, pp. 6275-6281, vol. 113.

Ceron-Carrasco, J., et al, "Excited-state nature in benzodifuranone dyes: Insights from ab initio simulations", "Dyes and Pigments", Aug. 17, 2011, pp. 1144-1152, vol. 92.

Chen, H., et al., "High Molar Extinction Coefficient Branchlike Organic Dyes Containing Di(p-tolyl)phenylamine Donor for Dye-Sensitized Solar Cells Applications", "J. Phys. Chem. C", Feb. 2, 2010, pp. 32803286, vol. 114.

Chen, R., et. al., "Effect of Tetrahydroquinoline Dyes Structure on the Performance of Organic Dye-Sensitized Solar Cells", "Chem. Mater. ", Jul. 11, 2007, pp. 4007-4015, vol. 19.

Graetzel, M., "Recent Advances in Sensitized Mesoscopic Solar Cells", "Accounts of Chemical Research", Nov. 2009, pp. 1788-1798, vol. 42, No. 11.

Joly, D., et al., "A Robust Organic Dye for Dye Sensitized Solar Cells Based on Iodine/Iodide Electrolytes Combining High Efficiency and Outstanding Stability", "Scientific Reports", Feb. 7, 2014, pp. 1-7, doi:10.1038/srep04033, vol. 4, No. 1033.

Kalyanasundaram, K. (Ed.), "Dye Sensitized Solar Cells", Aug. 3, 2010, pp. 1-320, Table of Contents only; Publisher: EPFL Press, Published in: Lausanne, Switzerland, CRC Press.

Kim, S., et al., "Flexible dye-sensitized solar cells using ZnO coated TiO2 nanoparticles", "Journal of Photochemistry and Photobiology A: Chemistry", Dec. 8, 2004, pp. 269-273, vol. 171.

(Continued)

*Primary Examiner* — Taofiq A Solola
(74) *Attorney, Agent, or Firm* — Hultquist, PLLC; Mary B. Grant

(57) ABSTRACT

The present invention relates to an organic colorant corresponding to one of the following structures (I) or (II):

eD-pi-conjugated chromophore-L-A        (I)

A-L-pi-conjugated chromophore-eD        (II)

in which eD represents an electron donor segment; L represents a covalent bond or a spacer segment; A represents an electron attractor segment able to form a covalent bond with a semi-conductor; the pi-conjugated chromophore comprising at least two aromatic rings, at least one of which is a thiophene, selenophene or furan type ring. The present invention relates to the use thereof as photosensitizer in a photovoltaic device and said photovoltaic device.

12 Claims, 2 Drawing Sheets

(56) References Cited

OTHER PUBLICATIONS

Liu, W., et al., "Simple organic molecules bearing a 3,4-ethylenedioxythiophene linker for efficient dye-sensitized solar cells", "Chemical Communications", Sep. 24, 2008, pp. 5152-5154.

Mishra, A., et al., "Metal-Free Organic Dyes for Dye-Sensitized Solar Cells: From Structure: Property Relationships to Design Rules", "Angewandte Chemie International Edition", Mar. 17, 2009, pp. 2474-2499, vol. 48, No. 14.

Ooyama, Y., et al., "Molecular Designs and Syntheses of Organic Dyes for Dye-Sensitized Solar Cells", "Eur. J. Org. Chem.", Apr. 30, 2009, pp. 2903-2934, vol. 2009, No. 18.

O'Regan, B., et al, "A low-cost, high-efficiency solar cell based on dye-sensitized colloidal TiO2 films", "Nature", Oct. 24, 1991, pp. 737-740, vol. 353.

Preat, J., et al., "Improvement of the efficiency of thiophene-bridged compounds for dye-sensitized solar cells", "Chemical Physics", Aug. 7, 2010, pp. 56-68, vol. 376.

Tan, B., et al., "Zinc Stannate (Zn2SnO4) Dye-Sensitized Solar Cells", "J. Am. Chem. Soc.", Mar. 20, 2007, pp. 4162-4163, vol. 129.

Wang, P., et al., "A High Molar Extinction Coefficient Sensitizer for Stable Dye-Sensitized Solar Cells", "J. Am. Chem. Soc.", Dec. 31, 2004, pp. 808-809, vol. 127.

Wu, W., et al., "Efficient and stable dye-sensitized solar cells based on phenothiazine sensitizers with thiophene units", "Journal of Materials Chemistry", Jan. 14, 2010, pp. 1772-1779, vol. 20.

Xu, W., et al., "New Triphenylamine-Based Dyes for Dye-Sensitized Solar Cells", "J. Phys. Chem. C", Jan. 1, 2008, pp. 874-880, vol. 112.

Yan, F., et al., "Effect of Surface Etching on the Efficiency of ZnO-Based Dye-Sensitized Solar Cells", "Langmuir", Jan. 29, 2010, pp. 7153-7156, vol. 26, No. 10.

Zeng, W., et al., "Efficient Dye-Sensitized Solar Cells with an Organic Photosensitizer Featuring Orderly Conjugated Ethylenedioxythiophene and Dithienosilole Blocks", "Chem. Mater", Jan. 22, 2010, pp. 1915-1925, vol. 22.

ORGANIC COLOURANT AND USES THEREOF IN PHOTOVOLTAIC CELLS

CROSS-REFERENCE TO RELATED APPLICATIONS

This application is a U.S. national phase under the provisions of 35 U.S.C. §371 of International Patent Application No. PCT/EP12/72401 filed Nov. 12, 2012, which in turn claims priority of French Patent Application No. 1160276 filed Nov. 10, 2011 and French Patent Application No. 1160600 filed Nov. 21, 2011. The disclosures of such international patent application and French priority patent applications are hereby incorporated herein by reference in their respective entireties, for all purposes.

TECHNICAL FIELD

The present invention belongs to the field of photoelectrical energy and, particularly, to the field of photovoltaic cells and devices.

More particularly, the present invention proposes a family of purely organic compounds, based on pi-conjugated chromophores and the use thereof as electrode photosensitizers in photovoltaic devices.

PRIOR ART

At present, the best hybrid solar cells are manufactured from a nanostructured massive semi-conductor which is generally a transparent titanium oxide. The surface of said oxide is functionalised by grafting of photosensitive colorants (or sensitizing dye), very often organometallic. An electrolyte, generally liquid, but which can also be a gel or a p-type semi-conductor solid, completes the system, trapped between two transparent electrodes. This type of cell enables the manufacture of semi-transparent panels of varied colours as a function of the chosen colorant.

In this type of cell, solar photons are absorbed by the colorants and the photogenerated electronic charges are then injected from said colorants into the oxide, the function of which is to convey the electrons to the electrode. FIG. 1 is a schematisation of the different constituents of such a photovoltaic cell [1].

To summarise, in these cells, the separation of the photogenerated charges in the colorant takes place at the interface between the colorant, the semi-conductor and the electrolyte, which makes the colorant one of the essential elements of the device.

The most efficient colorants in this field are organometallic complexes generally based on ruthenium and conversion yields are comprised between 11 and 12% [2]. The main drawback of hybrid cells, which are among the most efficient in the field of alternative cells to technologies known as conventional, resides in the fact that a ruthenium based organometallic colorant is extremely costly (in 2011, one gramme of complex is worth around 800 to 1000 euros). In addition, ruthenium is one of the 9 rarest metals on Earth, leading de facto to an extremely volatile price of this raw material. Finally, ruthenium is a toxic element and some of its derivatives are identified as carcinogenic or mutagenic.

Thus, the replacement of ruthenium complexes in solar cells by cheap and less toxic organic compounds, the optoelectronic properties of which may be easily modulated, is thus desirable to enable solar cells sensitised with colorants to develop on a large scale.

Recently, colorants available in the form of purely organic molecules have been developed and employed in an efficient manner (between 8 and 10%) in photovoltaic cells [3].

Generally speaking, said photosensitizers must have energy levels whose positions are well adjusted to the redox potential of the electrolyte and to the conduction band level of the oxide. But a crucial point relates to the absorption properties of the molecules, which need to be capable of absorbing, in an intense manner and over a wide range of wavelengths, the photons emitted by the sun. In addition, the anchoring function that the latter needs to comprise to attach itself in a stable manner to the surface of the oxide is also important: it needs to be adapted to the surface of the oxide.

Most of the organic compounds employed are conceived and constructed according to the following scheme:

Diagram 1: Principle of conception of organic colorants

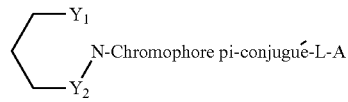

They thus have:
- an electron donor segment (eD) with stable redox properties i.e. an arylamine (—N($Y_1$)($Y_2$)) type redox function that enables the colorant to be reduced more easily by the electrolyte;
- a pi-conjugated part, more or less extended, which makes it possible to absorb efficiently solar photons and which enables the charges to be evacuated into the oxide more easily;
- and finally an anchoring function of electron acceptor character (A) of carboxylic or cyano-acrylic type that is connected to the pi-conjugated system of the molecule by a spacer (L) comprising, preferably, an ethylenic function.

This anchoring function enables the grafting and the sensitisation of particles by facilitating electron transfer from electrodeficient aromatic rings to the oxide. It should nevertheless be noted that the anchoring function of carboxylic type is particularly well suited to grafting on $TiO_2$ but less for ZnO. In fact, risks of chemical attack of ZnO and of degradation of the layer are to be feared if a carboxylic group is used [4].

The rules for conceiving these colorants are set out in the review of Ooyama and Harima [5]. On the basis of these rules, numerous colorants have recently been conceived and published or patented in the field of photovoltaic cells but certain limitations exist with present colorants.

In order to enhance the performances of colorants in devices, it appears crucial to improve their absorption properties, in other words to increase the absorption spectral range of the photons, ideally in the visible part of the solar spectrum, and to increase the molar absorption coefficients of the molecules. To summarise, the colorant molecules need to absorb solar photons in an intense manner and over a wide range.

The strategy aiming to increase the absorption coefficients of colorants was employed, for the first time, in 2005, with ruthenium complexes. By modifying heteroleptic ligands, in other words by introducing vinylene units or chromophore that serve as antenna on the later, an increase in their absorption coefficients has been observed [6]. An improvement in the photovoltaic properties of the system ensues.

Numerous works exist to try to improve the molar absorption coefficients of ruthenium based compounds. Nevertheless, in a surprising manner, no work exists aiming specifically at improving the molar absorption coefficients of existing organic colorants.

Thus, the molar absorption coefficients of the purely organic colorants used at present are still low. This is for example the case of the colorants described in international application WO 2009/109499 [7], the molar absorption coefficients of which are all less than 48000 $M^{-1} \cdot cm^{-1}$ and the conversion yields are all less than 5.1%, when the cells are manufactured with a liquid electrolyte and a co-adsorbent of chenodeoxycholic acid type, the structure of which is shown hereafter.

Diagram 2: Structure of chenodeoxycholic acid

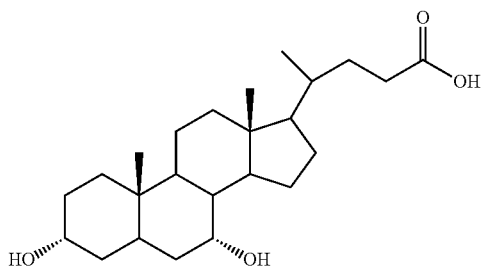

Other examples are reported in the literature [8-10]. Nevertheless, the same problem is encountered with molar absorption coefficients that are below 40000 $M^{-1} \cdot cm^{-1}$ and efficiencies in cells manufactured with a $TiO_2$ electrode and a liquid electrolyte, which are less than 4.5%.

In 2008, an article reported the use of a colorant based on EDOT (3,4-ethylendioxythiophene) having spectra widely shifted into the visible and, despite, once again, low molar absorption coefficients, quite high outputs (of the order of 7%) have been obtained [11]. By employing this strategy, Wang reported, in 2010, a colorant with molar absorption coefficients greater than 50000 $M^{-1} \cdot cm^{-1}$ and a cell efficiency greater than 7% [12].

Colorants having higher molar absorption coefficients exist, which can go up to 80000 $M^{-1} \cdot cm^{-1}$, but said colorants have very low absorptions in the visible corresponding to the spectral range comprised between 400 and 800 nm and moderate yields (of the order of 6%) in devices [13].

As things stand, there thus exists a real need to have available organic colorants that have the widest possible absorption spectrum and more particularly in the visible part of the solar spectrum corresponding to the spectral range comprised between 400 and 800 nm and a high molar absorption coefficient in order to increase the performances of the colorants in photovoltaic devices.

DESCRIPTION OF THE INVENTION

The present invention makes it possible to resolve all or part of the technical problems listed above.

Indeed, the work of the inventors has made it possible to synthesise novel organic colorants and, more particularly, pi-conjugated chromophores comprised therein having associations of particular functional groups such as thiophenes, selenophenes and furans. Such colorants used as photosensitizers in metal oxide based photovoltaic devices make it possible (i) to shift into the visible part of the solar spectrum the maximum absorption band (λmax), (ii) to increase in a significant manner the molar absorption coefficient and (iii) to improve the photovoltaic conversion outputs.

Thus, the present invention relates to an organic colorant corresponding to one of the following structures (I) or (II):

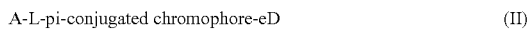

where eD represents an electron donor segment,

L represents a covalent bond or a spacer segment and particularly a pi-conjugated spacer segment, A represents an electron attractor segment able to form a covalent bond with a semi-conductor, wherein the pi-conjugated chromophore comprises at least two aromatic rings, at least one of which is a thiophene, selenophene or furan type ring, providing that, when one of the two aromatic rings comprised in the pi-conjugated chromophore is of thiophene type, said chromophore has at least one unit chosen from:

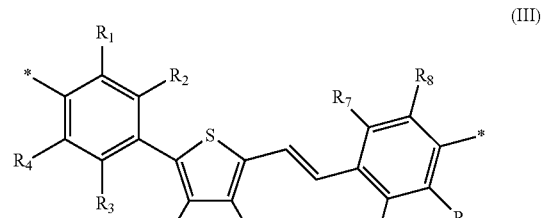

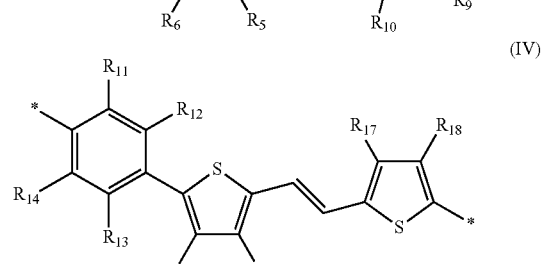

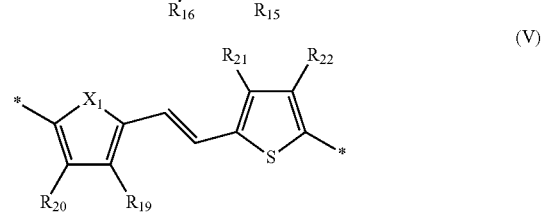

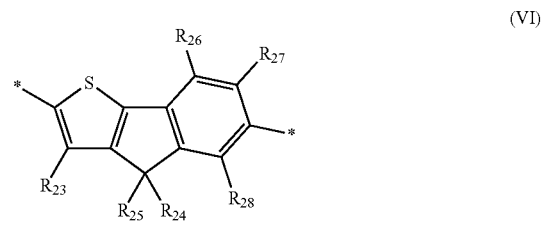

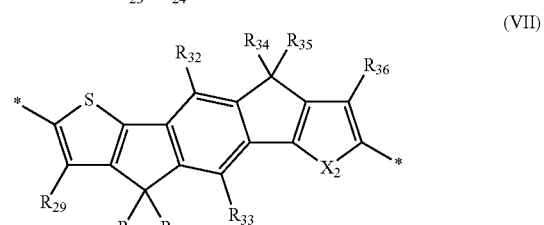

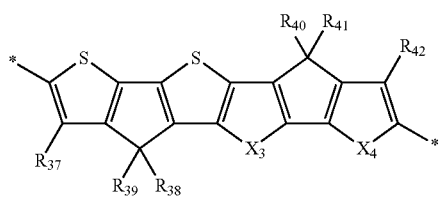
(VIII)

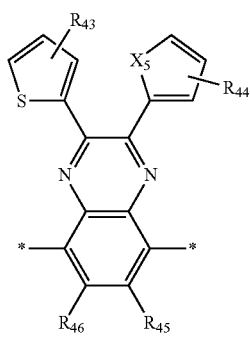
(IX)

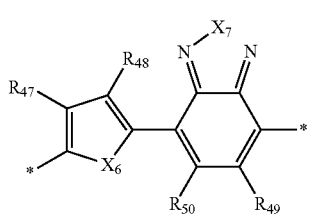
(X)

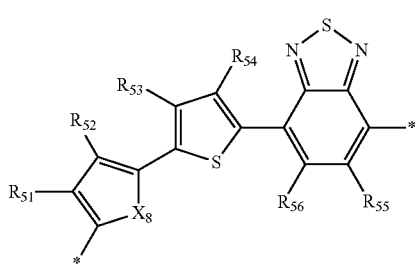
(XI)

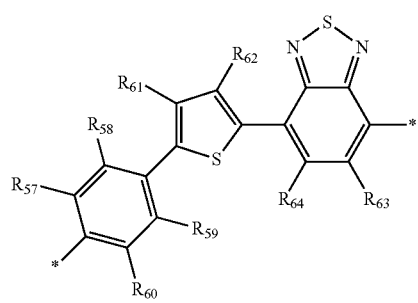
(XII)

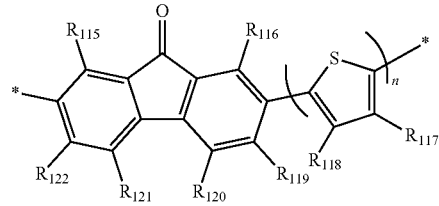
(XXII)

in which
the radicals $R_1$ to $R_{64}$ and $R_{115}$ to $R_{122}$, identical or different, represent a hydrogen, an alkyl group optionally substituted or an aryl group optionally substituted, the radicals $R_{24}$ and $R_{25}$; the radicals $R_{30}$ and $R_{31}$, the radicals $R_{34}$ and $R_{35}$, the radicals $R_{38}$ and $R_{39}$ and the radicals $R_{40}$ and $R_{41}$ which can form together a =O or =($R_{65}$)($R_{66}$) group with the groups $R_{65}$ and $R_{66}$, identical or different, representing a hydrogen, an alkyl group optionally substituted or an aryl group optionally substituted and the radicals $R_{46}$ and $R_{45}$ which can form together a bridging group;

$X_1$ is either Se or O;

$X_2$, $X_3$, $X_4$, $X_5$ and $X_8$, identical or different, are chosen from S, Se and O, $X_6$ and $X_7$ are such that one of the two represents S and the other is either Se, or O and n represents 1, 2, 3 or 4, with the exception of the organic colorants (3-11) and (3-12) described in the Japanese patent application 2009-269987A i.e. organic colorants of formulae (3-11) and (3-12):

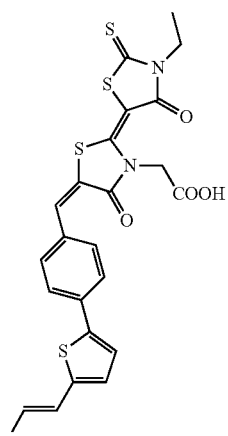
(3-12)

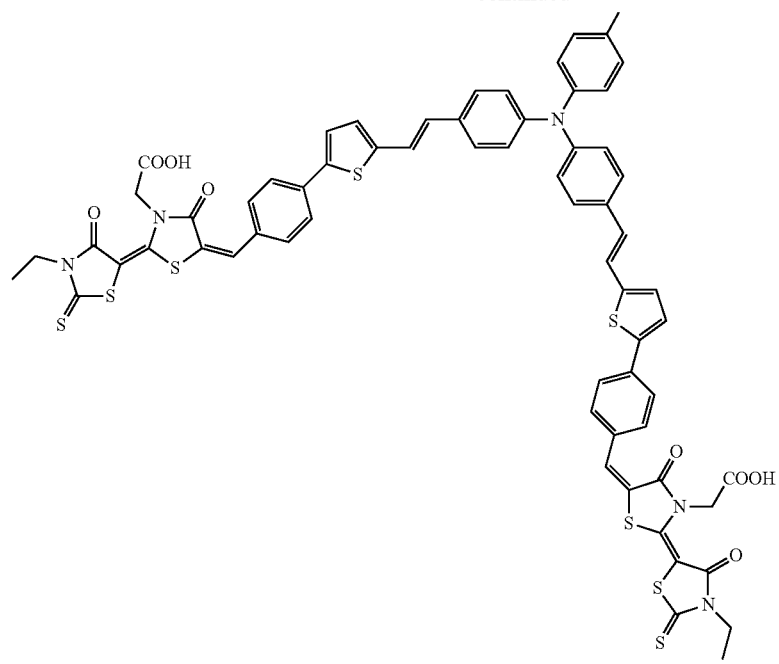
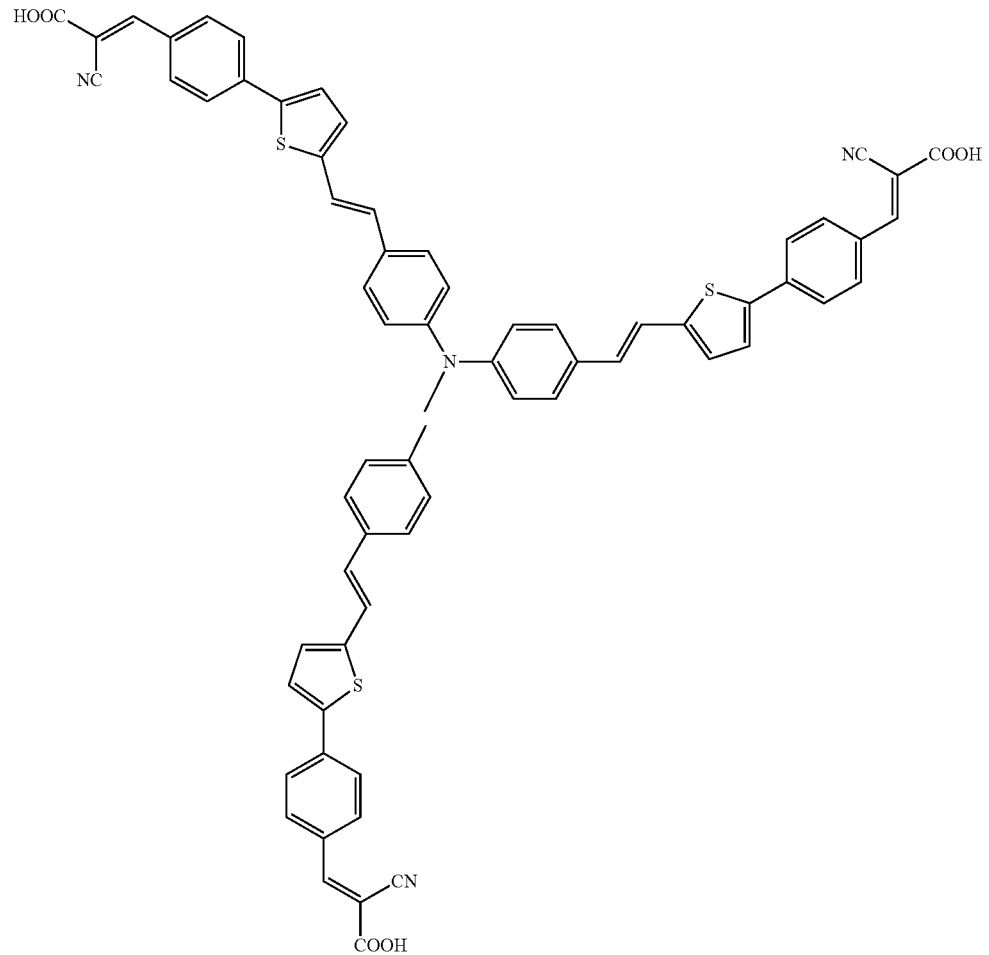
(3.11)

"Alkyl group" is taken to mean, within the scope of the present invention, a linear, branched or cyclic alkyl group, comprising from 1 to 20 carbon atoms, particularly from 1 to 15 carbon atoms and in particular, from 1 to 10 carbon atoms, which can optionally comprise at least one heteroatom, such as, for example, a methyl, ethyl, n-propyl, isopropyl, butyl, isobutyl, sec-butyl, tert-butyl, pentyl, isopentyl, hexyl, heptyl or octyl group.

"Aryl group" is taken to mean, within the scope of the present invention, an aryl group with one ring or several rings joined or connected by a single bond or by a hydrocarbon group, each ring having from 4 to 20 carbon atoms, particularly from 4 to 14 carbon atoms, in particular, from 4 to 8 carbon atoms and which can optionally comprise at least one heteroatom. As examples of aryl group, phenyl, biphenyl, naphthyl, anthracenyl, cyclopentadienyl, pyrenyl, tetrahydronaphthyl, furanyl, pyrrolyl, thiophenyl, oxazolyl, pyrazolyl, isoquinolinyl, thiazolyl, imidazolyl, triazolyl, pyridinyl, pyranyl, quinolinyl, pyrazinyl and pyrimidinyl groups may be cited.

"Bridging group" is taken to mean, within the scope of the present invention, a hydrocarbon group from 1 to 50 carbon atoms and particularly from 2 to 40 carbon atoms, optionally comprising one heteroatom or several heteroatoms identical or different and/or one (or several) ethylenic unsaturation(s), said group being optionally substituted.

"Substituted alkyl group", "substituted aryl group" or "substituted hydrocarbon group" are taken to mean, within the scope of the present invention, an alkyl, aryl or hydrocarbon group as defined previously substituted by a group or several groups, identical or different, chosen from a halogen; an amine; a diamine; a carboxyl; a carboxylate; an aldehyde; an ester; an ether; a hydroxyl; a halogen; an aryl optionally substituted as defined previously and particularly such as a phenyl, a benzyl or a naphthyl; an alkyl optionally substituted as defined previously and particularly such as a methyl, an ethyl, a propyl or a hydroxypropyl; an amide; a sulphonyl; a sulphoxide; a sulphonic acid; a sulphonate; an acyl; a vinyl; a hydroxyl; an epoxy; a phosphonate; an isocyanate; a thiol; a glycidoxy; an acryloxy; a thiophene; a furan; a selenophene and salts thereof.

It is evident that the optionally substituted aryl groups implemented in the present invention also cover pi-conjugated chromophores and in particular the pi-conjugated chromophores such as described in the present invention.

"Heteroatom" is taken to mean, within the scope of the present invention, an atom chosen from the group consisting of nitrogen, oxygen, phosphorous, sulphur, silicon, fluorine, chlorine and bromine.

"Halogen" is taken to mean, within the scope of the present invention, an atom chosen from the group consisting of fluorine, chlorine, iodine and bromine.

Among the units (III), advantageous units are those in which the groups $R_1$ to $R_4$ are identical and/or the groups $R_7$ to $R_{10}$ are identical and particularly those in which the groups $R_1$ to $R_4$ all represent a hydrogen and/or the groups $R_7$ to $R_{10}$ all represent a hydrogen.

In said advantageous units (III), the groups $R_5$ and $R_6$ may be identical and represent a hydrogen, an alkyl group optionally substituted or an aryl group optionally substituted and, particularly, represent a hydrogen.

In a variant, in said advantageous units (III), the groups $R_5$ and $R_6$ are different, one representing a hydrogen and the other an alkyl group optionally substituted or an aryl group optionally substituted and particularly an alkyl group optionally substituted.

Among the units (IV), advantageous units are those in which the groups $R_{11}$ to $R_{14}$ are identical and particularly all represent a hydrogen.

In said advantageous units (IV), the groups $R_{15}$ to $R_{18}$ are identical and represent a hydrogen, an alkyl group optionally substituted or an aryl group optionally substituted and, particularly, represent a hydrogen.

In a variant, in said advantageous units (IV), the groups $R_{15}$ and $R_{16}$ are different, one representing a hydrogen and the other an alkyl group optionally substituted or an aryl group optionally substituted and particularly an alkyl group optionally substituted, the groups $R_{17}$ and $R_{18}$ being able to be identical or different.

In a further variant, in said advantageous units (IV), the groups $R_{17}$ and $R_{18}$ are different, one representing a hydrogen and the other an alkyl group optionally substituted or an aryl group optionally substituted and particularly an alkyl group optionally substituted, the groups $R_{15}$ and $R_{16}$ being able to be identical or different.

Among the units (V), advantageous units are, firstly, those in which $X_1$ represents O and the groups $R_{19}$ and $R_{20}$ are identical and represent a hydrogen, an alkyl group optionally substituted or an aryl group optionally substituted and, particularly, represent a hydrogen, the groups $R_{21}$ and $R_{22}$ being identical or different.

Yet further advantageous units (V) are those in which $X_1$ represents O and the groups $R_{21}$ and $R_{22}$ are identical and represent a hydrogen, an alkyl group optionally substituted or an aryl group optionally substituted and, particularly, represent a hydrogen, the groups $R_{19}$ and $R_{20}$ being identical or different.

In a variant, advantageous units (V) are those in which $X_1$ represents Se and the groups $R_{19}$ and $R_{20}$ are identical and represent a hydrogen, an alkyl group optionally substituted or an aryl group optionally substituted and, particularly, represent a hydrogen, the groups $R_{21}$ and $R_{22}$ being identical or different.

In a further variant, advantageous units are those in which $X_1$ represents Se and the groups $R_{21}$ and $R_{22}$ are identical and represent a hydrogen, an alkyl group optionally substituted or an aryl group optionally substituted and, particularly, represent a hydrogen, the groups $R_{19}$ and $R_{20}$ being identical or different.

Further particular units (V) are those in which $X_1$ represents O and the groups $R_{19}$ to $R_{22}$ are identical and represent a hydrogen and those in which $X_1$ represents Se and the groups $R_{19}$ to $R_{22}$ are identical and represent a hydrogen.

Among the units (VI), advantageous units are those in which the groups $R_{26}$ to $R_{28}$ are identical and particularly all represent a hydrogen.

In said advantageous units (VI), the groups $R_{25}$ and $R_{24}$ are identical and represent a hydrogen, an alkyl group optionally substituted or an aryl group optionally substituted and particularly an aryl group substituted by an alkyl group.

In a variant, in said advantageous units (VI), the groups $R_{25}$ and $R_{24}$ together form a =O or =$(R_{65})(R_{66})$ group with the groups $R_{65}$ and $R_{66}$ as defined previously.

In all the envisaged variants of units (VI), the group $R_{23}$ represents a hydrogen, an alkyl group optionally substituted or an aryl group optionally substituted and, more particularly, a hydrogen.

Among the units (VII), advantageous units are those in which $X_2$ represents S (or Se or O) and the groups $R_{29}$ and $R_{36}$ are identical and as defined previously and represent particularly a hydrogen.

In said advantageous units (VII), the groups $R_{32}$ and $R_{33}$ are identical and as defined previously and represent particularly a hydrogen.

In said advantageous units (VII), the groups $R_{30}$ and $R_{31}$ are identical and as defined previously and represent particularly an aryl group substituted by an alkyl group and/or the groups $R_{34}$ and $R_{35}$ are identical and as defined previously and represent particularly an aryl group substituted by an alkyl group. More particularly, the groups $R_{30}$, $R_{31}$, $R_{34}$ and $R_{35}$ are identical and as defined previously and represent particularly an aryl group substituted by an alkyl group.

In a further variant, in said advantageous units (VII), the groups $R_{25}$ and $R_{24}$ together form a =O or =$(R_{65})(R_{66})$ group with the groups $R_{65}$ and $R_{66}$ as defined previously and/or the groups $R_{34}$ and $R_{35}$ together form a =O or =$(R_{65})(R_{66})$ group with the groups $R_{65}$ and $R_{66}$ as defined previously. In this further variant, the groups =$(R_{65})(R_{66})$ formed, on the one hand, by the groups $R_{30}$ and $R_{31}$ and, on the other hand, by the groups $R_{34}$ and $R_{35}$ are identical.

Among the units (VIII), advantageous units are those in which $X_3$ and $X_4$ are identical and represent, both, S (or Se or O) and the groups $R_{37}$ and $R_{42}$ are identical and as defined previously and represent particularly a hydrogen.

In said advantageous units (VIII), the groups $R_{38}$ and $R_{39}$ are identical and as defined previously and represent particularly an aryl group substituted by an alkyl group and/or the groups $R_{40}$ and $R_{41}$ are identical and as defined previously and represent particularly an aryl group substituted by an alkyl group. More particularly, the groups $R_{38}$, $R_{39}$, $R_{40}$ and $R_{41}$ are identical and as defined previously and represent particularly an aryl group substituted by an alkyl group.

In a further variant, in said advantageous units (VIII), the groups $R_{38}$ and $R_{39}$ together form a =O or =$(R_{65})(R_{66})$ group with the groups $R_{65}$ and $R_{66}$ as defined previously and/or the groups $R_{40}$ and $R_{41}$ together form a =O or =$(R_{65})(R_{66})$ group with the groups $R_{65}$ and $R_{66}$ as defined previously. In this further variant, the groups =$(R_{65})(R_{66})$ formed, on the one hand, by the groups $R_{38}$ and $R_{39}$ and, on the other hand, by the groups $R_{40}$ and $R_{41}$ are advantageously identical.

Among the units (IX), advantageous units are those in which $X_5$ represents S (or Se or O) and the groups $R_{45}$ and $R_{46}$ are identical and as defined previously and particularly represent a hydrogen. In said advantageous units (IX), the groups $R_{43}$ and $R_{44}$ are identical and as defined previously and particularly represent a hydrogen.

In a variant, advantageous units (IX) are those in which $X_5$ represents S (or Se or O) and the groups $R_{45}$ and $R_{46}$ form a bridging group as defined previously. A particular form of implementation of said variant is the following unit (XIII):

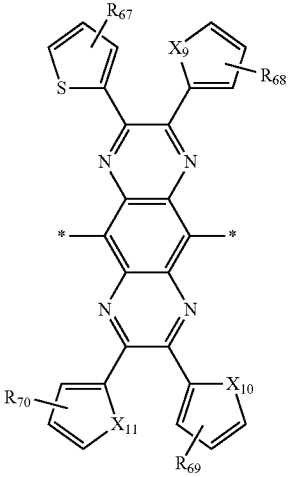

(XIII)

wherein
the radicals $R_{67}$ to $R_{70}$, identical or different, represent a hydrogen, an alkyl group optionally substituted or an aryl group optionally substituted; and
$X_9$ to $X_{11}$, identical or different, being chosen from S, Se and O.

Among the units (XIII), advantageous units are those in which $X_{10}$ and $X_{11}$ are identical and represent, both, S (or Se or O), $X_9$ which can represent S, Se or O. In particular, $X_9$ represents S and, more particularly, $X_9$ to $X_{11}$ all represent S.

In said advantageous units (XIII), the groups $R_{67}$ and $R_{68}$ are identical and as defined previously and represent particularly an alkyl group optionally substituted and/or the groups $R_{69}$ and $R_{70}$ are identical and as defined previously and represent particularly an alkyl group optionally substituted. More particularly, the groups $R_{67}$ to $R_{70}$ are identical and as defined previously and represent particularly an alkyl group optionally substituted.

Among the units (X), advantageous units are those in which $X_6$ represents S, $X_7$ represents Se (or O), the groups $R_{49}$ and $R_{50}$ are identical and as defined previously and represent particularly a hydrogen, the groups $R_{47}$ and $R_{48}$ being able to be identical or different. In a $1^{st}$ form of implementation of said advantageous units (X), the groups $R_{47}$ and $R_{48}$ are identical and as defined previously and particularly represent a hydrogen. In a $2^{nd}$ form of implementation of said advantageous units (X), the groups $R_{47}$ and $R_{48}$ are different with the group $R_{47}$ (or $R_{48}$) representing a hydrogen and the group $R_{48}$ (or $R_{47}$) representing an alkyl group optionally substituted or an aryl group optionally substituted.

In a variant, among the units (X), advantageous units are those in which $X_7$ represents S, $X_6$ represents Se (or O), the groups $R_{49}$ and $R_{50}$ are identical and as defined previously and represent particularly a hydrogen, the groups $R_{47}$ and $R_{48}$ being able to be identical or different. In a $1^{st}$ form of implementation of said advantageous units (X), the groups $R_{47}$ and $R_{48}$ are identical and as defined previously and particularly represent a hydrogen. In a $2^{nd}$ form of implementation of said advantageous units (X), the groups $R_{47}$ and $R_{48}$ are different with the group $R_{47}$ (or $R_{48}$) representing a hydrogen and the group $R_{48}$ (or $R_{47}$) representing an alkyl group optionally substituted or an aryl group optionally substituted.

Among the units $(X_1)$, advantageous units are those in which $X_8$ represents S (or Se or O), the groups $R_{55}$ and $R_{56}$ are identical and as defined previously and represent particularly a hydrogen, the groups $R_{51}$ and $R_{52}$ being able to be identical or different and the groups $R_{53}$ and $R_{54}$ being able to be identical or different.

In a 1$^{st}$ form of implementation of said advantageous units ($X_1$), the groups $R_{51}$ and $R_{52}$ are identical and as defined previously and particularly represent a hydrogen, the groups $R_{53}$ and $R_{54}$ being able to be identical or different. In said 1$^{st}$ form of implementation, the groups $R_{53}$ and $R_{54}$ are identical and as defined previously and particularly represent a hydrogen. In a variant, the groups $R_{53}$ and $R_{54}$ are different with the group $R_{53}$ (or $R_{54}$) representing a hydrogen and the group $R_{54}$ (or $R_{53}$) representing an alkyl group optionally substituted or an aryl group optionally substituted.

In a 2$^{nd}$ form of implementation of said advantageous units ($X_1$), the groups $R_{51}$ and $R_{52}$ are different with the group $R_{51}$ (or $R_{52}$) representing a hydrogen and the group $R_{52}$ (or $R_{51}$) representing an alkyl group optionally substituted or an aryl group optionally substituted, the groups $R_{53}$ and $R_{54}$ being able to be identical or different. In said 2$^{nd}$ form of implementation, the groups $R_{53}$ and $R_{54}$ are identical and as defined previously and particularly represent a hydrogen. In a variant, the groups $R_{53}$ and $R_{54}$ are different with the group $R_{53}$ (or $R_{54}$) representing a hydrogen and the group $R_{54}$ (or $R_{53}$) representing an alkyl group optionally substituted or an aryl group optionally substituted.

Among the units (XII), advantageous units are those in which the groups $R_{57}$ to $R_{60}$ are identical and as defined previously and represent particularly a hydrogen, the groups $R_{61}$ and $R_{62}$ being able to be identical or different and the groups $R_{63}$ and $R_{64}$ being able to be identical or different.

In a 1$^{st}$ form of implementation of said advantageous units (XII), the groups $R_{61}$ and $R_{62}$ are identical and as defined previously and particularly represent a hydrogen, the groups $R_{63}$ and $R_{64}$ being able to be identical or different. In said 1$^{st}$ form of implementation, the groups $R_{63}$ and $R_{64}$ are identical and as defined previously and particularly represent a hydrogen. In a variant, the groups $R_{63}$ and $R_{64}$ are different with the group $R_{63}$ (or $R_{64}$) representing a hydrogen and the group $R_{64}$ (or $R_{63}$) representing an alkyl group optionally substituted or an aryl group optionally substituted.

In a 2$^{nd}$ form of implementation of said advantageous units (XII), the groups $R_{61}$ and $R_{62}$ are different with the group $R_{61}$ (or $R_{62}$) representing a hydrogen and the group $R_{62}$ (or $R_{61}$) representing an alkyl group optionally substituted or an aryl group optionally substituted, the groups $R_{63}$ and $R_{64}$ being able to be identical or different. In said 2$^{nd}$ form of implementation, the groups $R_{63}$ and $R_{64}$ are identical and as defined previously and particularly represent a hydrogen. In a variant, the groups $R_{63}$ and $R_{64}$ are different with the group $R_{63}$ (or $R_{64}$) representing a hydrogen and the group $R_{64}$ (or $R_{63}$) representing an alkyl group optionally substituted or an aryl group optionally substituted.

Among the units (XXII), advantageous units are those in which the groups $R_{115}$, $R_{116}$ and $R_{119}$ to $R_{122}$ are identical and as previously defined and in particular represent a hydrogen, the (two, three or four) groups $R_{117}$ and $R_{118}$ being able to be identical or different.

More particularly, the advantageous units (XXII) are those in which n represents 1 or 2.

In a 1$^{st}$ form of implementation of said advantageous units (XXII) with n equal to 1, the groups $R_{117}$ and $R_{118}$ are identical and as previously defined and particularly represent a hydrogen. In a 2$^{nd}$ form of implementation of said advantageous units (XXII) with n equal to 1, the groups $R_{117}$ and $R_{118}$ are different with the group $R_{117}$ (or $R_{118}$) representing a hydrogen and the group $R_{118}$ (or $R_{117}$) representing an alkyl group optionally substituted or an aryl group optionally substituted.

In a 3$^{rd}$ form of implementation of said advantageous units (XXII) with n equal to 2, the 2 groups $R_{117}$ and the 2 groups $R_{118}$ are identical and as previously defined and particularly represent a hydrogen. In a 4$^{th}$ form of implementation of said advantageous units (XXII) with n equal to 2, the 2 groups $R_{117}$ (or the 2 groups $R_{118}$) are different with one of the groups $R_{117}$ (or one of the groups $R_{118}$) representing a hydrogen and the other group $R_{117}$ (or the other group $R_{118}$) representing an alkyl group optionally substituted or an aryl group optionally substituted, the two groups $R_{118}$ (or the two groups $R_{117}$) identical or different being chosen from a hydrogen, an alkyl group optionally substituted and an aryl group optionally substituted.

Among the pi-conjugated chromophores comprising at least one unit (XXII) some advantageously comprise a unit (XXIII) which includes said unit (XXII), the unit (XXIII) being of formula:

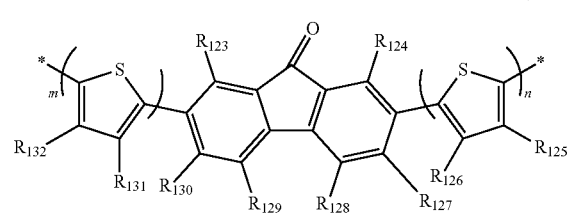

(XXIII)

wherein
the groups $R_{123}$ to $R_{132}$, identical or different, represent a hydrogen, an alkyl group optionally substituted or an aryl group optionally substituted,
m and n, identical or different, represent 1, 2, 3 or 4.

Among the units (XXIII), advantageous units are those in which the groups $R_{123}$, $R_{124}$ and $R_{127}$ to $R_{130}$ are identical and as previously defined and represent in particular a hydrogen, the (two, three or four) groups $R_{125}$, $R_{126}$, $R_{131}$ and $R_{132}$ being able to be identical or different and n and m being able to be identical or different.

More particularly, the advantageous units (XXIII) are those in which m and n, identical or different, represent 1 or 2 and in particular those in which m and n are identical and represent 1 or 2.

In a 1$^{st}$ form of implementation of said advantageous units (XXIII) with n and m equal to 1, the groups $R_{125}$, $R_{126}$, $R_{131}$ and $R_{132}$ are identical and as previously defined and in particular represent a hydrogen. In a 2$^{nd}$ form of implementation of said advantageous units (XXIII) with n and m equal to 1, the groups $R_{125}$ and $R_{126}$ are different, the groups $R_{131}$ and $R_{132}$ are different with the groups $R_{125}$ and $R_{132}$ (or groups $R_{126}$ and $R_{131}$) representing a hydrogen and the groups $R_{126}$ and $R_{131}$ (or groups $R_{125}$ and $R_{132}$) representing an alkyl group optionally substituted or an aryl group optionally substituted.

In a 3$^{rd}$ form of implementation of said advantageous units (XXIII) with n and m equal to 2, the two groups $R_{125}$, the two groups $R_{126}$, the two groups $R_{131}$ and the two groups $R_{132}$ are identical and as previously defined and in particular represent a hydrogen. In a 4$^{th}$ form of implementation of said advantageous units (XXIII) with n and m equal to 2, the two groups $R_{125}$ (or the two groups $R_{126}$ or the two groups $R_{131}$ or the two groups $R_{132}$) are different with one of the groups $R_{125}$ (or one of the groups $R_{126}$ or one of the groups $R_{131}$ or one of the groups $R_{132}$) representing a hydrogen and the other group $R_{125}$ (or the other group $R_{126}$ or the other group $R_{131}$ or the other group $R_{132}$) representing an alkyl group optionally substituted or an aryl group optionally substituted, the other groups being identical or different and chosen from a hydrogen, an alkyl group optionally substituted and an aryl group optionally substituted.

Within the scope of the present invention, the pi-conjugated chromophore may comprise at least two aromatic rings, at least one of which is a selenophene or furan type ring.

"Selenophene ring" is taken to mean an aromatic ring having one atom of selenium and four carbon atoms among which two may optionally be substituted by groups, identical or different.

"Furan ring" is taken to mean an aromatic ring having one atom of oxygen and four carbon atoms among which two may optionally be substituted by groups, identical or different. It should be noted that a furanone ring and a benzofuranone ring are different from a furan ring and that consequently the colorants according to the invention comprise neither a furanone ring nor a benzofuranone ring.

As group(s) that can substitute the selenophene or furan ring, the groups previously listed in the context of substituted alkyl, aryl and hydrocarbon groups can be listed.

Thus, the pi-conjugated chromophore according to the invention may comprise:

(i) a furan ring, at least one arylene group optionally substituted and optionally at least one thiophene group optionally substituted;

(ii) a selenophene ring, at least one arylene group optionally substituted and optionally at least one thiophene group optionally substituted;

(iii) at least two furan rings, optionally at least one arylene group optionally substituted and optionally at least one thiophene group optionally substituted;

(iv) at least two rings selenophene, optionally at least one arylene group optionally substituted and optionally at least one thiophene group optionally substituted;

(v) a furan ring, a selenophene ring, optionally at least one arylene group optionally substituted and optionally at least one thiophene group optionally substituted;

(vi) at least two selenophene rings, a furan ring, optionally at least one arylene group optionally substituted and optionally at least one thiophene group optionally substituted;

(vii) at least two furan rings, a selenophene ring, optionally at least one arylene group optionally substituted and optionally at least one thiophene group optionally substituted;

(viii) at least two selenophene rings, at least two furan rings, optionally at least one arylene group optionally substituted and optionally at least one thiophene group optionally substituted.

In said different envisaged forms of implementation, all or part of the rings may be joined together and/or all or part of the rings are separated by a covalent bond, by an alkylene chain optionally substituted, by an alkenylene or alkynylene chain optionally substituted or by an arylene chain optionally substituted as defined hereafter.

Some of the units envisaged for the pi-conjugated chromophores comprising at least one thiophene ring also comprise a furan ring and/or a selenophene ring (units V, VII, VIII, X and XI).

The pi-conjugated chromophore according to the present invention comprising at least two aromatic rings, at least one of which is a selenophene or furan type ring, may comprise at least one unit chosen from the following units:

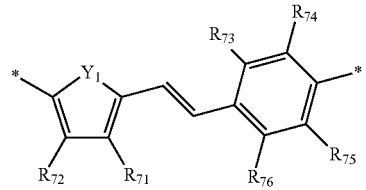
(XIV)

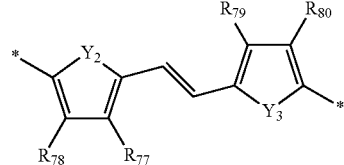
(XV)

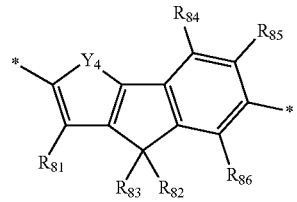
(XVI)

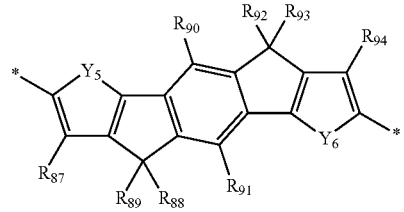
(XVII)

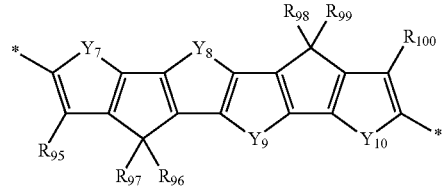
(XVIII)

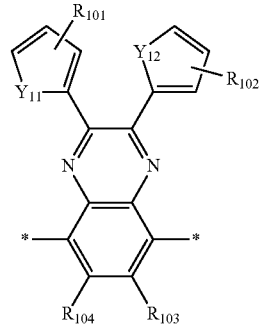
(XIX)

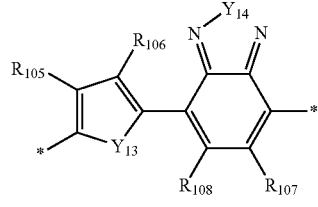
(XX)

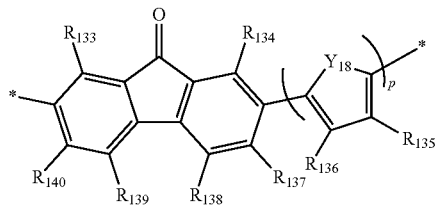

(XXIV)

in which
the radicals $R_{71}$ to $R_{108}$ and $R_{133}$ to $R_{140}$ identical or different, represent a hydrogen, an alkyl group optionally substituted or an aryl group optionally substituted; the radicals $R_{82}$ and $R_{83}$, the radicals $R_{88}$ and $R_{89}$, the radicals $R_{92}$ and $R_{93}$, the radicals $R_{96}$ and $R_{97}$ and the radicals $R_{98}$ and $R_{99}$ which can form together a =O or =$(R_{113})(R_{114})$ group with the groups $R_{113}$ and $R_{114}$, identical or different, representing a hydrogen, an alkyl group optionally substituted or an aryl group optionally substituted and the radicals $R_{103}$ and $R_{104}$ which can form together a bridging group;

$Y_1$ to $Y_{14}$ and $Y_{18}$ identical or different being either Se, or O, and p represents 1, 2, 3 or 4.

Among the units (XIV), advantageous units are those in which $Y_1$ represents Se (or O), the groups $R_{73}$ to $R_{76}$ are identical and as defined previously and particularly all represent a hydrogen, the groups $R_{71}$ and $R_{72}$ being able to be identical or different. In a $1^{st}$ form of implementation of said advantageous units (XIV), the groups $R_{71}$ and $R_{72}$ are identical and as defined previously and particularly represent a hydrogen. In a $2^{nd}$ form of implementation of said advantageous units (XIV), the groups $R_{71}$ and $R_{72}$ are different with the group $R_{71}$ (or $R_{72}$) representing a hydrogen and the group $R_{72}$ (or $R_{71}$) representing an alkyl group optionally substituted or an aryl group optionally substituted.

Among the units (XV), the groups $Y_2$ and $Y_3$ are identical and represent, both, Se or O or are different and $Y_2$ (or $Y_3$) represents O and $Y_3$ (or $Y_2$) represents Se.

For any of these four variants, the groups $R_{77}$ and $R_{78}$ are identical and as defined previously and, particularly, represent a hydrogen, the groups $R_{79}$ and $R_{80}$ being identical or different. In a $1^{st}$ form of implementation of said advantageous units (XV), the groups $R_{79}$ and $R_{80}$ are identical and as defined previously and particularly represent a hydrogen. In a $2^{nd}$ form of implementation of said advantageous units (XV), the groups $R_{79}$ and $R_{80}$ are different with the group $R_{79}$ (or $R_{80}$) representing a hydrogen and the group $R_{80}$ (or $R_{79}$) representing an alkyl group optionally substituted or an aryl group optionally substituted.

In a variant, for any of said four variants, the groups $R_{79}$ and $R_{80}$ are identical and as defined previously and, particularly, represent a hydrogen, the groups $R_{77}$ and $R_{78}$ being identical or different. In a $1^{st}$ form of implementation of said advantageous units (XV), the groups $R_{77}$ and $R_{78}$ are identical and as defined previously and particularly represent a hydrogen. In a $2^{nd}$ form of implementation of said advantageous units (XV), the groups $R_{77}$ and $R_{78}$ are different with the group $R_{77}$ (or $R_{78}$) representing a hydrogen and the group $R_{78}$ (or $R_{77}$) representing an alkyl group optionally substituted or an aryl group optionally substituted.

Among the units (XVI), advantageous units are those in which the groups $R_{84}$ to $R_{86}$ are identical and particularly all represent a hydrogen.

In said advantageous units (XVI), the groups $R_{82}$ and $R_{83}$ are identical and represent a hydrogen, an alkyl group optionally substituted or an aryl group optionally substituted and particularly an aryl group substituted by an alkyl group.

In a variant, in said advantageous units (XVI), the groups $R_{82}$ and $R_{83}$ together form a =O or =$(R_{113})(R_{114})$ group with the groups $R_{113}$ and $R_{114}$ as defined previously.

In all the envisaged variants of units (XVI), the group $R_{81}$ represents a hydrogen, an alkyl group optionally substituted or an aryl group optionally substituted and, more particularly, a hydrogen.

Among the units (XVII), the groups $Y_5$ and $Y_6$ are identical and represent, both, Se or O or are different and $Y_5$ (or $Y_6$) represents O and $Y_5$ (or $Y_6$) represents Se.

Among the units (XVII), advantageous units are those in which the groups $R_{87}$ and $R_{94}$ are identical and as defined previously and represent particularly a hydrogen.

In said advantageous units (XVII), the groups $R_{90}$ and $R_{91}$ are identical and as defined previously and represent particularly a hydrogen.

In said advantageous units (XVII), the groups $R_{88}$ and $R_{89}$ are identical and as defined previously and represent particularly an aryl group substituted by an alkyl group and/or the groups $R_{92}$ and $R_{93}$ are identical and as defined previously and represent particularly an aryl group substituted by an alkyl group. More particularly, the groups $R_{88}$, $R_{89}$, $R_{92}$ and $R_{93}$ are identical and as defined previously and represent particularly an aryl group substituted by an alkyl group.

In a further variant, in said advantageous units (XVII), the groups $R_{88}$ and $R_{89}$ together form a =O or =$(R_{113})(R_{114})$ group with the groups $R_{113}$ and $R_{114}$ as defined previously and/or the groups $R_{92}$ and $R_{93}$ together form a =O or =$(R_{113})(R_{114})$ group with the groups $R_{113}$ and $R_{114}$ as defined previously. In this further variant, the groups =$(R_{113})(R_{114})$ formed, on the one hand, by the groups $R_{88}$ and $R_{89}$ and, on the other hand, by the groups $R_{92}$ and $R_{93}$ are advantageously identical.

Among the units (XVIII), advantageous units are those in which $Y_7$ and $7_8$ are identical and represent, both, Se or O and/or in which $Y_9$ and $7_{10}$ are identical and represent, both, Se or O. Advantageously, $Y_7$ to $Y_{10}$ are identical and all represent Se or O.

In said advantageous units (XVIII), the groups $R_{95}$ and $R_{100}$ are identical and as defined previously and represent particularly a hydrogen.

In said advantageous units (XVIII), the groups $R_{96}$ and $R_{97}$ are identical and as defined previously and represent particularly an aryl group substituted by an alkyl group and/or the groups $R_{98}$ and $R_{99}$ are identical and as defined previously and represent particularly an aryl group substituted by an alkyl group. More particularly, the groups $R_{96}$, $R_{97}$, $R_{98}$ and $R_{99}$ are identical and as defined previously and represent particularly an aryl group substituted by an alkyl group.

In a further variant, in said advantageous units (XVIII), the groups $R_{96}$ and $R_{97}$ together form a =O or =$(R_{113})(R_{114})$ group with the groups $R_{113}$ and $R_{114}$ as defined previously and/or the groups $R_{98}$ and $R_{99}$ together form a =O or =$(R_{113})(R_{114})$ group with the groups $R_{113}$ and $R_{114}$ as defined previously. In this further variant, the groups =$(R_{113})(R_{114})$ formed, on the one hand, by the groups $R_{96}$ and $R_{97}$ and, on the other hand, by the groups $R_{98}$ and $R_{99}$ are identical.

Among the units (XIX), advantageous units are those in which $Y_7$ and $Y_8$ are identical and represent, both, Se or O or $Y_7$ represents Se (or O) and $X_8$ represents O (or Se).

Among said advantageous units (XIX), the $R_{101}$ and $R_{102}$ groups are identical and as defined previously and particularly represent a hydrogen.

In said advantageous units (XIX), the $R_{103}$ and $R_{104}$ groups are identical and as defined previously and particularly represent a hydrogen.

In a variant, in said advantageous units (XIX), the $R_{103}$ and $R_{104}$ groups form a bridging group as defined previously. A particular form of implementation of said variant is the following unit (XXI):

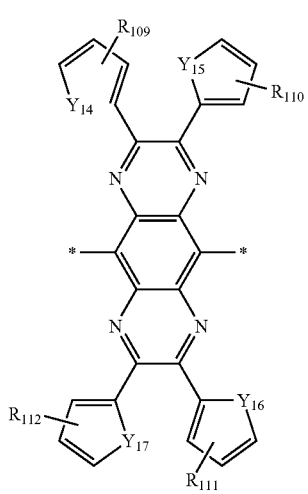

(XXI)

wherein
the radicals $R_{109}$ to $R_{112}$, identical or different, represent a hydrogen, an alkyl group optionally substituted or an aryl group optionally substituted; and
$Y_{14}$ to $Y_{17}$, identical or different, being chosen from Se and O.

Among the units (XXI), advantageous units are those in which $Y_{14}$ and $Y_{15}$ are identical and represent, both, Se or O; $Y_{16}$ and $Y_{17}$, identical or different, which can represent Se or O. In particular, advantageous units (XXI) are those in which $Y_{14}$ to $Y_{17}$ are identical and all represent Se or O.

In said advantageous units (XXI), the groups $R_{109}$ and $R_{110}$ are identical and as defined previously and represent particularly an alkyl group optionally substituted and/or the groups $R_{111}$ and $R_{112}$ are identical and as defined previously and represent particularly an alkyl group optionally substituted. More particularly, the groups $R_{109}$ to $R_{112}$ are identical and as defined previously and represent particularly an alkyl group optionally substituted.

Among the units (XX), advantageous units are those in which $Y_{13}$ represents Se (or O), $Y_{14}$ represents O (or Se), the groups $R_{107}$ and $R_{108}$ are identical and as defined previously and represent particularly a hydrogen, the groups $R_{105}$ and $R_{106}$ being able to be identical or different.

In a $1^{st}$ form of implementation of said advantageous units (XX), the groups $R_{105}$ and $R_{106}$ are identical and as defined previously and particularly represent a hydrogen.

In a $2^{nd}$ form of implementation of said advantageous units (XX), the $R_{105}$ and $R_{106}$ groups are different with the $R_{105}$ (or $R_{106}$) group representing a hydrogen and the $R_{106}$ (or $R_{105}$) group representing an alkyl group optionally substituted or an aryl group optionally substituted.

Amongst the units (XXIV) with $Y_{18}$ representing O or Se, advantageous units are those in which the groups $R_{133}$, $R_{134}$ and $R_{137}$ to $R_{140}$ are identical and as previously defined and represent in particular a hydrogen, the (two, three or four) groups $R_{135}$ and $R_{136}$ being able to be identical or different.

More particularly, the advantageous units (XXIV) are those in which p represents 1 or 2.

In a $1^{st}$ form of implementation of said advantageous units (XXIV) with p equal to 1, the groups $R_{135}$ and $R_{136}$ are identical and as previously defined and in particularly represent a hydrogen. In a $2^{nd}$ form of implementation of said advantageous units (XXIV) with p equal to 1, the groups $R_{135}$ and $R_{136}$ are different with the group $R_{135}$ (or $R_{136}$) representing a hydrogen and the group $R_{136}$ (or $R_{135}$) representing an alkyl group optionally substituted or an aryl group optionally substituted.

In a $3^{rd}$ form of implementation of said advantageous units (XXIV) with p equal to 2, the two groups $R_{135}$ and the two groups $R_{136}$ are identical and as previously defined and in particular represent a hydrogen. In a $4^{th}$ form of implementation of said advantageous units (XXIV) with p equal to 2, the two groups $R_{135}$ (or the two groups $R_{136}$) are different with one of the groups $R_{135}$ (or one of the groups $R_{136}$) representing a hydrogen and the other group $R_{135}$ (or the other group $R_{136}$) representing an alkyl group optionally substituted or an aryl group optionally substituted, the two groups $R_{136}$ (or the two groups $R_{135}$) identical or different, being chosen from a hydrogen, an alkyl group optionally substituted and an aryl group optionally substituted.

Among the pi-conjugated chromophores comprising at least one unit (XXIV) some advantageously comprise a unit (XXV) which includes said unit (XXIV), the unit (XXV) being of formula:

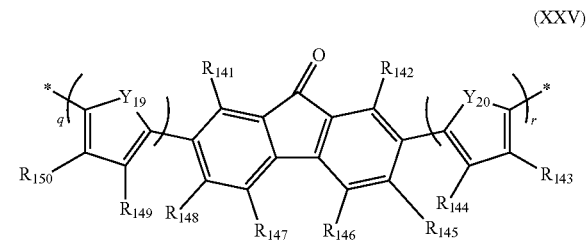

(XXV)

wherein
the groups $R_{141}$ to $R_{150}$, identical or different, represent a hydrogen, an alkyl group optionally substituted or an aryl group optionally substituted,
r and q, identical or different, represent 1, 2, 3 or 4 and
$Y_{19}$ and $Y_{20}$, identical or different, represent O, Se or S, providing that at least one $Y_{19}$ or at least one $Y_{20}$ is different from S.

Among the units (XXV), the advantageous units are those in which the groups $R_{141}$, $R_{142}$ and $R_{145}$ to $R_{148}$ are identical and as previously defined and represent in particular a hydrogen, the (two, three of four) groups $R_{143}$, $R_{144}$, $R_{149}$ and $R_{150}$ being able to be identical or different and r and q being able to be identical or different.

More particularly, the advantageous units (XXV) are those in which r and q, identical or different represent 1 or 2 and in particular those in which r and q are identical and represent 1 or 2.

In a $1^{st}$ form of implementation of said advantageous units (XXV) with r and q equal to 1, the groups $R_{143}$, $R_{144}$, $R_{149}$ and $R_{150}$ are identical and as previously defined and in particular represent a hydrogen. In a $2^{nd}$ form of implementation of said advantageous units (XXV) with r and q equal to 1, the groups $R_{143}$ and $R_{144}$ are different, the groups $R_{149}$ and $R_{150}$ are different with the groups $R_{143}$ and $R_{150}$ (or the groups $R_{144}$ and $R_{149}$) representing a hydrogen and groups the $R_{144}$ and $R_{149}$ (or the groups $R_{143}$ and $R_{150}$) representing an alkyl group optionally substituted or an aryl group optionally substituted. In said $1^{st}$ and said $2^{nd}$ form of implementation, the pair $(Y_{19}, Y_{20})$ may represent (O,O), (Se,Se), (O,Se), (Se,O), (S,O), (O,S), (Se,S) or (S,Se).

In a $3^{rd}$ form of implementation of said advantageous units (XXV) with r and q equal to 2, the two groups $R_{143}$, the two groups $R_{144}$, the two groups $R_{149}$, and the two groups $R_{150}$ are identical and as previously defined and in particular represent a hydrogen. In a $4^{th}$ form of implementation of said advantageous units (XXV) with r and q equal to 2, the two groups $R_{143}$ (or the two groups $R_{144}$ or the two groups $R_{149}$ or the two groups $R_{150}$) are different with one of the groups $R_{143}$ (or one of the groups $R_{144}$ or one of the groups $R_{149}$ or one of the groups $R_{150}$) representing a hydrogen and the other group $R_{143}$ (or the other group $R_{144}$ or the other group $R_{149}$ or the other group $R_{150}$) representing an alkyl group optionally substituted or an aryl group optionally substituted, the other groups being identical or different and chosen from a hydrogen, an alkyl group optionally substituted and an aryl group optionally substituted. In said $3^{rd}$ and said $4^{th}$ form of implementation, the two groups $Y_{19}$ and the two groups $Y_{20}$ hereafter designated $(Y_{19}, Y_{19}, Y_{20}, Y_{20})$ may be any of the 81 possible combinations among which may be cited, as examples (O,O,O,O), (O,O,O,Se), (O,O,Se,O), (O,Se,O,O), (Se,O,O,O), (Se,O,O,Se), (Se,O,Se,O), (Se,Se,O,O), (Se,Se, Se,O), (Se,O,Se,Se), (Se,Se,O,Se), (Se,Se,Se,Se), (O,O,Se, Se), (O,Se,O,Se), (O,Se,Se,O), (O,Se,Se,Se), (S,O,O,O), (O,S,O,Se), (O,O,Se,S), (O,Se,O,S), (S,O,Se,O), (Se,S,O,O), (Se,S,S,O), (Se,O,Se,S) and (S,Se,O,S).

For reasons of synthesis, units of formula (XXIII) or (XXV) which are symmetric in terms of Y atoms and/or of substituents are advantageous. In such compounds, symmetry is appraised relative to 9-fluorenone. Particular colorants comprising such units are in particular described hereafter.

The organic colorant according to the present invention comprises at least one pi-conjugated chromophore as defined in the present invention. It may include at least two of them, identical or different or at least three, identical or different. When the organic colorant according to the present invention comprises 2, 3 or more pi-conjugated chromophores, at least one of these chromophores is as defined in the present invention, each of the others being able to be any pi-conjugated chromophore known to those skilled in the art or, conversely, a chromophore as defined in the present invention.

In the organic colorant according to the present invention, the pi-conjugated chromophore may only be constituted of one unit or several units, identical or different, as described previously.

In a variant, the pi-conjugated chromophore may comprise, in addition to one unit or several units, identical or different, as described previously, a $1^{st}$ hydrocarbon chain separating it or them from the electron donor segment (eD) and/or a $2^{nd}$ hydrocarbon chain, identical or different to the $1^{st}$, separating it or them from the electron attractor segment (A) or from the segment spacer (L).

The hydrocarbon chains that can be used in this variant are hydrocarbon groups optionally substituted as defined previously and are advantageously chosen from alkylene chains optionally substituted, alkenylene or alkynylene chains optionally substituted or arylene chains optionally substituted.

Within the scope of the present invention, "alkylene chain" is taken to mean a linear, branched or cyclic alkylene chain, comprising from 1 to 40 carbon atoms, particularly from 2 to 30 carbon atoms and which can optionally comprise at least one heteroatom. By way of examples of alkylene chains that may be used, methylene, ethylene, n-propylene, isopropylene, butylene, isobutylene, sec-butylene, tert-butylene, pentylene, isopentylene, hexylene, cyclopentylene, cyclohexylene, —(CH$_2$)$_n$—O—(CH$_2$)$_m$—, —(CH$_2$)$_n$—S—(CH$_2$)$_m$—, —(CH$_2$)$_n$—S—S—(CH$_2$)$_m$—, —(CH$_2$)$_n$—C(O)O—(CH$_2$)$_m$—, —(CH$_2$)$_n$—N(R)—(CH$_2$)$_m$—, —(CH$_2$)$_n$—N(R')—(CH$_2$)$_p$—N(R")—(CH$_2$)$_m$— groups may be cited with R representing a hydrocarbon group as defined previously and n, m and p, identical or different, representing a whole number comprised between 0 and 20;

Within the scope of the present invention, "alkenylene or alkynylene chain" is taken to mean a linear, branched or cyclic alkenylene or alkynylene chain, comprising from 4 to 40 carbon atoms and particularly from 4 to 30 carbon atoms and which can optionally comprise at least one heteroatom. As examples of alkenylene or alkynylene chains being able to be used, butenylene or butynylene, isobutenylene or isobutynylene, sec-butenylene or sec-butynylene, tert-butenylene or tert-butynylene, pentenylene or pentynylene, isopentenylene or isopentynylene, cyclopentenylene or cyclopentynylene, cyclohexenylene or cyclohexynylene groups may be cited.

Within the scope of the present invention, "arylene chain" is taken to mean an arylene chain with one ring or several rings joined or connected by a single bond or by a hydrocarbon group, each ring having from 4 to 50 carbon atoms and particularly from 4 to 40 carbon atoms and which can comprise optionally at least one heteroatom. As examples of arylene chains which may be used, phenylene, biphenylene, naphthylene, anthracenylene, cyclopentadienylene, pyrenylene, tetrahydronaphthylene, furanylene, pyrrolylene, thiophenylene, oxazolylene, pyrazolylene, isoquinolinylene, thiazolylene, imidazolylene, triazolylene, pyridinylene, pyranylene, quinolinylene, pyrazinylene and pyrimidinylene groups may be cited.

Within the scope of the present invention, "substituted alkylene chain", "substituted alkenylene or alkynylene chain" or "substituted arylene chain" are taken to mean an alkylene chain, an alkenylene or an alkynylene chain or arylene chain as defined previously having one substitution or several substitutions, identical or different, this or these substitutions corresponding, preferably, to halogen atoms or to aliphatic groups optionally comprising at least one heteroatom such as, for example, a —COOR", —CHO, —OR", —SR", —SCOR", —SO$_2$R", —NR"R"', —CONR"R"', —C(Hal)$_3$, —OC(Hal)$_3$, —C(O)Hal or —CN group in which R" and R'" represent a hydrogen atom or a hydrocarbon group as defined previously, whereas Hal represents a halogen atom, particularly fluorine, chlorine or bromine.

"Electron donor segment (eD)" is taken to mean, within the scope of the present invention, an electron donor function that enables the organic colorant according to the present invention to be reduced more easily by the electrolyte.

Any electron donor segment known to those skilled in the art and commonly used in the field of photosensitizer organic colorants may be used within the scope of the present invention. As examples of such electron donor segments may be cited those described from page 42, line 10 to page 45, line 1 of the international application WO 2009/109499 [7] and those implemented in the 56 organic colorants described in Mishra et al, 2009 [3].

Advantageously, the electron donor segment implemented within the scope of the present invention is an amino group of $(Z_1)(Z_2)$N— type, with $Z_1$ and $Z_2$, identical or different, representing an alkyl group optionally substituted or an aryl group optionally substituted as defined previously. In particular, when $Z_1$ and/or $Z_2$, identical or different, represent a substituted aryl group, the latter is substituted by one group or several groups, identical or different, with electron donor character. "Electron donor character" is taken to mean, within the scope of the present invention, a group chosen from an alkyl group, comprising from 1 to 10 carbon atoms, optionally substituted; an alkoxy group comprising from 1 to 10 carbon atoms, optionally substituted; a diamine group and particularly a di(alkyl)amino group optionally substituted on the alkyl group(s) by an hydroxy; a alkylthio group and a thioether group.

In the experimental part hereafter, two examples of electron donor segment are given, the latter being useable in any organic colorant according to the invention.

"Electron acceptor segment (A)" is taken to mean, within the scope of the present invention, an electron acceptor function which ensures the anchoring of the organic colorant according to the present invention on the solid support such as a solid support of metal oxide type while ensuring good transfer of charges between said support and said colorant.

Any electron acceptor segment known to those skilled in the art and commonly used in the field of photosensitizer organic colorants may be used within the scope of the present invention. As examples of such electron acceptor segments may be cited those as defined on page 1, lines 26 and 27 and particularly exemplified on page 29, lines 7 to 23; page 37, lines 6 to 9; from page 46, line 6 to page 47, line 1 or page 47, lines 2 to 8 of international application WO 2009/109499 [7] and those implemented in the 56 organic colorants described in Mishra et al, 2009 [3].

Advantageously, the electron acceptor segment implemented within the scope of the present invention is a carboxylic acid group, a cyanoacrylic acid group, a phosphonic group, a dithiocarboic group or a group corresponding to any of the following formula:

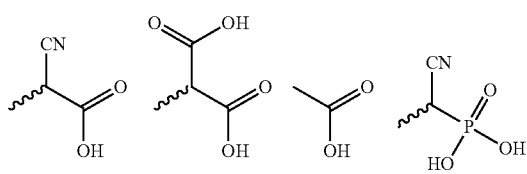

-continued

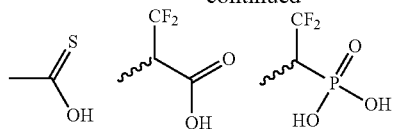

Within the scope of the present invention, the pi-conjugated chromophore and the electron acceptor segment are advantageously separated from each other by a spacer (L).

Any spacer known to those skilled in the art and commonly used in the field of photosensitizer organic colorants may be used within the scope of the present invention. As examples of such spacers, those implemented in the 56 organic colorants described in Mishra et al, 2009 [3] may be cited.

Within the scope of the present invention, the spacer L is particularly a pi-conjugated function such as an alkenylene or alkynylene chain optionally substituted or an arylene chain optionally substituted as defined previously. As spacers more particularly capable of being implemented within the scope of the present invention, an ethylenyl, propylenyl, butenyl, phenylene, benzylene or naphthylene chain may be cited.

Advantageously, when the spacer L implemented within the scope of the present invention comprises a double bond, the latter is separated from the $1^{st}$ thiophene (or selenophene or furan) ring that may contain the pi-conjugated chromophore near to the spacer by at least one arylene chain optionally substituted as defined previously and particularly by at least one phenylene optionally substituted. It should be noted that this phenylene may be a phenylene already present in certain of the units (III) to (XXIII) described previously. In other words, when the spacer L implemented within the scope of this invention comprises a double bond, the organic colorant according to the invention exhibits a phenylene belonging either to said spacer L or to a unit chosen from the units (III) to (XXIII).

More particularly, the organic colorant according to the invention of formula (I) or (II) comprises a unit corresponding to all or part of the spacer L or to a part of the pi-conjugated chromophore and to the electron acceptor segment corresponding to any of the following formulae:

In a particularly advantageous manner, the organic colorant according to the present invention is chosen from the following compounds:

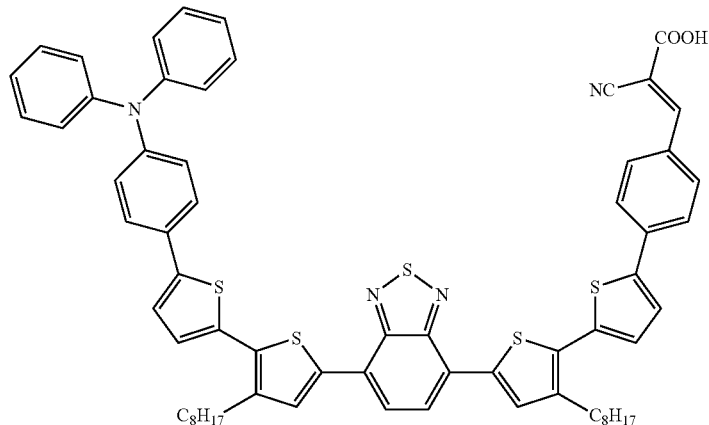

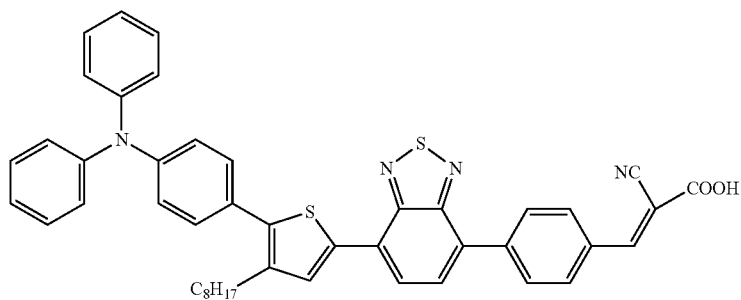
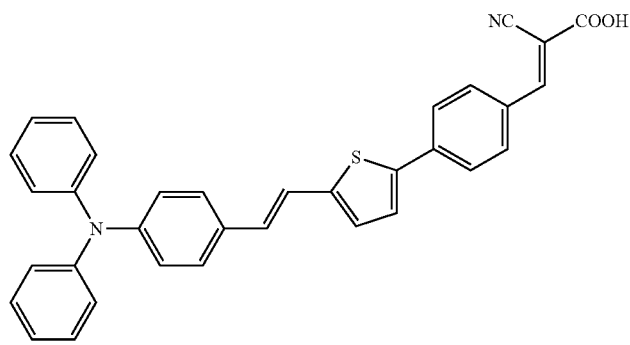
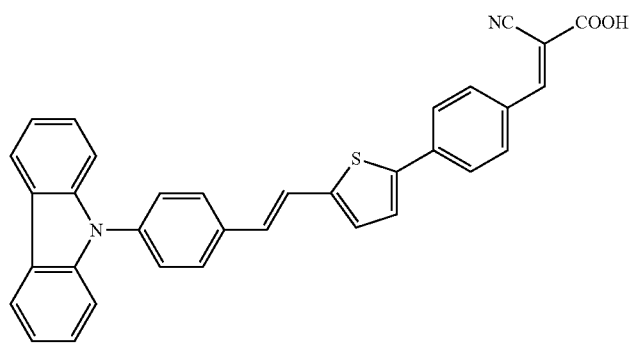
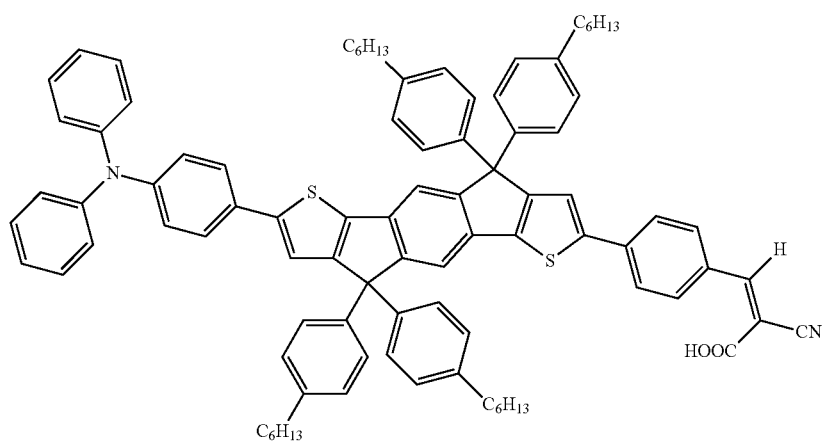

-continued
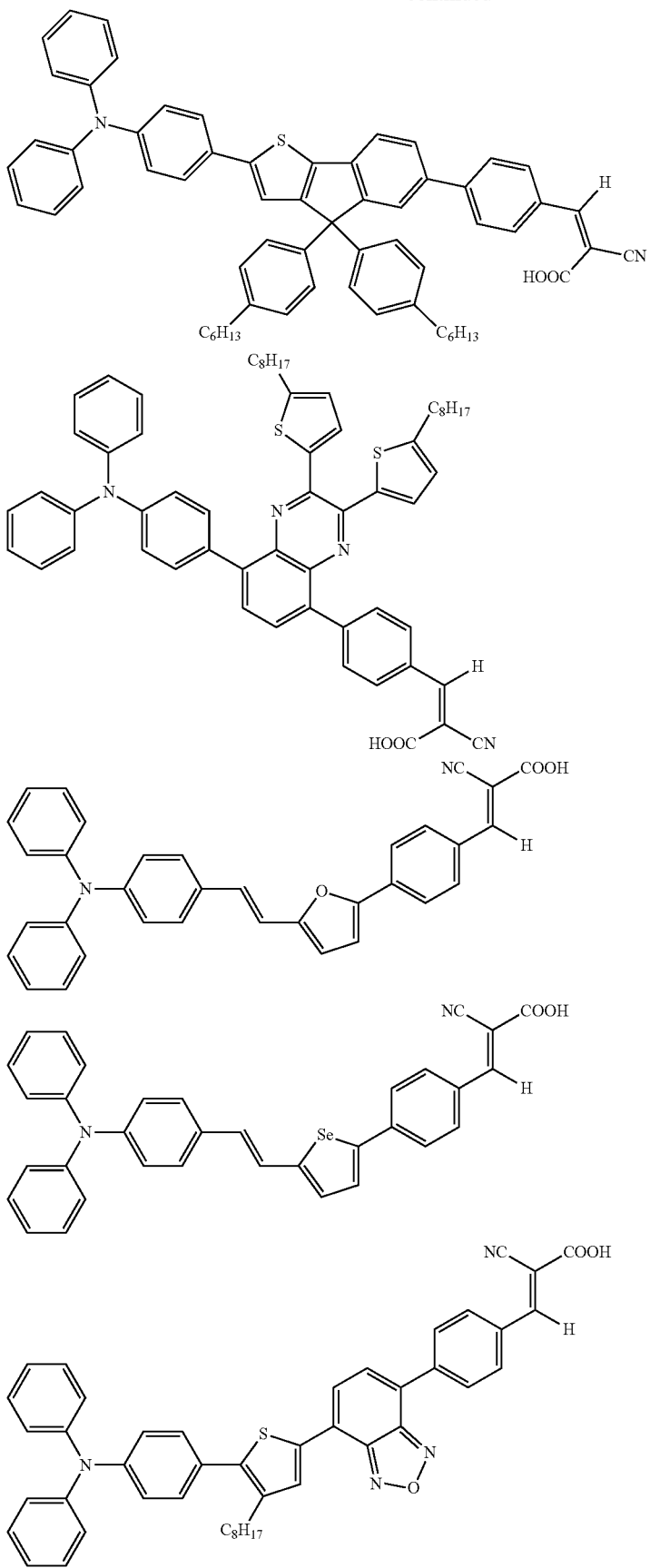

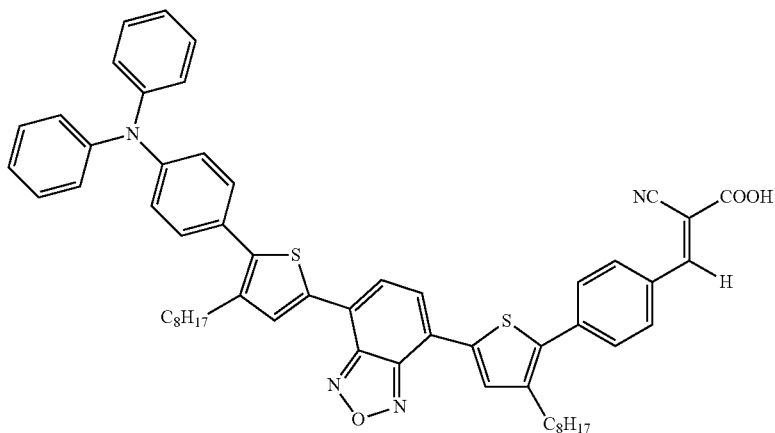
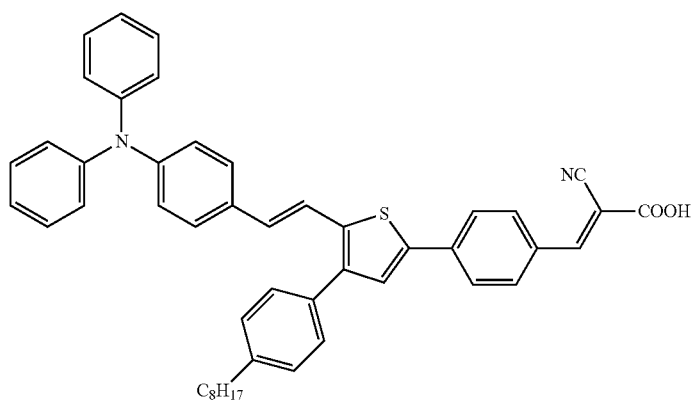
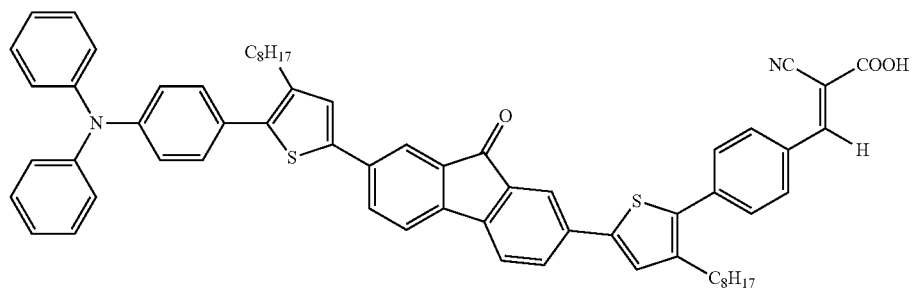
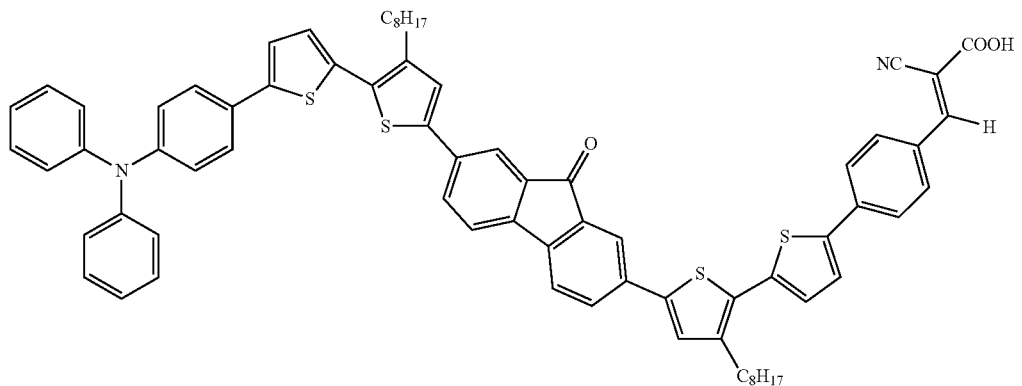

-continued

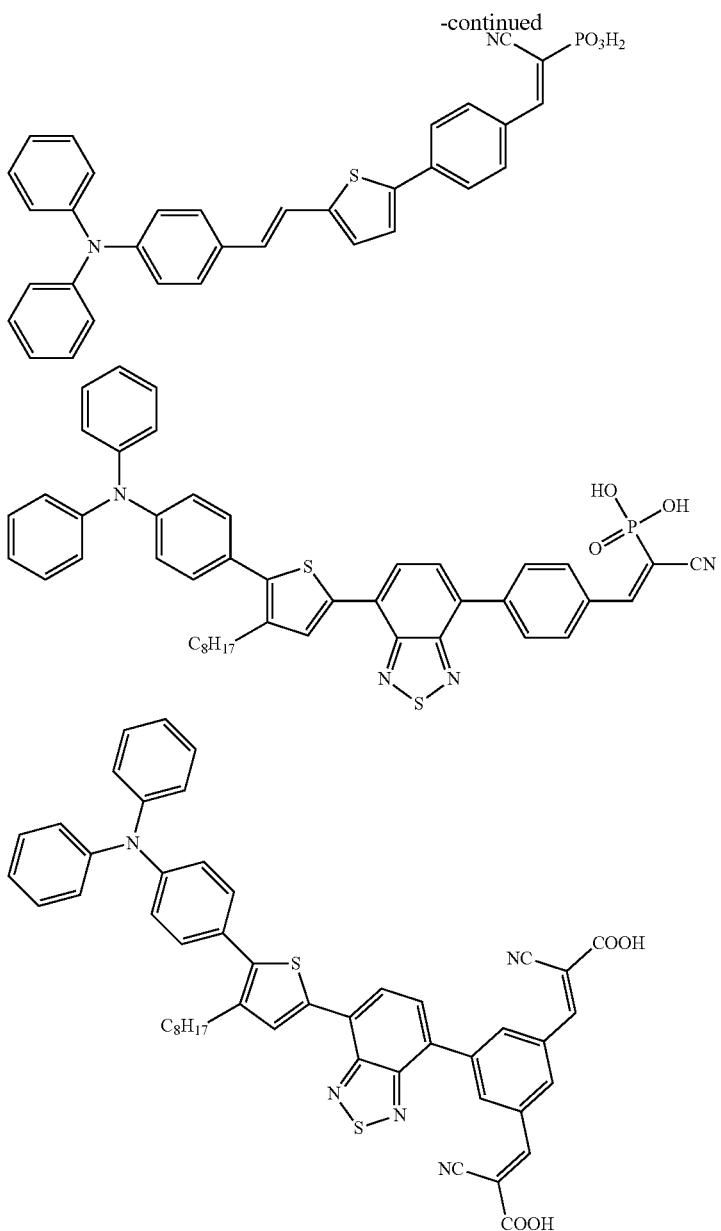

For all of the units and structures described in the present invention, the latter covers all stereo-isomers, all tautomers and all enantiomers that may be envisaged.

The present invention also relates to a method of preparing an organic colorant as defined in the present invention. Said method of preparation implements chemical reactions well known to those skilled in the art. The latter, on the basis of the different protocols explained in the experimental part hereafter and protocols for preparing organic colorants of the prior art, could prepare any organic colorant according to the present invention without any inventive effort.

The present invention moreover relates to an organic colorant as defined previously used as photosensitizer in a photovoltaic device.

Within the scope of the present invention, the expressions "photovoltaic device" and "photovoltaic cell" are similar and can be used in an interchangeable manner.

Consequently, the present invention relates to the photovoltaic device thereby obtained i.e. a photovoltaic device having a nanostructured semi-conductor metal oxide layer sensitized by an organic colorant as defined in the present invention.

In other words, the organic colorant as defined previously has reacted with the metal oxide layer via its electron attractor segment to give a group derived from the functionalising organic colorant, i.e. covalently bonded to the metal oxide layer. These functionalising groups thus have an electron donor segment (eD), a pi-conjugated chromophore, optionally a spacer (L) and a group derived from the electron acceptor segment (A) covalently bonded to the metal oxide layer, the electron donor segment (eD), the pi-conjugated chromophore, the spacer (L) and the electron acceptor segment (A) being as defined previously.

Within the scope of the present invention, when the organic colorant reacts with, i.e. is adsorbed on, the metal oxide layer, said reaction may take place in the presence of an additive such as another organic colorant or a co-adsorbent.

The other organic colorant, which can also be adsorbed on the metal oxide layer, may be (a) another colorant according to the present invention, (b) a mixture of colorants according to the present invention, (c) another colorant different from a colorant according to the present invention and (d) a mixture comprising at least one other colorant according to the present invention and at least one other colorant different from a colorant according to the present invention.

"Colorant different from a colorant according to the present invention" is taken to mean, within the scope of the present invention, a colorant chosen from a metal complex colorant and/or an organic colorant such as a colorant of indoline, courmarine, cyanine, merocyanine, hemicyanine, methine, azo, quinone, quinonimine, diceto-pyrrolo-pyrrole, quinacridone, squaraine, triphenylmethane, perylene, indigo, xanthene, eosin, rhodamine, phthalocyanine optionally metallised, porphyrine optionally metallised and mixtures thereof.

As co-adsorbents that can be used within the scope of the present invention may be cited steroid co-adsorbents such as deoxycholic acid, dehydrodeoxycholic acid, chenodeoxycholic acid, cholic acid methyl ester, the sodium salt of cholic acid or a mixture thereof.

The photovoltaic device according to the present invention moreover comprises two electrodes, designated, within the scope of the invention, anode and counter electrode, and separated from each other by an electrolyte and optionally polymer shims.

Advantageously, the anode implemented within the scope of the present invention consists of a layer of tin dioxide doped with fluorine ($SnO_2$:F or FTO) or indium tin oxide (ITO) deposited on a glass plate.

Within the scope of the present invention, "semi-conductor metal oxide" is taken to mean any binary, tertiary or quaternary metal oxide. Within the scope of the present invention, "nanostructured semi-conductor metal oxide" is taken to mean any semi-conductor metal oxide as defined previously comprising pores and particularly pores in which the average size is comprised between 20 and 500 Å, i.e. any mesoporous semi-conductor metal oxide as defined previously. Thus, the nanostructured semi-conductor metal oxide layer in the form of a mesoporous layer is deposited on the anode as defined previously.

Within the scope of the present invention, "binary metal oxide" is taken to mean a metal oxide of $M^{II}O$, $M^{III}_2O_3$ or $M^V_2O_5$ type with M representing a mono-, bi-, tri-, pentavalent metal and O an oxygen atom. As examples of such binary metal oxides may be cited $TiO_2$, $ZnO$, $SnO_2$, $Nb_2O_5$, $In_2O_3$ and $RuO_2$.

Within the scope of the present invention, "tertiary metal oxide" is taken to mean a metal oxide of MM'O type with M and M' representing two different bivalent metals. As an indication, $Zn_2SnO_4$, $SrTiO_4$, $SrTiO_3$, $BaSnO_3$ may be cited.

Within the scope of the present invention, "quaternary metal oxide" is taken to mean a composition of mixed oxides. Within the scope of the present invention, "composition of mixed oxides" is taken to mean:

a mixture of two binary oxides as defined previously. For example, mixtures may be cited such as $(ZnO)_{1-x}$—$(SnO_2)_x$, $(TiO_2)_{1-x}$—$(Nb_2O_5)_x$, or a mixture of a binary oxide and a tertiary oxide as defined previously. For example a mixture of $(SnO_2)$—$(SrTiO_3)$ may be cited.

Within the scope of the photovoltaic device according to the present invention, the electrolyte may be a liquid, an ionic liquid, a gel or a solid. Such an electrolyte is particularly as disclosed in the book of Kalyanasundaram K., 2010 [16].

When the electrolyte is a liquid electrolyte, it is advantageously chosen from customary liquid electrolytes such as $I^-/I_3^-$, $Br^-/Br_2$, $SCN^-/(SCN)_2$ or cobalt complexes of Co(III/II) type.

When the electrolyte is an electrolyte of gel or ionic liquid type, it is advantageously chosen from imidazolium salts such as, by way of examples and in a non-exhaustive manner, 1-ethyl-3-methylimidazolium selenocyanate (EMISeCN), 1-ethyl-3-methylimidazolium thiocyanate (EMISCN) or 1-methyl-3-n-hexylimidazolium iodide (MHImI).

When the electrolyte is a solid type electrolyte, it is advantageously chosen from a p-type semi-conductor solid, such as a polymer or a small molecule, being able to be deposited by liquid process. More particularly, the electrolyte of solid type capable of being implemented within the scope of the present invention is chosen from the compound spiro-OMeTAD or a derivative of triarylamine. A pi-conjugated polymer may also be used such as, for example, poly(3,4-ethylenedioxythiophene) (PEDOT) or a mixture of PEDOT and sodium poly(styrene sulphonate) (PSS) known as PEDOT:PSS. A polymer of poly(ethylene) oxide type containing a redox couple or even polyaniline may also be used.

Whatever the type of electrolyte implemented within the scope of the present invention, the latter moreover comprises a redox couple such as the redox couple $I^-/I^{3-}$ or a cobalt complex and optionally an anion of bis(trifluoro-methane-sulphonyl)imide (TFSI) type such as Li-TFSI and does so to improve the conductivity of the electrolyte.

Within the scope of the present invention, "polymer shim" is taken to mean a thermal polymer adhesive making it possible to set the two electrodes. Such polymer adhesives are particularly the adhesives of Solaronix brand such as those of the Amosil or even Meltonix range or even the adhesives of the FastelFilm range of Dupond. These polymers come in the form of thick hot melt thermoplastic sheets. The sealing occurs when the polymer is heated to around 100° C. for several seconds, for example, using a vacuum laminator, a hot press or a soldering iron for small surfaces. Typically, the seals or the strips are cut and laid out on the electrode substrate before hot lamination.

Finally, the counter electrode of the photovoltaic device according to the present invention is constituted of a metal layer deposited on a transparent solid FTO support according to an operating method well known to those skilled in the art.

Other characteristics and advantages of the present invention will become clearer to those skilled in the art on reading the examples below given for illustrative and non-limiting purposes, and by referring to the appended drawings.

DETAILED DESCRIPTION OF SPECIFIC EMBODIMENTS

Figure 1:
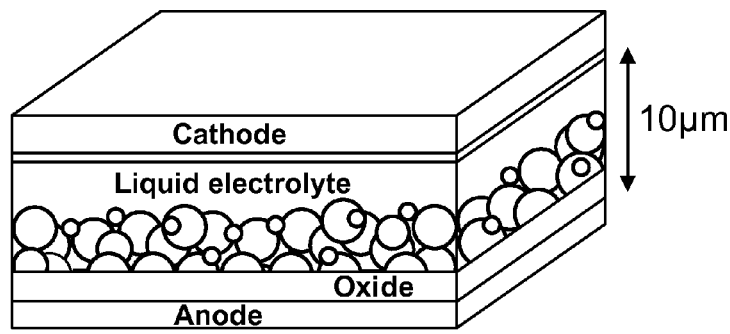
FIG. 1 is a schematised representation of a photovoltaic cell as described in the article of O'Regan and Grätzel, 1991 [1].

I. Synthesis of the Colorants YKP29 and YKP61

I.1. N,N-diphenyl-4-vinylaniline [YKP21]

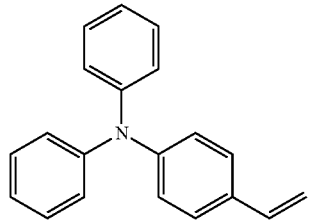 [SMILES: C=Cc1ccc(N(c2ccccc2)c2ccccc2)cc1]

In a two necked flask, under argon atmosphere, 22.18 g (54.87 mmol) of methyl(triphenyl)phosphonium iodide are dissolved in 100 mL of freshly distilled tetrahydrofuran (THF). After the mixture is cooled to the temperature of 0° C., 1.5 eq. (6.16 g) of potassium tert-butoxide are incorporated. After 30 min of stirring at 0° C., a solution of 4-(N,N-diphenylamino)-benzaldehyde (10 g, 36.80 mmol) in 30 mL of THF is added to the mixture, drop by drop. The temperature of the medium is then left to return to ambient temperature and the stirring continued for 4 additional hours. The medium is then hydrolysed with a saturated sodium carbonate solution then extracted in dichloromethane. The organic phase is washed successively with water, a saturated NaCl solution then dried on $Na_2SO_4$. After filtration and evaporation, the crude product is purified on chromatography column on silica [eluent—hexane/ethyl ether: 80/20].

5.82 g of the compound YKP21 are obtained in the form of an off-white solid (yield of 58.5%).

$^1$H NMR ($CDCl_3$): 5.20 (dd, 1H, J=10.8 Hz, J=1.2 Hz); 5.68 (dd, 1H, J=17.5 Hz, J=1.2 Hz); 6.71 (dd, 1H, J=17.5 Hz, J=10.8 Hz); 7.10 (m, 8H); 7.30 (m, 6H)

$^{13}$C NMR ($CDCl_3$): 147.4; 136.0; 131.7; 129.1; 126.9; 124.2; 123.4; 122.7

I.2. 4-(5-bromothiophen-2-yl)benzaldehyde [YKP24]

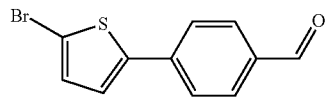

In a two necked flask under argon, 0.75 g (3.98 mmol) of 4-(2-thienyl)benzaldehyde in 20 mL of dimethylformamide (DMF) are cooled to 0° C. 1.1 eq. (0.78 g, 4.38 mmol) of N-bromosuccinimide (NBS) are solubilised in a mixture of 10 mL of DMF and 10 mL of methanol. This solution of NBS (protected from light) is then added drop by drop (30 min) to the reaction medium. The temperature of the medium is then left to return to ambient temperature over 2 h. The medium is hydrolysed with a solution of 1 mol·$L^{-1}$ HCl and extracted with ethyl ether. The combined organic phases are washed with a saturated NaCl solution then dried on anhydrous $Na_2SO_4$. After filtration and evaporation to dryness, the reaction mixture is recrystallised with acetone.

0.75 g of the compound YKP24 are obtained in the form of a white solid (yield of 70.6%).

$^1$H NMR ($CDCl_3$): 7.10 (dd, 1H, J=4.0 Hz, J=0.5 Hz), 7.20 (dd, 1H, J=3.9 Hz, J=0.5 Hz), 7.66 (d, 2H, J=8.27 Hz), 7.88 (d, 2H, J=8.19 Hz), 10.00 (s, 1H)

I.3. 4-(5-(4-(diphenylamino)styryl)thiophen-2-yl)benzaldehyde [YKP25]

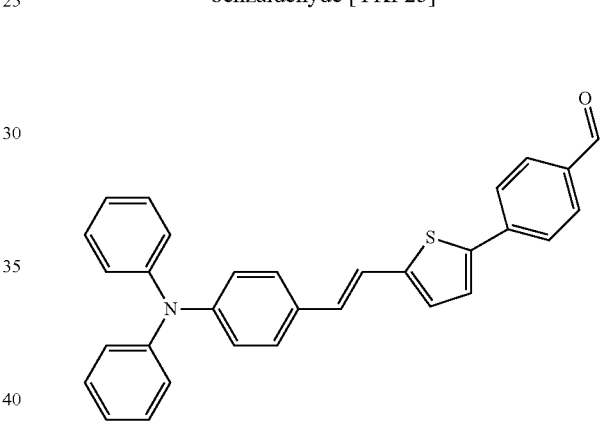

Into a three necked flask under argon, are introduced, in successive order, 0.75 g (2.81 mmol) of YKP24, 27 mg (1%) of the catalyst trans-di(μ-acetato)bis[o-(di-o-tolylphosphino)benzyl] dipalladium(II), 124 mg (20%) of 2,6-di-tert-butylcresol and 655 mg (2.2 eq.) of sodium carbonate. The whole, after dissolution in 15 mL of N,N-dimethylacetamide (DMAC) degassed beforehand, is heated to 90° C. A solution of 15 mL of DMAC containing 1.52 g (2 eq.) of YKP21 is added drop by drop to the mixture. After the addition, the whole is heated to 135° C. and stirred for 24 h. The next day after cooling, the contents of the three necked flask are added to 200 mL of a mixture of [$CH_2Cl_2$/water: 50/50]. The organic phase is washed successively with a 2 mol·$L^{-1}$ HCl solution, with water, with a saturated NaCl solution then dried on $Na_2SO_4$. After filtration and evaporation, the crude product is purified on chromatography column on silica [eluent—hexane/ethyl acetate: 95/05]. After this Heck reaction, 0.52 g of the compound YKP25 are obtained in the form of an orange solid (yield of 40.5%).

$^1$H NMR ($CDCl_3$): 7.08 (m, 10H), 7.35 (m, 6H), 7.52 (d, 1H, J=8.58 Hz), 7.72 (d, 1H, J=3.81 Hz), 7.92 (q, 4H), 10.00 (s, 1H)

I.4. 2-cyano-3-(4-(5-(4(diphenylamino) styryl) thiophen-2-yl)phenyl)acrylic acid [YKP29]

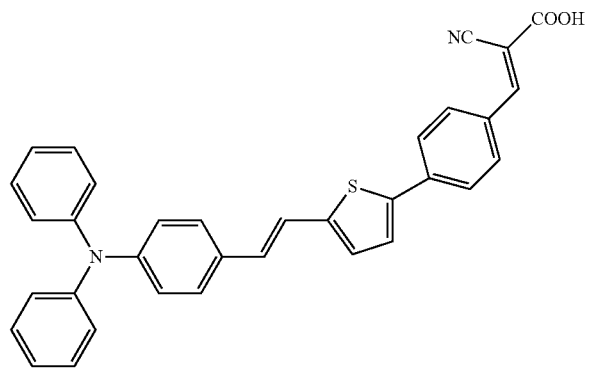 [SMILES: N#C/C(=C\c1ccc(-c2ccc(/C=C/c3ccc(N(c4ccccc4)c4ccccc4)cc3)s2)cc1)C(=O)O]

The compound YKP29 is obtained following a Knoevenagel condensation. Consequently, into a two necked flask containing 30 mL of CH$_3$CN under argon atmosphere, are introduced 395 mg (0.863 mmol) of YKP25, 1.47 g (20 eq.) of cyanoacetic acid, several catalytic drops of pyridine. The whole is heated to reflux for 2 h. The acetonitrile is evaporated in a rotary evaporator and the whole is taken up in chloroform. The organic phase is washed successively with a 2 mol·L−1 HCl solution, with water, then dried on Na$_2$SO$_4$. The desired product precipitates in hexane. After filtration and oven drying, 305 mg of the compound YKP29 are obtained in the form of a dark solid (yield of 69.6%).

$^1$H NMR (DMSO): 7.10 (m, 9H), 7.35 (m, 6H), 7.52 (d, 2H, J=8.68 Hz), 7.74 (d, 1H, J=3.84 Hz), 7.91 (d, 2H, J=8.48 Hz), 8.10 (d, 2H, J=8.66 Hz), 13.98 (s, 1H)

I.5. Diethyl(1-cyano2-(4-(5-(4-diphenylaminostyryl) thiophen-2-yl)phenyl)vinyl)phosphate [YKP57]

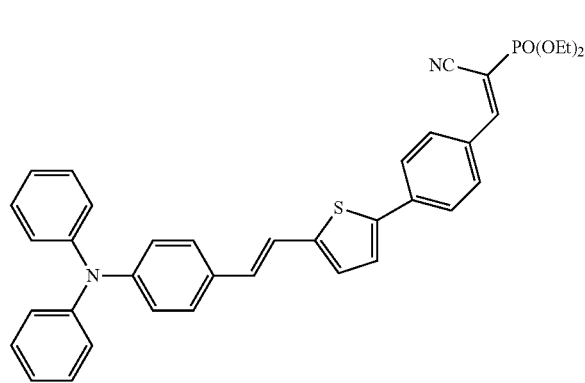

Another Knoevenagel condensation is carried out by introducing into a two-necked flask containing 15 mL of CH$_3$CN under an argon atmosphere, 280 mg (0.612 mmol) of YKP25, 1.47 g (1.2 eq.) of diethylcyanomethyl phosphonate, several catalytic drops of pyridine. The whole is heated to reflux for 2 h. The acetonitrile is evaporated in a rotary evaporator and the whole is taken up in chloroform. The organic phase is washed with water, then dried on Na$_2$SO$_4$. After filtration and evaporation the crude product is purified on chromatography column on silica [eluent: CHCl$_3$/ethyl acetate: 9/1] from which is obtained 253 mg of compound YKP57 (yield of 66.9%).

$^1$H NMR (CDCl$_3$): 8.05 (d, 1H, J=3.9 Hz), 7.98 (d, 2H, J=8.95 Hz), 7.74 (d, 2H, J=8.49 Hz), 7.42-7.28 (m, 7H), 7.17-7.01 (m, 9H), 4.28 (m 4H), 1.46 (td, 6H, J1=7.04 Hz, J2=0.64 Hz)

I.6. (1-cyano2-(4-(5-(4-diphenylaminostyryl) thiophen-2-yl)phenyl)vinyl phosphonic acid [YKP61]

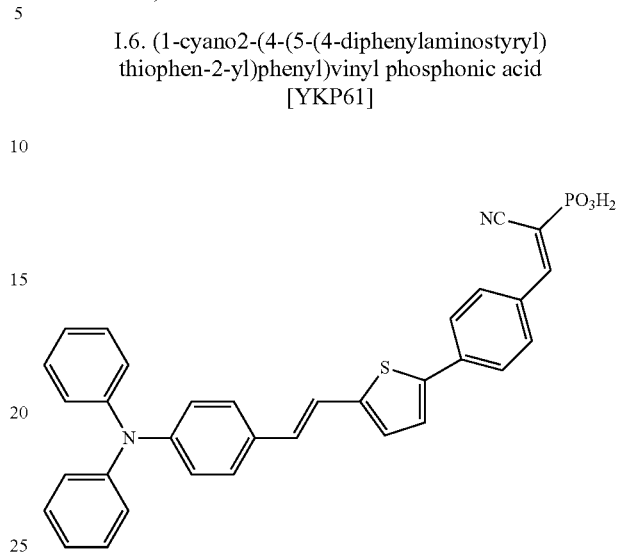

In a two-necked flask, YKP57 is placed in 10 mL of CH$_2$Cl$_2$ under reflux for 30 min and BrSi(Me)$_3$ in large excess is added by injection and is left to reflux for 1 h. After cooling the dichloromethane is evaporated and separation is carried out using chromatography, THF-Methanol (9-1) as eluent. An orange-red solid is obtained.

II. Synthesis of the Colorant YKP64

II.1. 4-(9H-carbazol-9-yl)benzaldehyde [YKP46]

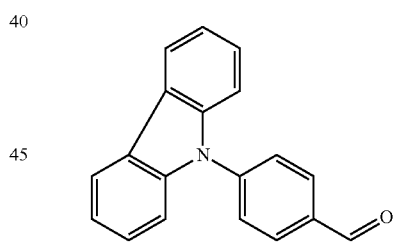

In a three necked flask under argon, a solution containing 8.4 g (0.05 mol) of carbazole and 5.5 g (1 eq.) of potassium tert-butoxide (t-BuOK) in 200 mL of DMF is heated to 110° C. After 30 min of reaction, the catalytic mass of palladium tris-(tertio-butyl) (Pd(t-Bu$_3$)$_3$) freshly synthesised according to the protocol described below is incorporated. 6 g (1 eq.) of 4-fluorobenzaldehyde are then added drop by drop to the mixture. The whole is maintained under stirring at the temperature of 110° C. for 36 h. After returning to ambient temperature, the contents of the flask are thrown into 300 mL of water. This solution is filtered and extracted with CH$_2$Cl$_2$. The organic phases are combined and washed successively with an HCl solution (2 mol·L$^{-1}$), with water, then dried on Na$_2$SO$_4$. After filtration and evaporation, the crude product is purified on chromatography column on silica [eluent—cyclohexane/chloroform:6/4]. 10.07 g of the compound YKP46 are obtained in the form of a white solid (yield of 74.7%).

¹H NMR (CDCl₃): 7.34 (td, 2H, J=7.5 Hz, J=1.5 Hz), 7.45 (td, 2H, J=7.1 Hz, J=1.36 Hz), 7.52 (td, 2H, J=8.12 Hz, J=0.9 Hz), 7.82 (dt, 2H, J=6.6 Hz, J=2.0 Hz), 10.12 (s, 1H)

The catalyst: Pd(t-Bu₃)₃

The catalyst is synthesised by reaction of tri(tert-butyl) phosphine on palladium II acetate (Pd(OAc)₂). Into a two necked flask are introduced 107 mg (0.48 mmol, 2%) of Pd(OAc)₂ and 2.4 mL (1.2 mmol, 5%) of tri(tert-butyl)phosphine. Under argon, 10 mL of anhydrous toluene are added and the whole is heated to the temperature of 60° C. for 30 min. A catalyst of yellow chick colour ready to be injected into the reaction medium is then obtained.

II.2. 9-(4-vinylphenyl)-9H-carbazol [YKP48]

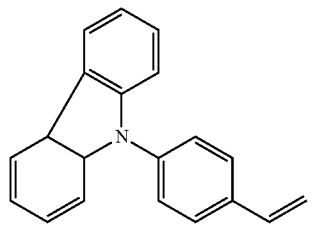 [SMILES: C=Cc1ccc(N2c3ccccc3C3C=CC=CC32)cc1]

In a two necked flask under argon atmosphere 12.65 g (31.29 mmol) of methyl(triphenyl)phosphonium iodide are dissolved in 50 mL of freshly distilled THF. After the mixture is cooled to the temperature of 0° C., 1.5 eq. (3.51 g) of potassium tert-butoxide are incorporated. After 30 min of stirring at 0° C., a solution of YKP46 (5.64 g, 20.86 mmol, 0.66 eq.) in 30 mL of THF is added drop by drop to the mixture. The temperature of the medium is then left to return to ambient temperature and the stirring is continued for 4 additional hours. The medium is then hydrolysed with a saturated sodium carbonate solution then extracted in dichloromethane. The organic phase is washed successively with water, a saturated NaCl solution then dried on Na₂SO₄. After filtration and evaporation, the crude product is purified on chromatography column on silica [eluent—cyclohexane/chloroform: 6/4]. 3.22 g of the compound YKP48 are obtained in the form of a light yellow solid (yield of 57.5%).

¹H NMR (CDCl₃): 5.41 (dd, 1H, J=11.5 Hz, J=0.7 Hz); 5.90 (dd, 1H, J=17.5 Hz, J=0.7 Hz); 6.88 (dd, 1H, J=17.5 Hz, J=11.8 Hz); 7.33 (m, 2H); 7.46 (dm, 4H); 7.58 (td, 2H, J=8.59 Hz, J=2.2 Hz); 7.69 (dt, 2H, J=8.6 Hz, J=2.0 Hz); 8.19 (dt, 2H, J=7.8 Hz, J=1.0 Hz)

II.3. 4-(5-(4-(9H-carbazol-9-yl)styryl)thiophen-2-yl) benzaldehyde [YKP63]

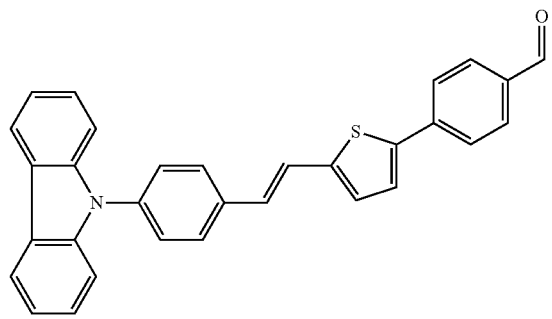 [SMILES: O=Cc1ccc(-c2ccc(/C=C/c3ccc(-n4c5ccccc5c5ccccc54)cc3)s2)cc1]

Into a three necked flask under argon, are introduced, in successive order, 515 mg (1.85 mmol, 1 eq.) of YKP51, 18 mg (1%) of the catalyst trans-di(μ-acetato)bis[o-(di-o-tolylphosphino)benzyl]dipalladium(II), 90 mg (20%) of 2,6-di-tert-butylcresol and 460 mg (2.2 eq.) of sodium carbonate. The whole, after dissolution in 15 mL of DMAC degassed beforehand, is heated to 90° C. A solution of 15 mL of DMAC containing 1.00 g (2 eq.) of YKP48 is added drop by drop to the mixture. After the addition, the red reaction mixture is heated to 135° C. and stirred for 24 h. The next day after cooling, the contents of the three necked flask are added to 200 mL of a mixture of [CH₂Cl₂/water: 50/50]. The organic phase is washed successively with a 2 mol·L⁻¹ HCl solution, with water, with a saturated NaCl solution then dried on Na₂SO₄. After filtration and evaporation, the crude product is purified on chromatography column on silica [eluent—cyclohexane/ethyl acetate: 95/05]. After said Heck reaction, 490 mg of the compound YKP63 are obtained in the form of an orange solid (yield of 58.2%).

¹H NMR (CDCl₃): 7.18 (t, 3H), 7.35 (m, 3H), 7.47 (m, 5H), 7.69 (dd, 4H, J=8.50 Hz), 7.89 (dd, 4H, J=8.54 Hz), 8.20 (dt, 2H, J=7.57 Hz, J=1.1 Hz), 10.05 (s, 1H)

II.4. 3-(4-(E)-4(9H-carbazol-9-yl)styryl)phenyl)-2-cyanoacrylic acid [YKP64]

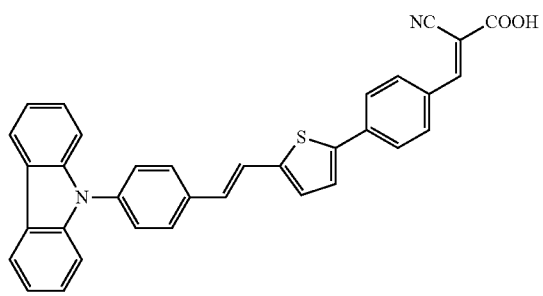 [SMILES: N#C/C(=C\c1ccc(-c2ccc(/C=C/c3ccc(-n4c5ccccc5c5ccccc54)cc3)s2)cc1)C(=O)O]

The compound YKP64 is obtained following a Knoevenagel reaction. Into a two necked flask containing 20 mL of CH₃CN under argon atmosphere, are introduced 200 mg (0.44 mmol) of YKP63, 45 mg (1.2 eq.) of cyanoacetic acid, several catalytic drops of pyridine. The whole is heated to reflux for 2 h. The acetonitrile is evaporated in a rotary evaporator and the whole is taken up in chloroform. The organic phase is washed successively with a 2 mol·L⁻¹ HCl solution, with water, then dried on Na₂SO₄. The desired product precipitates in a mixture of hexane and petroleum ether. After filtration and oven drying, 180 mg of the compound YKP64 are obtained in the form of a dark solid (yield of 78.0%).

¹H NMR (CDCl₃): 14.0 (s, br 1H, (COOH)), 8.33 (s, 1H), 8.26 (d, 2H, J=7.6 Hz), 8.12 (d, 2H, J=7.6 Hz), 790 (d, 4H, J=8.6 Hz), 7.76 (d, 2H, J=3.8 Hz), 7.6 (m, 2H), 7.16-7.75 (m, 8H)

III. Synthesis of colorants GB043, YKP125 and YKP126

III.1. 2-triphenylamino-3-octylthiophene [GB008]

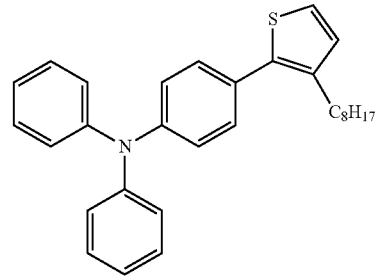

Into a two necked flask provided with a coolant and a septum, are introduced 1.65 g (4.63 mmol, 1.1 eq.) of 4-(diphenylamino)phenylboronic and 1.16 g (4.21 mmol, 1 eq.) of 2-bromo-3-octylthiophene in the presence of 1.03 g (5.05 mmol, 2.3 eq.) of $K_3PO_4$ and 200 mg (4% molar) of $Pd(PPh_3)_4$ in 30 mL of DMF. The mixture is stirred for 14 h at 75° C. After a treatment of the mixture with 100 mL of water, the aqueous phase is washed with 2×100 mL of ether. The organic phases are washed with 2×100 mL of saturated NaCl solution and dried on $Na_2SO_4$. After filtration and evaporation of the solvent, the purification is carried out on silica column with an eluent [hexane/$CH_2Cl_2$: 2/1]. 1.67 g of final compound are obtained in the form of a yellow oil (yield of 86.0%).

$^1$H NMR ($CD_2Cl_2$): 7.33-7.96 (m, 16H), 2.66 (t, 2H, J=7.8 Hz), 1.64-1.53 (m, 2H), 1.41-1.20 (m, 10H), 0.88 (t, 3H, J=3 Hz)

III.2. 4-(5-(7-bromobenzo[c][1,2,5]thiadiazol-4-yl)-3-octylthiophen-2-yl)-N,N-diphenylaniline [GB040] from GB008

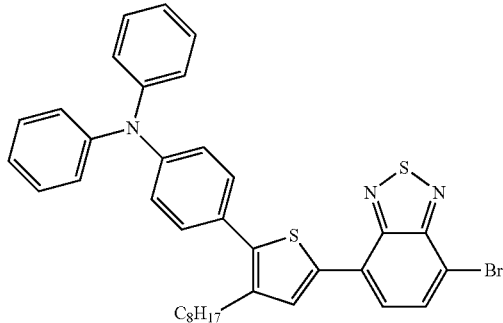

Into a two necked flask under inert atmosphere of argon, are introduced 1 g (2.3 mmol, 1 eq.) of compound GB008. After having cooled the medium to −78° C., 1.72 mL (1.1 eq., C=1.6 mol/L) of butyl lithium (BuLi) are added by syringe. The temperature of the medium is maintained at −50° C. and it is left to stir for 45 min. Then 504 mg (2.53 mmol, 1.1 eq.) of trimethyltin chloride ($ClSnMe_3$) are added to the medium cooled beforehand to −78° C. The reaction remains under stirring for the following 3 h where the temperature returns to ambient temperature. The treatment is carried out by hydrolysis with a saturated solution of $NH_4Cl$ followed by an extraction with diethyl ether. The ether phase is dried on $Na_2SO_4$, filtered and concentrated. 1.42 g of the stannic derivative of GB008 are then obtained in the form of an orange oil which will be used without further purification thereafter.

$^1$H NMR ($CD_2O_2$): 7.33-7.18 (m, 7H), 7.14-6.96 (m, 8H), 2.67 (t, 2H, J=7.8 Hz), 1.67-1.50 (m, 2H), 1.41-1.19 (m, 10H), 0.87 (t, 3H, J=6.6 Hz). +stannic peaks In another three necked flask under argon, a mixture of 505.5 mg (1.72 mmol, 1 eq.) of dibromobenzothiadiazole and 43 mg (2% molar) of $Pd(PPh_3)_4$ is made up in 50 mL of DMF. After dissolution of the reagents, 1.42 g of the stannic derivative of freshly prepared GB008 are rapidly introduced. The mixture is heated to the temperature of 95° C. and stirred for 12 h. The reaction is stopped by the addition of a solution of $NH_4Cl$. The organic phase is extracted with diethyl ether, which is then washed with water, then dried on $Na_2SO_4$. The oil thereby obtained contains a mixture of the monocoupled compound with the bicoupled compound. The purification is carried out on silica column with hexane as eluent followed by a progressive passage of the mixture [hexane/$CH_2Cl_2$: 6/4]. The bicoupled compound comes out first followed by the monocoupled compound GB040. 213.1 mg of an orange oil (yield of 20.0%) are obtained.

$^1$H NMR ($CDCl_3$): 7.99 (d, 1H, J=9 Hz), 7.85 (d, 1H, J=7.6 Hz), 7.71 (dd, 1H, J1=7.6 Hz, J2=2 Hz), 7.40-7.26 (m, 6H), 7.18-7.01 (m, 8H), 2.75 (t, 2H, J=5.8 Hz), 1.78-1.63 (m, 2H), 1.44-1.19 (m, 10H), 0.87 (t, 3H, J=6.6 Hz)

III.3. 4-(7-(5-(4-(diphenylamino)phenyl)-4-octyl thiophen-2-VI)benzo[c][1,2,5]thiadiazol-4-yl)-benzaldehyde [GB041]

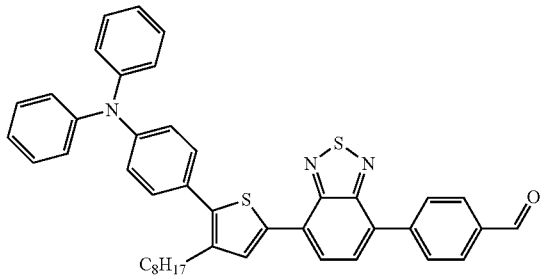

Into a two necked flask, are introduced 226.2 mg (0.35 mmol, 1 eq.) of bromine compound GB040 and 57.2 mg (0.38 mmol, 1.1 eq.) of 4-phenylboronic acid in the presence of 2.3 eq. of $K_2CO_3$ and 12 mg (4% molar) of $Pd(PPh_3)_4$ in 30 mL of anhydrous THF. The mixture is stirred for 14 h at 75° C. After treatment of the mixture with 100 mL of water, the aqueous phase is washed with 2×100 mL of ether. The organic phases are washed with 2×100 mL of saturated NaCl solution and dried on $Na_2SO_4$. After filtration and evaporation of the solvent, the purification is carried out on silica column with an eluent [hexane/$CH_2Cl_2$: 1/1]. 135.4 mg of final red compound (yield of 58.0%) are obtained.

In a variant, into a two-necked flask are introduced 700 mg (1.073 mmol, 1 eq.) of bromine compound GB040 and 482 mg (3.59 mmol, 3 eq.) of 4-phenylboronic acid in the presence of 3 eq. of $K_2CO_3$ and 88 mg (4% molar) of $Pd(PPh_3)_4$ in 30 mL of THF, 7 mL of water and 5 mL of toluene. The mixture is stirred for 14 h at 75° C. After treatment of the mixture with 100 mL of water, the aqueous phase is washed with 2×100 mL of ether. The organic phases are washed with 2×100 mL of saturated NaCl solution and dried on $Na_2SO_4$. After filtration and evaporation of the solvent, the purification is carried out on a silica column with an eluent [cyclohexane/$CH_2Cl_2$: 6/4]. 727 mg of final red compound (yield of 70.5%) are obtained.

$^1$H NMR ($CDCl_3$): 10.11 (s, 1H), 8.19 (d, 2H, J=8.4 Hz), 8.08 (s, 1H), 8.07 (d, 2H, J=8.2 Hz), 7.96 (d, 1H, J=7.6 Hz), 7.82 (d, 1H, J=7.6 Hz), 7.42-7.26 (m, 6H), 7.19-7.03 (m, 8H), 2.77 (t, 2H, J=7.8 Hz), 1.80-1.66 (m, 2H), 1.45-1.19 (m, 10H), 0.87 (t, 3H, J=6.6 Hz)

III.4. 2-cyano-3(4-(7-(5-(4-(diphenyl amino)phenyl)-4-octylthiophen-2-yl)benzo[c][1,2,5]thiadiazol-4-yl) phenyl)acrylic acid [GB043]

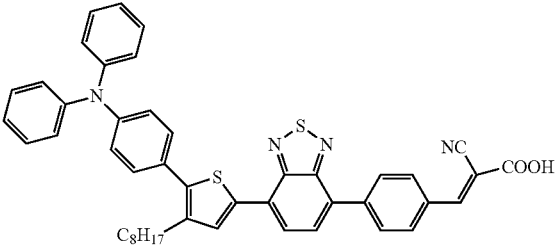

Into a two necked flask containing 20 mL of CH₃CN under argon atmosphere, are introduced 119.7 mg (0.18 mmol) of GB041, 18 mg (0.21 mmol, 1.2 eq.) of cyanoacetic acid, several catalytic drops of pyridine. The whole is heated to reflux for 2 h. The acetonitrile is evaporated in a rotary evaporator and the whole is taken up in chloroform. The organic phase is washed successively with a 2 mol·L⁻¹° H.Cl solution, with water, then dried on Na₂SO₄. The desired product precipitates in a mixture of hexane and petroleum ether. After filtration and oven drying, 54 mg of the compound GB043 are obtained in the form of a brown solid (yield of 41.0%).

By following the above protocol but using 150 mg (0.22 mmol) of GB041 and 23 mg (0.27 mmol, 1.22 eq.) of cyanoacetic acid, a yield of 85% is achieved.

¹H NMR (CDCl₃): 8.36 (s, 1H), 8.16 (s, 4H), 8.06 (s, 1H), 7.91 (d, 1H, J=7.4 Hz), 7.79 (d, 1H, J=7.6 Hz), 7.40-7.26 (m, 6H), 7.18-7.03 (m, 8H), 2.74 (t, 2H, J=7.8 Hz), 1.78-1.66 (m, 2H), 1.42-1.21 (m, 10H), 0.87 (t, 3H,

III.5 4-(5-(5,5-dimethyl-1,3,2-dioxaborinan-2-yl)-3-octylthiophen-2-yl)-N,N-diphenylaniline [YKP85]

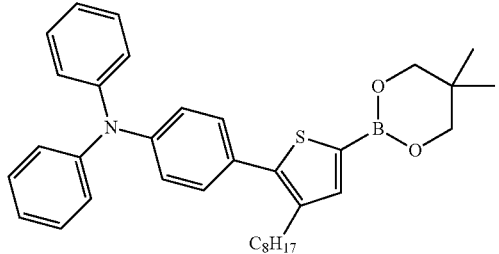

Under an argon atmosphere in a three-necked flask, 2 g (4.55 mmol, 1 eq.) of 2-triphenylamino-3-octylthiophene is dissolved with 30 mL of THF. After bringing the medium to −78° C., 2.2 mL (5.46 mmol, 1.2 eq., C=2.5 mol/L) of BuLi is added drop-wise. The reaction is stirred for 1 h at −50° C. Then 1.55 mL (13.65 mmol, 3 eq.) of trimethylborate is added to the medium, brought beforehand to −78° C. The reaction is kept stirred for the next 2 h when the temperature rises once more to ambient. The mixture is then hydrolysed by a solution of 2 mol/L HCl and extracted with 2×50 mL of ethyl ether. During drying of the collected organic phase over Na₂SO₄, 1.18 g (11.38 mmol, 2.5 eq.) of 2,2-dimethyl-1,3-propanediol is added. After stirring for 60 min, the mixture is filtered and concentrated using a rotary evaporator. Purification is carried out using a silica column with an eluent [CHCl₃/Cyclohexane: 4/6]. 2.09 g of a yellow oil (yield of 83.3%) is obtained.

¹H NMR (CDCl₃): 7.47 (s, 1H), 7.08-7.36 (m, 16H), 3.80 (s, 4H), 2.66 (t, 2H, J=7.8 Hz), 1.64-1.53 (m, 2H), 1.41-1.20 (m, 10H), 1.02 (s, 6H), 0.88 (t, 3H, J=3 Hz)

III.6 4-(5-(7-bromobenzo[c][1.2.5]thidazol-4-yl)-3-octylthiophen-2-yl)-N,N-diphenylaniline [GB040] from YKP85

Into a three-necked flask under an argon atmosphere 1.385 g (2.51 mmol, 1.1 eq.) of YKP85 is introduced in the presence of 804 mg (1 eq.) of dibromobenzothiadazole, 1.03 mg of K₂CO₃ (3 eq.), 40 mL of THF, 10 mL of water. The whole is stirred for 30 min at 60° C. Then 106 mg (5% molar) of Pd(PPh₃)₄ is injected into the clear claret coloured solution. The whole is stirred for 12 h at 70° C. After returning to ambient temperature, the content of the flask is poured into 100 mL of water. The organic phase is extracted by 2×100 mL of ether. The combined organic phases are washed respectively with water and with 2×100 mL of saturated NaCl solution. After Na₂SO₄ drying, filtration and evaporation of the solvent, purification is carried out on an alumina column with eluent [cyclohexane/CH₂Cl₂: 6/4]. 1.05 g of final compound GB0040 is obtained in the form of an oil (yield of 64.2%).

¹H NMR (CDCl₃): 7.99 (d, 1H, J=9 Hz), 7.85 (d, 1H, J=7.6 Hz), 7.71 (dd, 1H, J1=7.6 Hz, J2=2 Hz), 7.40-7.26 (m, 6H), 7.18-7.01 (m, 8H), 2.75 (t, 2H, J=5.8 Hz), 1.78-1.63 (m, 2H), 1.44-1.19 (m, 10H), 0.87 (t, 3H, J=6.6 Hz)

III.7. Diethyl(1-cyano-2-(4-(7-(5-(4-(diphenylamino)phenyl)-4-octylthiophen-2-yl)benzo[c][1,2,5]thiadiazol-4-yl)phenyl)vinyl)phosphonate [YKP115]

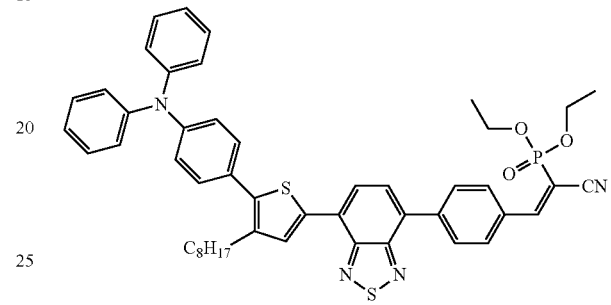

Another Knoevenagel condensation is carried out by introducing into a two-necked flask containing 15 mL of CH₃CN under an argon atmosphere, 155 mg (0.23 mmol) of GB041, 61 mg (0.34 mmol, 1.5 eq.) of diethylcyanomethyl phosphonate, several catalytic drops of pyridine. The whole is heated to reflux for 2 h. The acetonitrile is evaporated in a rotary evaporator and the whole is taken up in chloroform. The organic phase is washed with water, then dried over Na₂SO₄. After filtration and evaporation the crude product is purified on chromatography column on silica [eluent: CH₂Cl₂/Acetonitrile: 9/1] from which is obtained 145 mg of compound YKP115 (yield of 93.5%).

¹H NMR (CD₂O₂): 8.13 (dd, 4H), 8.08 (s, 1H), 8.03 (d, 1H, J=21 hz), 7.94 (d, 1H, J=7.52 Hz), 7.82 (d, 1H, J=7.54 Hz), 7.38 (dt, 2H, J=8.7 Hz), 7.28 (td, 4H), 7.13-7.04 (m, 7H), 4.18 (m, 4H), 2.75 (q, 2H), 1.7 (q, 2H), 1.39 (t, 6H), 1.25 (m, 10H), 0.85 (t, 3H) ³¹P(CD₂Cl₂) NMR: 12.34 (s)

III.8. (1-cyano-2-(4-(7-(5-(4-(diphenylamino)phenyl)-4-octylthiophen-2-yl)benzo[c][1,2,5]thiadiazol-4-yl)phenyl)vinyl)phosphonic acid [YKP126]

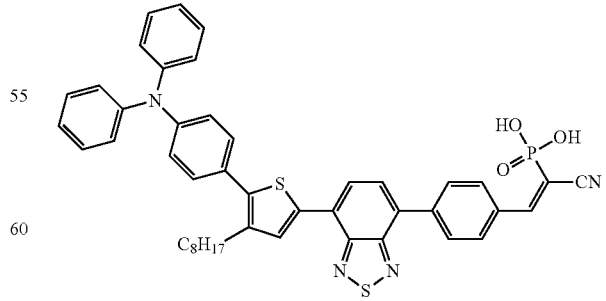

In a two-necked flask YKP115 is placed in 10 mL of CH₂Cl₂ under reflux for 30 min and BrSi(Me)₃ in large excess is added by injection and is left to reflux for 1 h. After cooling the dichloromethane is evaporated and separation is carried out using chromatography, THF-Methanol (9-1) as eluent. An orange-red solid is obtained.

III.9. 5-(7-(5-(4-(diphenylamino)phenyl)-4-octylthiophen-2-yl)benzo[c][1,2,5]thiadiazol-4-yl)-isophthalaldehyde [YKP120]

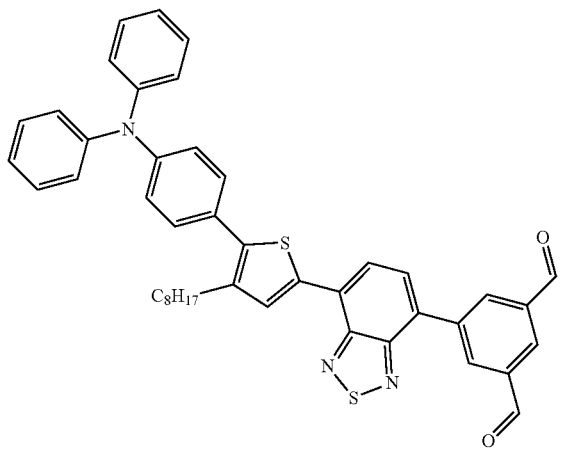

Into a two necked flask, are introduced 500 mg (0.766 mmol, 1 eq.) of bromine compound GB040 and 205 mg (1.15 mmol, 1.5 eq.) of 3,5-diformylphenylboronic acid in the presence of 3 eq. of $K_2CO_3$ and 44 mg (4% molar) of $Pd(PPh_3)_4$ in 35 mL of THF, 2.5 mL of water and 2 mL of toluene. The mixture is stirred for 14 h at 75° C. After treatment of the mixture with 100 mL of water, the aqueous phase is washed with 2×100 mL of ether. The organic phases are washed with 2×100 mL of saturated NaCl solution and dried on $Na_2SO_4$. After filtration and evaporation of the solvent, the purification is carried out on silica column with an eluent [hexane/ethyl ether: 8/2]. 416 mg of final red compound (yield of 76.93%) is obtained.
$^1$H NMR ($CD_2Cl_2$) 10.18 (s, 2H), 8.77 (d, 2H, J=1.53 Hz), 8.39 (t, 1H, J=1.53 Hz), 8.09 (s, 1H), 7.92 (dd, 2H, J1=7.53 Hz, J2=19.35 Hz), 7.39-7.23 (m, 6H), 7.13-7.00 (m, 8H), 2.74 (t, 2H, J=7.8 Hz), 1.69 (m, 2H), 1.45-1.19 (m, 10H), 0.83 (t, 3H, J=6.6 Hz)

III.10. (2E,2E')-3,3'-(5-(7-(5-(4-(diphenylamino)phenyl)-4-octylthiophen-2-yl)benzo[c][1,2,5]thiadiazol-4-yl)-1,3-phenylene)bis(2-cyanoacrylic) acid [YKP125]

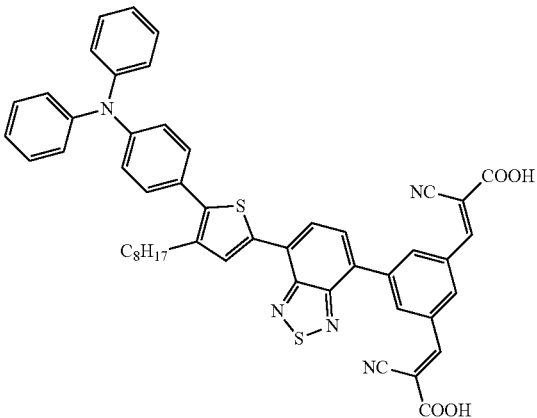

Into a two necked flask containing 20 mL of $CH_3CN$ under argon atmosphere, are introduced 150 mg (0.21 mmol) of YKP120, 200 mg (2.35 mmol, 11 eq.) of cyanoacetic acid, several catalytic drops of pyridine. The whole is heated to reflux for 2 h. The acetonitrile is evaporated in a rotary evaporator and the whole is taken up in ethyl ether. The organic phase is washed successively with a 2 mol·L$^{-1}$ HCl solution, with water, and then dried on $Na_2SO_4$. The desired product dissolves in minimum volume of THF and precipitates in pentane. After filtration and oven drying, 176.5 mg of the compound YKP125 is obtained in the form of a claret coloured solid (yield of 98.6%).
$^1$H NMR (DMSO): 14.05 (s, 2H), 8.85 (s, 2H), 8.46 (s, 1H), 8.41 (s, 2H), 8.16 (d, 1H, J=7.52 Hz), 8.09 (s, 1H), 9.98 (d, 1H, J=7.51 Hz), 7.41-7.29 (m, 6H), 7.11-6.99 (m, 8H), 2.74 (t, 2H, J=7.8 Hz), 1.69 (m, 2H), 1.45-1.19 (m, 10H), 0.83 (t, 3H, J=6.6 Hz)

IV. Preparation of the colorant GB062

IV.1. 5,5-dimethyl-2-(4-octylthiophen-2-yl)-1,3,2-dioxaborinane [GB036]

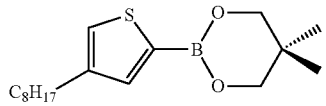

Under argon atmosphere, in a three necked flask 3 g (15.28 mmol, 1 eq.) of 3-octylthiophene are dissolved in 30 mL of THF. After having cooled the medium to −78° C., 12 mL (18.34 mmol, 1.2 eq., C=1.6 mol/L) of BuLi are added drop by drop. The reaction is stirred for 1 h at −50° C. Then 8 mL (30.56 mmol, 2 eq.) of tributylborate are added to the medium cooled beforehand to −78° C. The reaction remains under stirring for the following 2 h where the temperature rises to ambient temperature. The mixture is then hydrolysed with a 2 mol·L$^{-1}$ HCl solution and extracted with 2×50 mL of ethyl ether. During the drying of the organic phase collected on $Na_2SO_4$, 4.8 g (45.84 mmol, 3 eq.) of 2,2-dimethyl-1,3-propanediol are added. After 45 min of stirring, the mixture is filtered and concentrated in a rotary evaporator. The purification is carried out on silica column with an eluent [hexane/Et2O: 9/1]. 3.40 g of a yellow oil (yield of 72.0%) are obtained.
$^1$H NMR (CDCl$_3$): 7.40 (d, 1H, J=1.2 Hz), 7.15 (d, 1H, J=1.2 Hz), 3.75 (s, 4H), 2.61 (t, 2H, J=8 Hz), 1.68-1.52 (m, 2H), 1.40-1.20 (m, 10H), 1.02 (s, 6H), 0.88 (t, 3H, J=6.5 Hz).

IV.2. 4,7-bis(4-octylthiophen-2-yl)benzo[c][1,2,5]thiadiazole [GB051]

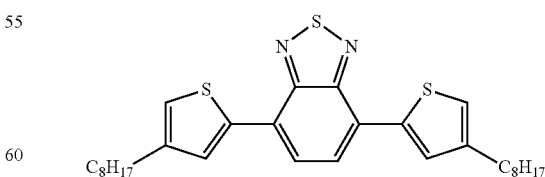

Under argon atmosphere, are dissolved in a three necked flask 1.99 g (6.45 mmol, 2.4 eq.) of GB036 and 790 mg (2.69 mmol, 1 eq.) of dibromobenzo[c][1,2,5]thiadiazole in the presence of 1.31 g (6.45 mmol, 2.4 eq.) of $K_3PO_4$ and 93.2 mg (3% molar) of $Pd(PPh_3)_4$ in 30 mL of anhydrous DMF. The mixture is stirred for 14 h at 75° C. After treatment of the mixture with 100 mL of water, the aqueous phase is washed with 2×100 mL of ether. The combined organic phases are then washed with 2×100 mL of saturated NaCl solution and dried on Na$_2$SO$_4$. After filtration and evaporation of the solvent, the purification is carried out on silica column with an eluent [hexane/CH$_2$Cl$_2$: 8/2]. At the end of this column, 233.4 mg of final compound (yield of 17.0%) are obtained.

In a variant, under argon atmosphere, are dissolved in a three necked flask 2.15 g (6.97 mmol, 2.2 eq.) of GB036 and 937 mg (3.18 mmol, 1 eq.) of dibromobenzo[c][1,2,5]thiadiazole in the presence of 1.5 g (6.45 mmol, 2.4 eq.) of K$_2$CO$_3$ and 185 mg (5% molar) of Pd(PPh$_3$)$_4$ in a mixture of 50 mL of THF, 10 mL of water and 15 mL of previously degassed toluene. The mixture is stirred for 14 h at 75° C. After treatment of the mixture with 100 mL of water, the aqueous phase is washed with 2×100 mL of ether. The combined organic phases are then washed with 2×100 mL of saturated NaCl solution and dried on Na$_2$SO$_4$. After filtration and evaporation of the solvent, the purification is carried out on silica column with an eluent [hexane/CH$_2$Cl$_2$: 8/2]. At the end of this column, 1.3 g of final compound (yield of 77.5%) is obtained $^1$H NMR (CD$_2$O$_2$): 8.08 (s, 1H), 8.07 (s, 1H), 7.93 (s, 2H), 7.15 (s, 1H), 7.14 (s, 1H), 2.79 (t, 4H, J=7.2 Hz), 1.88-1.73 (m, 4H), 1.53-1.34 (m, 20H), 0.98 (t, 6H, J=6.6 Hz).

IV.3. 4,7-bis(5-bromo-4-octylthiophen-2-yl)benzo[c][1,2,5]thiadiazole [GB054]

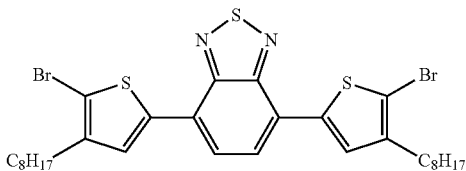

In a three necked flask under argon, are solubilised 238.2 mg (0.45 mmol, 1 eq.) of Synthon GB051 in 20 mL of DMF. At ambient temperature, a mixture of 177.9 mg (1.00 mmol, 2.2 eq.) of N-bromosuccinimide and 10 mL of DMF is added drop by drop. The mixture is then left under stirring for 24 h. The medium is then hydrolysed with a 1 mol·L$^{-1}$ HCl solution and extracted with ethyl ether. The combined organic phases are washed with a saturated NaCl solution then dried on anhydrous Na$_2$SO$_4$. After filtration and evaporation of the solvent, the purification is carried out on silica column with the eluent [hexane]. 219.8 mg of a red solid (yield of 71.0%) are obtained.

In a variant in a three-necked flask under argon, are solubilised 2 g (3.83 mmol, 1 eq.) of the synthon GB051 in 50 mL of CHCl$_3$. At ambient temperature, a mixture of 177.9 mg (1.00 mmol, 2.2 eq.) of N-bromosuccinimide and of 50 mL of CHCl$_3$ is added drop-wise. The mixture is then left under stirring for 24 h. The medium is then hydrolysed with a 1 mol·L$^{-1}$ HCl solution and extracted with ethyl ether. The combined organic phases are washed with a saturated NaCl solution then dried on anhydrous Na$_2$SO$_4$. After filtration and evaporation of the solvent, the purification is carried out on silica column with the eluent [hexane]. 2.60 g of a red solid (yield of 99.2%) are obtained.

$^1$H NMR (CDCl$_3$): 7.77 (s, 2H), 7.75 (s, 2H), 2.64 (t, 4H, J=7.2 Hz), 1.73-1.59 (m, 4H),

IV.4. 4,7-bis(3-octyl-[2,2'-bithiophen]-5-yl)benzo[c][1,2,5]thiadiazole [GB055]

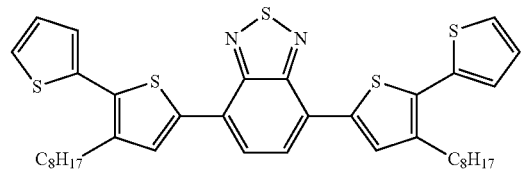

Under argon atmosphere, in a three necked flask are dissolved 217.3 mg (0.32 mmol, 1 eq.) of GB054 and 97.4 mg (0.76 mmol, 2.4 eq.) of 2-thiophenboronic acid in the presence of 155.3 mg (0.76 mmol, 2.4 eq.) of K$_3$PO$_4$ and 15 mg (4% molar) of Pd(PPh$_3$)$_4$ in 30 mL of anhydrous DMF. The mixture is stirred for 14 h at 75° C. After treatment of the mixture with 100 mL of water, the aqueous phase is washed with 2×100 mL of ether. The combined organic phases are then washed with 2×100 mL of saturated NaCl solution and dried on Na$_2$SO$_4$. After filtration and evaporation of the solvent, the purification is carried out on silica column with an eluent [hexane/CH$_2$Cl$_2$: 8/2]. At the end of this column, 50.2 mg of pink powder (yield of 23.0%) are obtained.

In a variant, under argon atmosphere, in a three necked flask are dissolved 1.90 g (2.78 mmol, 1 eq.) of GB054 and 747 mg (5.85 mmol, 2.2 eq.) of 2-thipheneboronic acid in the presence of 1.09 g (7.88 mmol, 3 eq.) of K$_2$CO$_3$ and 153 mg (5% molar) of Pd(PPh$_3$)$_4$ in 50 mL of THF and 5 ml of degassed water. The mixture is stirred for 14 h at 75° C. After treatment of the mixture with 100 mL of water, the aqueous phase is washed with 2×100 mL of ether. The combined organic phases are then washed with 2×100 mL of saturated NaCl solution and dried on Na$_2$SO$_4$. After filtration and evaporation of the solvent, the purification is carried out on silica column with an eluent [cyclohexane/CHCl$_3$: 95/5]. At the end of this column, 790 mg of pink powder (yield of 43.5%) are obtained.

$^1$H NMR (CDCl$_3$): 7.99 (s, 2H), 7.83 (s, 2H), 7.36 (dd, 2H, J$_1$=5 Hz, J$_2$=1.2 Hz), 7.25 (dd, 2H, J$_1$=3.6 Hz, J$_2$=1.2 Hz), 7.13 (dd, 2H, J$_1$=5.2 Hz, J$_2$=3.6 Hz), 2.85 (t, 4H, J=7.2 Hz), 1.83-1.55 (m, 4H), 1.47-1.21 (m, 20H), 0.88 (t, 6H, J=6.6 Hz).

IV.5. 4,7-bis(5'-bromo-3-octyl-[2,2'-bithiophen]-5-yl)benzo[c][1,2,5]thiadiazole [GB056]

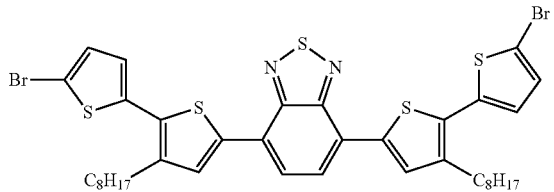

In a three necked flask under argon, 50.2 mg (0.07 mmol, 1 eq.) of the synthon GB055 are solubilised in 20 mL of DMF (or of CDCl$_3$). At ambient temperature, a mixture of 27.2 mg (0.15 mmol, 2.1 eq.) of N-bromosuccinimide and of 10 mL of DMF (or of CDCl$_3$) is added drop by drop. The mixture is then left under stirring for 4 h. The medium is then hydrolysed with a 1 mol·L$^{-1}$ HCl solution and extracted with ethyl ether. The combined organic phases are washed with a saturated NaCl solution then dried on anhydrous Na$_2$SO$_4$. After filtration and evaporation of the solvent, the purification is carried out on silica column with the eluent [hexane/CH$_2$Cl$_2$: 95/5]. 56.8 mg of a claret solid (yield of 92.0%) are obtained.

$^1$H NMR (CDCl$_3$): 7.95 (s, 2H), 7.81 (s, 2H), 7.05 (d, 2H, J=3.8 Hz), 6.97 (d, 2H, J=3.8 Hz), 2.79 (t, 4H, J=7.8 Hz), 1.78-1.64 (m, 4H), 1.48-1.21 (m, 20H), 0.89 (t, 6H, J=6.6 Hz).

IV.6. 4-(5'-(7-(5'-bromo-3-octyl-[2,2'-bithiophen]-5-yl)benzo[c][1,2,5]thiadiazol-4-yl)-3'-octyl-[2,2'-bithiophen]-5-yl)-N,N'-diphenylaniline [GB060]

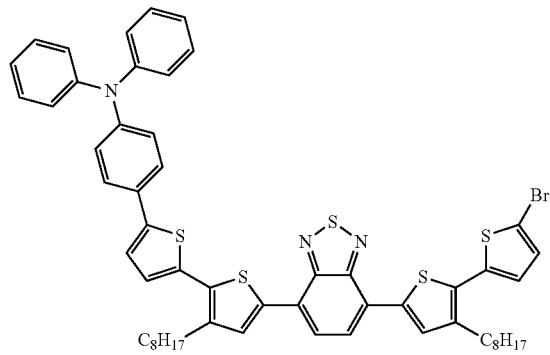

Into a three necked flask under argon atmosphere, are introduced 70 mg (0.19 mmol, 1.1 eq.) of 4-(diphenylamino)phenylboronic and 151.1 mg (0.18 mmol, 1 eq.) of GB056 in the presence of 40 mg (1.1 eq.) of K$_3$PO$_4$ and 8 mg (4% molar) of Pd(PPh$_3$)$_4$ in 30 mL of a mixture [DMF/toluene:2/1]. The whole is stirred for 14 h at 75° C. After treatment of the mixture with 100 mL of water, the aqueous phase is washed with 2×100 mL of ether. The organic phases are washed with 2×100 mL of saturated NaCl solution and dried on Na$_2$SO$_4$. After filtration and evaporation of the solvent, the purification is carried out on silica column with an eluent [hexane/CH$_2$Cl$_2$: 8/2]. 42.3 mg of final compound GB060 (yield of 23.5%) are obtained.

In a variant, in a three necked flask under argon atmosphere, are dissolved 500 mg (0.59 mmol, 1 eq.) of GB056, 245 mg (3 eq.) of K$_2$CO$_3$ and 35 mg (5% molar) of Pd(PPh$_3$)$_4$ in 30 mL of THF and 5 mL of degassed water. After 30 min of stirring at 60° C., 190 mg (0.53 mmol, 0.9 eq.) of 4-(diphenylamino)phenylboronic dissolved in 20 mL of THF are added. The whole is stirred for 14 h at 75° C. After treatment of the mixture with 100 mL of water, the aqueous phase is washed with 2×100 mL of ether. The organic phases are washed with 2×100 mL of saturated NaCl solution and dried on Na$_2$SO$_4$. After filtration and evaporation of the solvent, the purification is carried out on silica column with an eluent [cyclohexane/CHCl$_3$: 8/2]. 242 mg of final compound (yield of 40.6%) are obtained.

$^1$H NMR (CDCl$_3$): 7.97 (d, 2H), 7.84 (s, 2H), 7.49 (dt, 2H), 7.31-7.17 (m, 7H), 7.12-6.97 (m, 9H), 2.82 (m, 4H), 1.70 (m, 4H), 1.48-1.21 (m, 20H), 0.86 (t, 6H).

IV.7. 4-(5'-(7-(5'-(4-(diphenylamino)phenyl)-3-octyl-[2,2'-bithiophen]-5-yl)benzo[c][1,2,5]thiadiazol-4-yl)-3'-octyl-[2,2'-bithiophen]-5-yl)benzaldehyde [GB061]

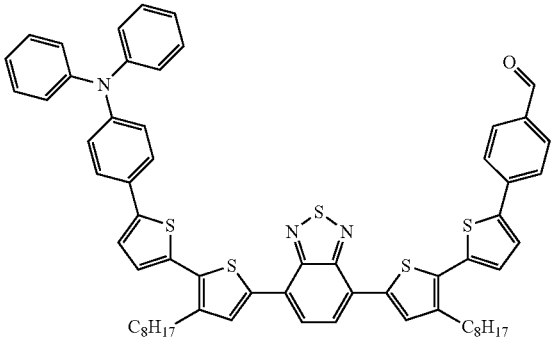

Into a three necked flask under argon atmosphere, are introduced 22 mg (0.147 mmol, 1.5 eq.) of 4-formylphenylboronic acid and 97.9 mg (0.097 mmol, 1 eq.) of GB060 in the presence of 1 mL of a solution of K$_2$CO$_3$ (2 mol/L), 1 mL of ethanol and 4 mg (4% molar) of Pd(PPh$_3$)$_4$ in 20 mL of THF. The whole is stirred for 14 h at 75° C. After treatment of the mixture with 100 mL of water, the aqueous phase is washed with 2×100 mL of ether. The organic phases are washed with 2×100 mL of saturated NaCl solution and dried on Na$_2$SO$_4$. After filtration and evaporation of the solvent, the purification is carried out on silica column with an eluent [hexane/CH$_2$Cl$_2$: 5/2]. 92.1 mg of final compound GB061 (yield of 92%) are obtained.

In a variant, into a three necked flask under argon atmosphere, are introduced 53.4 mg (0.356 mmol, 1.5 eq.) of 4-formylphenylboronic acid and 240 mg (0.237 mmol, 1 eq.) of GB060 in the presence of 98 mg (3 eq.) of K$_2$CO$_3$. The whole is dissolved in a mixture, which is degassed beforehand, of 2.5 mL water and 25 mL of THF. After 30 min of stirring at 60° C. 13.7 mg (5% molar) of Pd(PPh$_3$)$_4$ is added to the reaction medium. The whole is stirred for 14 h at 75° C. After treatment of the mixture with 100 mL of water, the aqueous phase is washed with 2×100 mL of ether. The organic phases are washed with 2×100 mL of saturated NaCl solution and dried on Na$_2$SO$_4$. After filtration and evaporation of the solvent, the purification is carried out on silica column with an eluent [cyclohexane/CH$_2$Cl$_2$: 6/4]. 240 mg of final compound GB061 (yield of 97.7%) are obtained.

$^1$H NMR (CD$_2$Cl$_2$): 9.84 (s, 1H), 7.86-7.65 (m, 6H) 7.37 (m, 4H), 7.35-6.91 (m, 16H), 2.72 (m, 4H), 1.63 (m, 4H), 1.48-1.21 (m, 20H), 0.77 (t, 6H)

IV.8. 2-cyano-3-(4-(5'-(7-(5'-(4-(diphenylamino)phenyl)-3-octyl-[2,2'-bithiophen]-5-yl)benzo[c][1,2,5]thiadiazol-4-yl)-3'-octyl-[2,2'-bithiophen]-5-yl)phenyl)acrylic acid [GB062]

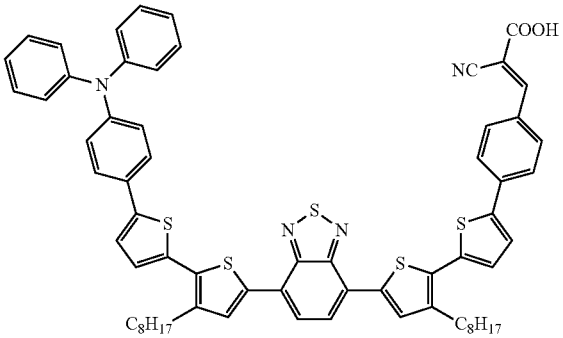

Into a three necked flask containing 20 mL of mixture [CH$_3$CN/CHCl$_3$: 1/1] under argon atmosphere, are introduced 92.1 mg (0.089 mmol) of GB061, 15 mg (0.178 mmol, 2 eq.) of cyanoacetic acid and several catalytic drops of pyridine. The whole is heated to reflux for 4 h. The acetonitrile is evaporated under reduced pressure and the whole is taken up in chloroform. The organic phase is washed successively with a 2 mol·L$^{-1}$ HCl solution, with water, then dried on Na$_2$SO$_4$. The desired product precipitates in a mixture of hexane and petroleum ether. After filtration, washing with pentane and oven drying, 58 mg of the compound GB062 are obtained in the form of a black powder (yield of 60.0%).

In a variant, into a two necked flask containing 30 mL of CH$_3$CN, under argon atmosphere, are introduced 210 mg (0.20 mmol) of GB061, 26 mg (0.30 mmol, 1.5 eq.) of cyanoacetic acid and several catalytic drops of pyridine. The whole is heated to reflux for 2 h. The acetonitrile is evaporated using a rotary evaporator and the whole is taken up in chloroform. The organic phase is washed successively with a 2 M HCl solution, with water, and then dried on Na$_2$SO$_4$. After a chromatography column on silica with eluent [THF/MeOH: 9/1] the compound GB062 is obtained in the form of a black-violet powder (yield of 78.25%).

$^1$H NMR (CDCl$_3$): 7.88-8.10 (m, 6H), 7.76 (d, 2H, J=8 Hz), 7.50-7.65 (m, 3H, j=7.6 Hz), 7.20-7.40 (m, 8H, J=7.6 Hz and 3.05 Hz), 6.90-7.13 (m, 8H, J=8.2 Hz), 6.90-7.13 (m, 8H, J=8.2 Hz), 3.1 (s, br, 1H), 1.60-1.75 (m, 4H), 1.21-1.50 (m, 20H); 0.71-0.95 (m, 6H).

V. Preparation of the Colorant YKP73

V.1. 3-(4-octylphenyl)thiophene [YKP67]

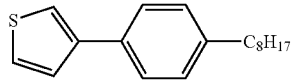

Into a three necked flask under argon atmosphere, are introduced 4.49 g (0.097 mmol, 1.1 eq.) of 4-bromo-octylbenzene in the presence of 6.5 g of K$_2$CO$_3$ (3 eq.), 20 mL of toluene, 1 mL of water and 4 mg (4% molar) of Pd(PPh$_3$)$_3$ freshly synthesised according to the protocol described hereafter. The whole is stirred for 30 min at 60° C. After having dissolved 2 g (15.63 mmol, 1 eq.) of 3-thiophene-boronic acid in 10 mL of toluene, the solution obtained is incorporated drop by drop into the reaction mixture. The whole is stirred for 12 h at 110° C. After returning to ambient temperature, the contents of the flask are poured into 100 mL of water. The organic phase is extracted with 2×100 mL of ether. The combined organic phases are washed respectively with water and with 2×100 mL of saturated NaCl solution. After drying on Na$_2$SO$_4$, filtration and evaporation of the solvent, the purification is carried out on silica column with hexane. 1.61 g of white crystals of final compound YKP67 (yield of 40%) are obtained.

$^1$H NMR (CDCl$_3$): 7.56 (dt, 2H, J=8.3 Hz, J=1.9 Hz), 7.41-7.47 (m, 3H), 7.26 (dt, 2H, J=8.3 Hz, J=1.9 Hz), 2.10 (t, 2H), 1.69 (m, 2H, J=7.8 Hz), 1.33 (m, 10H), 0.94 (t, 3H).

The catalyst: 5% molar Pd(PPh$_3$)$_3$.

The catalyst is synthesised by reaction of tri(phenyl)phosphine (PPh$_3$) on palladium acetate II (Pd(OAc)$_2$). Into a two necked flask, are introduced 175 mg (1 eq.) of Pd(OAc)$_2$ and 205 mg (4 eq.) of PPh$_3$. Under argon, 10 mL of anhydrous THF are added and the whole is heated to the temperature of 60° C. for 30 min. The catalyst Pd(PPh$_3$)$_3$ of chick yellow colour is then obtained ready to be injected into the reaction medium.

V.2. 2-bromo-3-(4-octylphenyl)thiophene [YKP69]

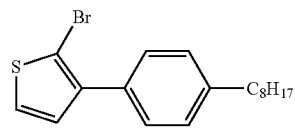

In a three necked flask under argon, 1.40 g (5.14 mmol) of YKP67 in 40 mL of DMF are cooled to 0° C. 915 mg (5.14 mmol, 1 eq.) of N-bromosuccinimide are solubilised in 20 mL of mixture [DMF/MeOH: 1/1]. This solution of NBS (protected from light) is then added drop by drop (30 min) into the reaction medium. The temperature of the medium is then left to rise to ambient temperature over 2 h. The medium is hydrolysed with a 1 mol·L$^{-1}$ HCL solution and extracted with ethyl ether. The combined organic phases are washed with a saturated NaCl solution then dried on anhydrous Na$_2$SO$_4$. After drying on Na$_2$SO$_4$, filtration and evaporation of the solvent, the purification is carried out on silica column with cyclohexane. 1.58 g of final compound YKP69 in the form of a translucent oil (yield of 85.7%) are obtained.

$^1$H NMR (CDCl$_3$): 7.51 (dt, 2H), 7.34 (d, 1H, J=0.69 Hz), 7.32 (d, 1H, J=0.69 Hz), 7.07 (dt, 2H), 2.68 (t, 2H), 1.35 (m, 2H), 1.33 (m, 10H), 0.94 (t, 3H).

V.3. 4-(2-(3-(4-octylphenyl)thiophen-2-yl) vinyl)-N,N-diphenylaniline [YKP70]

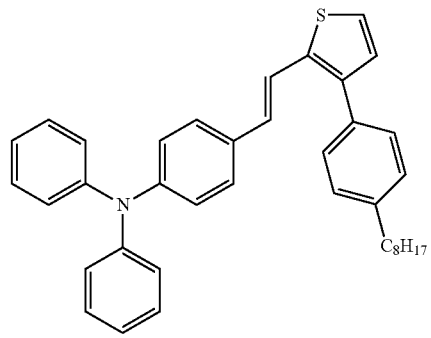

In a three necked flask under argon, are introduced, in successive order, 1.20 g (3.41 mmol, 1 eq.) of YKP69, 34 mg (1%) of the catalyst trans-di(μ-acetato)bis[o-(di-o-tolylphosphino)benzyl] dipalladium(II), 159 mg (20%) of 2,6-di-tert-butylcresol and 795 mg (2.2 eq.) of sodium carbonate. The whole, after dissolution in 25 mL of previously degassed DMAC, is heated to 90° C. A solution of 15 mL of DMAC containing 1.855 g (6.86 mmol, 2 eq.) of YKP21 is added drop by drop to the mixture. After the addition, the whole is heated to 140° C. and stirred for 24 h. The next day after cooling, the contents of the three necked flask are added to 200 mL of mixture of [CH$_2$Cl$_2$/water: 50/50]. The organic phase is washed successively with a 2 mol·L−1 HCl solution, with water, with a saturated NaCl solution then dried on Na$_2$SO$_4$. After filtration and evaporation, the crude product is purified on chromatography column on alumina with hexane. After this Heck reaction, 1.47 g of the compound YKP70 are obtained in the form of a yellow viscous solid (yield of 79.0%).

$^1$H NMR (CDCl$_3$): 7.27-7.45 (m, 13H), 6.99-7.25 (m, 9H), 2.68 (t, 2H), 1.69 (m, 2H), 1.30 (m, 10H), 0.91 (t, 3H).

V.4. 4-(2-(5-bromo-3-(4-octylphenyl)thiophen-2-yl)vinyl)-N,N-diphenylaniline [YKP72]

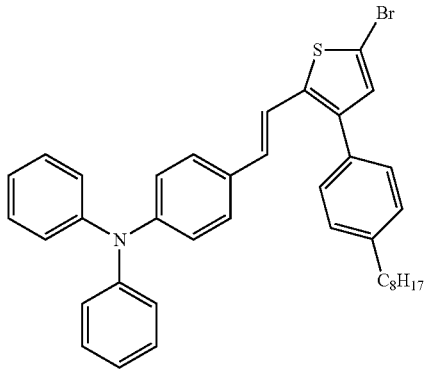

In a three necked flask under argon, 1.00 g (1.85 mmol, 1 eq.) of YKP70 in 20 mL of DMF are cooled to −10° C. 328 mg (1.85 mmol, 1 eq.) of N-bromosuccinimide are solubilised in 10 mL of mixture [DMF/MeOH:1/1]. This solution of NBS (protected from light) is then added drop by drop (30 min) into the reaction medium. The temperature of the medium is then left to rise to ambient temperature over 2 h. The medium is hydrolysed with a 1 mol·L$^{-1}$ HCl solution and extracted with ethyl ether. The combined organic phases are washed with a saturated NaCl solution then dried on anhydrous Na$_2$SO$_4$. After drying on Na$_2$SO$_4$, filtration and evaporation of the solvent, the purification is carried out on neutral alumina column with the eluent [hexane/CHCl$_3$: 100/1]. 742 mg of final compound YKP69 are obtained in the form of a translucent oil (yield of 64.6%).

$^1$H NMR (AcetoneD): 7.25-7.48 (m, 12H), 6.92-7.18 (m, 9H), 2.70 (t, 2H), 1.69 (m, 2H), 1.32 (m, 10H), 0.90 (t, 3H.)

V.5. 4-(5-(4-(diphenylamino)styryl)-4-(4-octyl phenyl)thiophen-2-yl)benzaldehyde [YKP73]

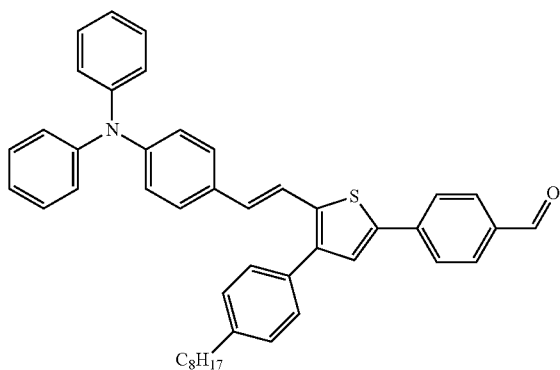

Into a three necked flask under argon atmosphere, are introduced 740 mg (1.19 mmol, 1.1 eq.) of YKP72 in the presence of 824 mg of K$_2$CO$_3$ (5 eq.), 20 mL of toluene, 1 mL of water and 48 mg (5% molar) of Pd(PPh$_3$)$_4$. The whole is stirred for 30 min at 60° C. After having dissolved 270 g (1.79 mmol, 1.5 eq.) of 4-formylphenylboronic acid in 10 mL of toluene, said solution is incorporated drop by drop into the reaction mixture. The whole is stirred for 12 h at 90° C. After a return to ambient temperature, the contents of the flask are poured into 100 mL of water. The organic phase is extracted with 2×100 mL of ether. The combined organic phases are washed respectively with water and with 2×100 mL of saturated NaCl solution. After drying on Na$_2$SO$_4$, filtration and evaporation of the solvent, the purification is carried out on alumina column with the eluent [cyclohexane/Et$_2$O: 98/2]. The final compound YKP73 is obtained in the form of crystals of lemon yellow colour recrystallized beforehand in pentane (yield 63.5%).

$^1$H NMR (CD$_2$Cl$_2$): 10.07 (s, 1H), 7.97 (dt, 2H), 7.81 (dt, 2H), 7.63 (dt, 2H), 7.27-7.45 (m, 9H), 6.99-7.25 (m, 10H), 2.70 (t, 2H), 1.70 (m, 2H), 1.33 (m, 10H), 0.93 (t, 3H).

V.6. 2-cyano-3-(4-(5-(4-(diphenylamino) styryl)-4-(4-octylphenyl)thiophen-2-yl)phenyl)acrylic acid [YKP79]

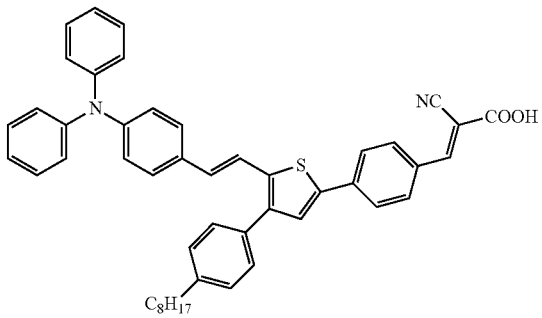

Into a three necked flask containing 10 mL of a mixture of CH$_3$CN under argon atmosphere, are introduced 80.0 mg (0.124 mmol, 1 eq.) of YKP73, 13 mg (0.148 mmol, 1.2 eq.) of cyanoacetic acid and several catalytic drops of pyridine. The whole is heated to reflux for 2 h. Then, the CH$_3$CN is evaporated in a rotary evaporator and the whole is taken up with CHCl$_3$. The organic phase is washed successively with a 2 mol·L$^{-1}$ HCl solution, with water, then dried on Na$_2$SO$_4$. The desired product precipitates in a mixture of hexane and petroleum ether. After filtration, washing with pentane and oven drying, 79 mg of the compound YKP73 is obtained in the form of a red solid (yield of 89.4%).

VI. Preparation of Indacenothiophene Units for the Synthesis of Colorants

VI.1. Diethyl 2,5-di(thiophen-2-yl)terephthalate (1)

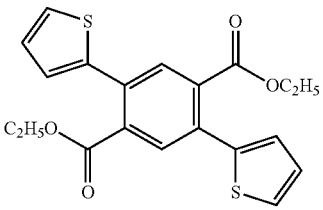

Diethyl 2,5-dibromoterephthalate (4.27 g, 11.24 mmol) and 2-thienylzinc bromide (0.5 M in THF, 50 ml, 25 mmol) are introduced into a two necked flask. The catalyst palladium tetrakis(triphenylphosphine) (Pd(PPh$_3$)$_4$) is then introduced into the two necked flask. The mixture thereby obtained is heated to reflux (70° C.) for 3 h. After a return to ambient temperature, the reaction mixture is poured into a saturated solution of NH$_4$Cl. The product is extracted with ethyl acetate (3×100 ml). The extracts are combined and washed with water then dried on Na$_2$SO$_4$. After filtration, the solvent is removed under reduced pressure. The crude product is purified on chromatography column (silica gel, hexane/dichloromethane, 10:1, v/v)) to provide a white solid (3.5 g, 80%).

MW: 386.48 g/mol $^1$H NMR (CDCl$_3$): 7.82 (s, 2H), 7.40 (dd, J=4.4 and 1.9 Hz, 2H), 7.09-7.05 (m, 4H), 4.24 (q, J=7.2 Hz), 1.15 (t, J=7.2 Hz).

VI.2. Compound (2)

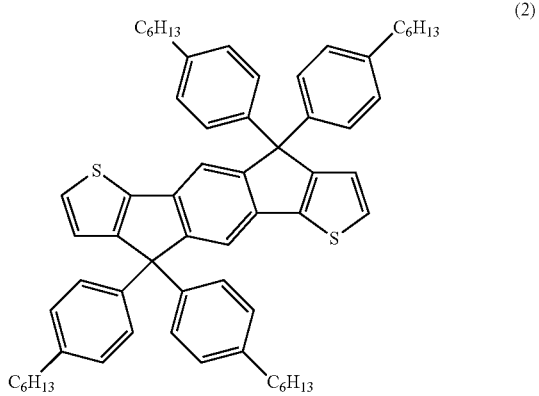

(2)

1-bromo-4-hexylbenzene (3 g, 12.5 mmol) is dissolved in 15 ml of freshly distilled THF and cooled to −78° C. under argon atmosphere before addition drop by drop of a solution of n-butyl lithium (n-BuLi) (1.6 M in hexane, 8 ml, 12.5 mmol). The mixture is vigorously stirred for 1 h at −50° C. before the addition of diethyl 2,5-di(thiophen-2-yl)terephthalate (1) (1 g, 2.6 mmol) dissolved in 10 ml of distilled THF. After complete addition, the mixture is left to return to ambient temperature then is vigorously stirred overnight. The reaction is stopped with 100 ml of water then the product is extracted with ethyl acetate (3×50 ml) and dried on Na$_2$SO$_4$. After removal of the solvent, brown solids are obtained. The crude product is placed in a 250 ml two necked flask and dissolved in 50 ml of acetic acid. 1 ml of concentrated H$_2$SO$_4$ is added to the solution and rapid changes of colour from yellow to violet then to green are observed. The mixture is heated to reflux for 2 h. After 2 h, the colour turns to yellow and the solution is poured into water. The product is extracted with ethyl acetate. After evaporation of the solvent, the crude product is further purified on chromatography column (silica gel, hexane/dichloromethane, 10:1, v/v)). A brown solid is obtained (2.08 g, 74%).

MW: 907.4 g/mol $^1$H NMR (CDCl$_3$): 7.42 (2H, s), 7.24 (2H, d, J=4.2 Hz), 7.174 (2H, d, J=8.2 Hz), 7.064 (2H, d, J=8.2 Hz), 7.006 (2H, d, J=4.2 Hz), 2.586 (4H, t, J=7.3 Hz), 1.543 (8H, m), 1.281 (32H, m), 0.871 (t, 12H)

VI.3. Compound (3)

(3)

To a solution of (2) (500 mg, 0.55 mmol) in THF (30 ml) maintained at −78° C., is added drop by drop a solution of n-BuLi (1.6 M in hexane, 0.75 ml, 1.2 mmol). The mixture obtained is vigorously stirred for 1 h at −50° C. before adding ClSnMe$_3$ (255 mg, 1.28 mmol) dissolved in 3 ml of THF at −78° C. The mixture is brought to ambient temperature and left to react overnight. The reaction in the resulting solution is then stopped with water and the product is extracted with hexane. The organic phase is dried on Na$_2$SO$_4$ and the solvent is evaporated. A brown solid is obtained without other purification (535 mg, 79%, mono-stannic).

MW 1070.21 g/mol $^1$H NMR (CDCl$_3$): 7.408 (1H, s), 7.400 (1H, s), 7.247 (1H, d, J=2.6 Hz), 7.222 (1H, d, J=2.6 Hz), 7.163 (8H, d, J=8.3 Hz), 7.051 (8H, d, J=9.3 Hz), 6.979 (1H, s), 2.583 (4H, t, J=7.3 Hz), 1.576 (8H, m), 1.276 (32H, m), 0.869 (t, 12H), 0.338 (9H, t)

VI.4. Compound (4)

(4)

To a solution of (3) (500 mg) in DMF (30 mL), is added triphenylamine bromide (1 eq.), 2% molar Pd(PPh$_3$)$_4$ and K$_3$PO$_4$ (1 eq.), the mixture is heated overnight at 110° C. The mixture is then left to reach ambient temperature. The reaction in the resulting solution is stopped with water and the product is extracted with dichloromethane. The organic phase is dried on Na$_2$SO$_4$ and the solvent is evaporated. A brown solid is obtained and the crude product is purified on a chromatography column to obtain the compound (4) (30%).

VI.5. 3-octyl-5-trimethylstannylthiophene

To a stirred solution of 3-octylthiophene (7.50 g, 38.19 mmol) in 100 mL of freshly distilled THF at −78° C., is added drop by drop a solution of n-BuLi (2.5 M, 16.8 mL, 42 mmol). The resulting solution is stirred for 45 min and cooled to −50° C. The mixture is cooled to −78° C. and ClSnMe$_3$ (8.40 g, 42 mmol) dissolved in 20 mL of THF is rapidly added. The resulting mixture is brought to ambient temperature over 80 min and is then poured into water and extracted with diethyl ether. The organic extracts are washed with a saturated aqueous solution of $NH_4Cl$. After drying and filtration, the filtrate is concentrated under reduced pressure to give 13.8 g of an organostannane. Due to the high toxicity of this compound, the crude product is only assayed (90% purity) by NMR and used without other purification.

$^1$H NMR ($CDCl_3$): 7.20 (d, J=0.8 Hz, 1H), 7.01 (d, J=0.8 Hz, 1H), 2.64 (t, 3J=7.4 Hz, 2H), 1.62 (tbr, 2H), 1.35-1.25 (m, 10H), 0.88 (t, 3J=6.8 Hz, 3H), 0.35 (s, 9H).

VI.6. Diethyl-2,5-bis[4'-octylthien-2'-yl]-1,4-benzenedicarboxylate

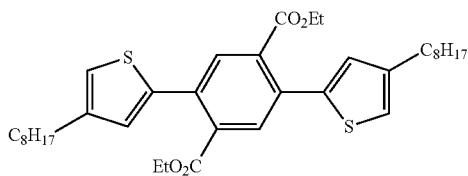

Diethyl-2,5-dibromo-1,4-benzenedicarboxylate (2.50 g, 6.57 mmol) and 3-octyl-5-trimethylstannylthiophene (7.20 g, 18.94 mmol) are dissolved in anhydrous DMF (75 mL) and the resulting mixture is purged for 10 min with argon. Separately, $Pd(OAc)_2$ (0.15 g, 0.66 mmol) and $PPh_3$ (0.70 g, 2.65 mmol) are placed in 5 mL of freshly distilled THF and stirred 10 min under argon. After the formation of a yellow precipitate, the catalyst is transferred into the solution of DMF and the mixture is heated to 100° C. overnight. The mixture is then filtered through Celite and the DMF is removed under reduced pressure. The crude product is purified on chromatography column (silica gel, hexane/$CH_2Cl_2$, 7:3) to obtain 3.85 g (98%) of a transparent oil.

$^1$H NMR ($CDCl_3$): 7.76 (s, 2H), 6.96 (d, 4J=1.4 Hz, 2H), 6.91 (d, 4J=1.4 Hz, 2H), 4.21 (q, 3J=7.1 Hz, 4H, $OCH_2$), 2.60 (t, 3J=8.0 Hz, 4H), 1.65-1.55 (m, 4H), 1.45-1.25 (m, 20H), 1.16 (t, 3J=7.1 Hz, 6H, $OCH_2CH_3$), 0.92-0.85 (m, 6H).

Elementary analysis, found (calculated): C, 70.51 (70.78); H, 8.19 (8.25).

VI.7. 2,5-bis[4'-octylthien-2'-yl]-1,4-benzene-dicarboxylate (FL46)

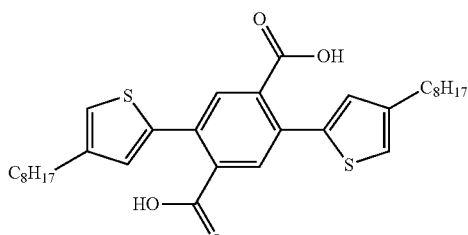

Elementary analysis, found (calculated): C, 69.35 (69.28); H, 7.50 (7.63).

VI.8. 3,8-dioctyl-4,9-dihydro-s-indaceno[1,2-b:5,6-b']dithiophene-4,9-dione (FL127 or FL51)

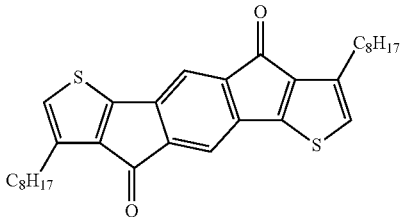

2,5-bis[4'-octylthien-2'-yl]-1,4-benzene-dicarboxylate (1.0 g, 1.80 mmol) is dissolved in 70 mL of anhydrous $CH_2Cl_2$ under argon. Then, oxalyl chloride (1.80 mL, 20.5 mmol) and 0.40 mL of DMF are added and the mixture is stirred for 12 h at ambient temperature. The solvent is removed under reduced pressure to obtain 2,5-bis[4'-octylthien-2'-yl]-1,4-benzenedicarboxylic acid dichloride, which is used without further purification. The product is then dissolved in 80 mL of anhydrous $CH_2Cl_2$ under argon, then cooled to 0° C. and a suspension of $AlCl_3$ (0.72 g, 5.41 mmol) in 80 mL of anhydrous $CH_2Cl_2$ is added drop by drop. The mixture is maintained at 0° C. for 30 min and is then brought to ambient temperature. After stirring for 3 h at ambient temperature, the reaction mixture is poured into iced water and 1 M hydrochloric acid, then extracted in chloroform. The organic layer is washed with water, dried on $Na_2SO_4$, filtered and concentrated under reduced pressure on a chromatography column (silica gel, hexane/$CHCl_3$, 7:3) to obtain 0.78 g of a blue solid (84%).

$^1$H NMR ($CDCl_3$, 200 MHz): 7.18 (s, 2H), 6.79 (s, 2H), 2.71 (t, $^3$J=7.3 Hz, 4H), 1.69-1.62 (m, $^3$J=7.3 Hz, 4H), 1.40-1.26 (m, 20H), 0.92-0.84 (m, 6H).

$^{13}$C NMR ($CDCl_3$, 50 MHz): 189.07 (2C=O), 161.15 (2C), 143.85 (2C), 143.54 (2C), 142.49 (2C), 142.38 (2C), 127.57 (2C), 117.09 (2C), 34.75 (2C), 32.28 (2C), 32.24 (2C), 32.20 (2C), 32.10 (2C), 31.28 (2C), 25.55 (2C), 17.02 (2C).

Elementary analysis, found (calculated): C, 73.95 (74.09); H, 7.33 (7.38).

VI.9. 2,7-dibromo-3,8-dioctyl-4,9-dihydro-s-indaceno[1,2-b:5,6-b']dithiophene-4,9-dione (FL128)

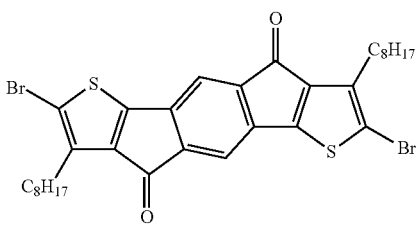

To a solution of 3,8-dioctyl-4,9-dihydro-s-indaceno[1,2-b:5,6-b']dithiophene-4,9-dione (1.0 g, 1.92 mmol) in 30 mL of $CHCl_3$ and 30 mL of acetic acid (ACOH), is added N-Bromosuccinimide (1.04 g, 2.92 mmol) in small quantities over a period of 15 min. The reaction mixture is stirred for 10 h at ambient temperature and then it is poured into water and extracted with $CHCl_3$. The organic layer is washed with $NaHCO_3$ and dried on $Na_2SO_4$. The crude product is concentrated under reduced pressure and precipitated from hexane. The filtrate is washed with methanol and acetone and then dried under vacuum to give 1.26 g of a blue solid (97%).

$^1$H NMR ($CDCl_3$, 200 MHz): 7.14 (s, 2H), 2.71 (t, $^3J$=7.0 Hz, 4H), 2.61 (t, $^3J$=7.3 Hz, 4H), 1.67-1.50 (m, 4H), 1.25-1.10 (m, 20H), 0.95-0.85 (m, 6H).

$^{13}$C NMR ($CDCl_3$, 50 MHz): 185.28 (2C=O), 156.45 (2C), 139.83 (2C), 139.66 (4C), 138.18 (2C), 114.64 (2C), 113.64 (2C), 32.06 (2C), 29.50 (2C), 29.42 (2C), 29.37 (2C), 29.07 (2C), 27.46 (2C), 22.87 (2C), 14.36 (2C).

VI.10. 2,7-bis(4-octylthien-2-yl)-3,8-dioctyl-4,9-dihydro-s-indaceno[1,2-b:5,6-b']dithiophene-4,9-dione (FL136)

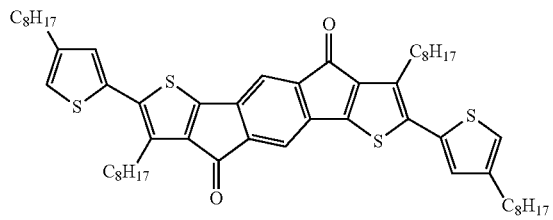

(FL136)

This product is synthesised from 2,7-dibromo-3,8-dioctyl-4,9-dihydro-s-indaceno[1,2-b:5,6-b']dithiophene-4,9-dione (FL128, 0.65 g, 0.96 mmol) and 3-octyl-5-trimethylstannylthiophene (2.5 eq.) according to the Stille palladium catalysed coupling method as described previously. After which, the product is purified on chromatography column (silica gel, hexane/$CHCl_3$, 7:3) to give 0.62 g (72%) of a green-blue solid.

$^1$H NMR ($CDCl_3$, 200 MHz): 7.14 (s, 2H), 6.98 (d, $^4J$=1.2 Hz, 2H), 6.94 (d br, 2H), 2.85 (t, $^3J$=6.8 Hz, 4H), 2.61 (t, $^3J$=7.3 Hz, 4H), 1.75-1.52 (m, 8H), 1.45-1.20 (m, 40H), 0.95-0.80 (m, 12H).

$^{13}$C NMR ($CDCl_3$, 50 MHz): 186.57 (2C=O), 155.31 (2C), 143.83 (2C), 140.55 (2C), 140.33 (2C), 139.43 (2C), 136.37 (4C), 134.36 (2C), 127.81 (2C), 120.91 (2C), 114.07 (2C), 31.89 (4C), 30.42 (4C), 29.57 (4C), 29.43 (4C), 29.34 (4C), 29.28 (4C), 22.68 (4C), 14.13 (4C).

Elementary analysis, found (calculated): C, 73.85 (74.12); H, 8.14 (8.22); S, 13.95 (14.13).

VI.11. 2-bromo-7-(4-(diphenylamino)phenyl)-3,8-dioctyl-s-indaceno[1,2-b:5,6-b']dithiophen-4,9(4aH,10aH)-dione [YKP116]

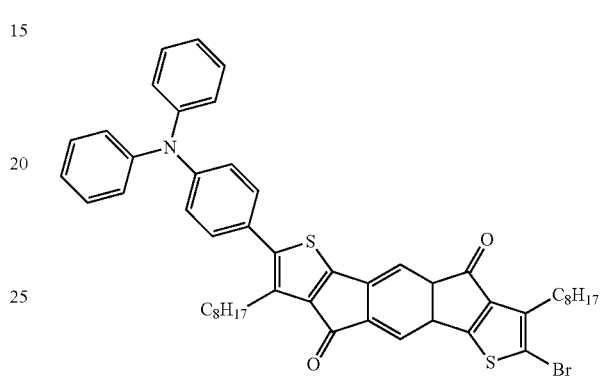

Into a two necked flask, are introduced 400 mg (0.59 mmol, 1 eq.) of bromine compound FL128 and 232 mg (0.65 mmol, 1.1 eq.) of 4-(diphenylamino)phenylboronic acid in the presence of 3 eq. of $K_2CO_4$ and 44 mg (4% molar) of $Pd(PPh_3)_4$ in 35 mL of THF, 2.5 mL of water and 2 mL of toluene. The mixture is stirred for 14 h at 75° C. After treatment of the mixture with 100 mL of water, the aqueous phase is washed with 2×100 mL of ether. The organic phases are washed with 2×100 mL of saturated NaCl solution and dried on $Na_2SO_4$. After filtration and evaporation of the solvent, the purification is carried out on silica column with an eluent [cyclohexane/dichloromethane: 8/2]. 210 mg of final bottle-green compound which recrystallizes in hexane (yield of 42.24%) are obtained.

$^1$H NMR ($CD_2Cl_2$): 7.32-7.24 (m, 7H), 7.13-7.02 (m, 9H), 2.66 (q, 4H), 1.57 (t, 8H), 1.25 (s, 16H), 085 (t, 6H)

VI.12. 4-(7-(4-(diphenylamino)phenyl)-3,8-dioctyl-4,9-dioxo-4,4$\underline{a}$,9,10 $\underline{a}$-tetrahydro-s-indaceno[1,2-b:5,6-b']dithiophen-2-yl)benzalhyde [YKP121]

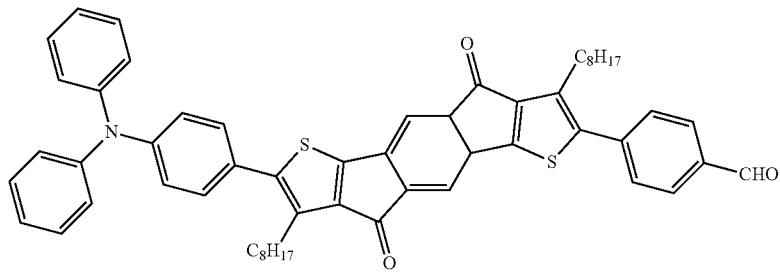

Into a three-necked flask under an argon atmosphere, 40 mg (0.267 mmol, 1.5 eq.) of 4-formylphenylboronic acid and 150 mg (0.178 mmol, 1 eq.) of YKP116 is introduced in the presence of 74 mg (3 eq.) of $K_2CO_3$. The whole is dissolved in a previously de-gassed mixture of 0.5 mL of water and 15 mL of THF. After 30 min stirring at 60° C., 10.3 mg (5% molar) of $Pd(PPh_3)_4$ is added to the reaction medium. The whole is stirred for 14 h at 75° C. After treatment of the mixture with 100 mL of water the aqueous phase is washed with 2×100 mL of ether. The organic phases are washed with 2×100 mL of saturated NaCl solution and dried on $Na_2SO_4$. After filtration and evaporation of the solvent, purification is carried out on a silica column with eluent [hexane/Ethyl ether: 8/2]. 60 mg of final midnight-blue compound YKP121 is obtained (yield of 39%).

$^1$H NMR ($CD_2Cl_2$): 10 (s, 1H), 7.88 (d, 2H), 7.61 (d, 2H), 7.32-7.24 (m, 7H), 7.13-7.02 (m, 9H), 2.70 (q, 4H), 1.61 (t, 4H), 1.20 (s, 20H), 081 (t, 6H)

VII. Colorants According to the Invention and Liquid Electrolyte Cells

To demonstrate the advantages of a colorant according to the invention, we used a colorant YKP28 described in the literature as particularly efficient (9%) and compared the latter to the colorant YKP29, the structure of which is modified with respect to that of YKP28 by introduction of a thiophene in the pi-conjugated system.

VII.1. Materials and Methods

A. Preparation of Liquid Electrolyte Devices.

The mat films of ZTO (for "Zinc Tin Oxide") fibres were rinsed with ethanol and then fritted at 500° C. for 30 min. After cooling to 80° C., the ZTO electrodes were immersed in $3×10^{-4}$ Mol·$L^{-1}$ of purified of tetrabutylammonium cis-di(thiocyanato)-N,N'-bis(2,2'-bipyridyl-4-carboxylic acid-4'-carboxylate) ruthenium(II) (N719, Solaronix), YKP28, and YKP29 in ethanol containing $3×10^{-3}$ Mol·$L^{-1}$ of deoxycholic acid (DCA) for 15 h at ambient temperature.

For the counter electrode, FTO (for "Fluorine-doped Tin Oxide") plates were reamed with a micro-drill, washed with a 0.1 Mol·$L^{-1}$ HCl solution in ethanol, and then washed in a bath subjected to ultrasounds with water and ethanol for 15 min. A platinum counter electrode was prepared by pouring by gravity 5 mM of $H_2PtCl_6$ in isopropyl alcohol onto the FTO plates washed and then fritted at 400° C. for 20 min under conditioned air. The ZTO electrodes having adsorbed the colorant were rinsed with ethanol and dried under nitrogen flow. The ZTO electrodes having adsorbed the colorant were assembled and sealed with the counter electrode using thermal adhesive films (Surlyn, Dupont 1702, 25 μm thickness) as polymer shims to produce sandwich type cells. The electrolyte liquid is constituted of 0.7 Mol·$L^{-1}$ of 1-propyl-3-methylimidazolium iodide, 0.03 Mol·$L^{-1}$ of iodine, 0.1 Mol·$L^{-1}$ of lithium iodide and 0.5 Mol·$L^{-1}$ of 4-tert-butylpyridine in a mixture of acetonitrile and valeronitrile (85/15 v/v). An electrolytic solution was introduced via a hole drilled in the counter electrode. Finally, the holes were sealed with hot melt films and a cover glass. The typically active surface of the cell was around 0.36 $cm^2$.

B. Photovoltaic and Photoelectric Measurements.

The photovoltaic measurements of the DSSC (for "Dye Sensitized Solar Cells") implemented a solar simulator (AM 1.5 solar simulator) between the sample and a 450 W xenon excimer lamp. The intensity of the simulated light was calibrated with a Si reference solar cell equipped with a KG5 filter for an overall irradiation of around AM 1.5. The photovoltaic characteristics of the DSSC were obtained by applying a polarisation of external potential to the cells and by measuring the photocurrent generated with a model 2400 Keithley source counter. The IPCE (for "Incident Photon-to-Current conversion Efficiency") was measured as a function of the wavelengths of 300 nm to 800 nm using an IPCE system specially adapted for solar cells sensitized by a colorant. A 75 W xenon lamp was used as light source to generate a monochromatic beam. The calibration was performed using a silicon photodiode calibrated at the NIST (for "National Institute of Standards and Technology") as standard. The IPCE values were collected at a low chopping speed of 4 Hz. The electrical impedance spectra were measured using an impedance analyser (Solatron 1260) at an open-circuit potential under a AM 1.5 (100 mW/$cm^2$) full sun illumination, with a range of frequencies of $0.1~10^5$ Hz. The amplitude of the alternating signal was 10 mV. The impedance parameters were determined by adjusting the impedance spectra using Z-plot software.

VII.2. Results Obtained

A. Absorption Spectrum of the Colorants.

Figure 2:
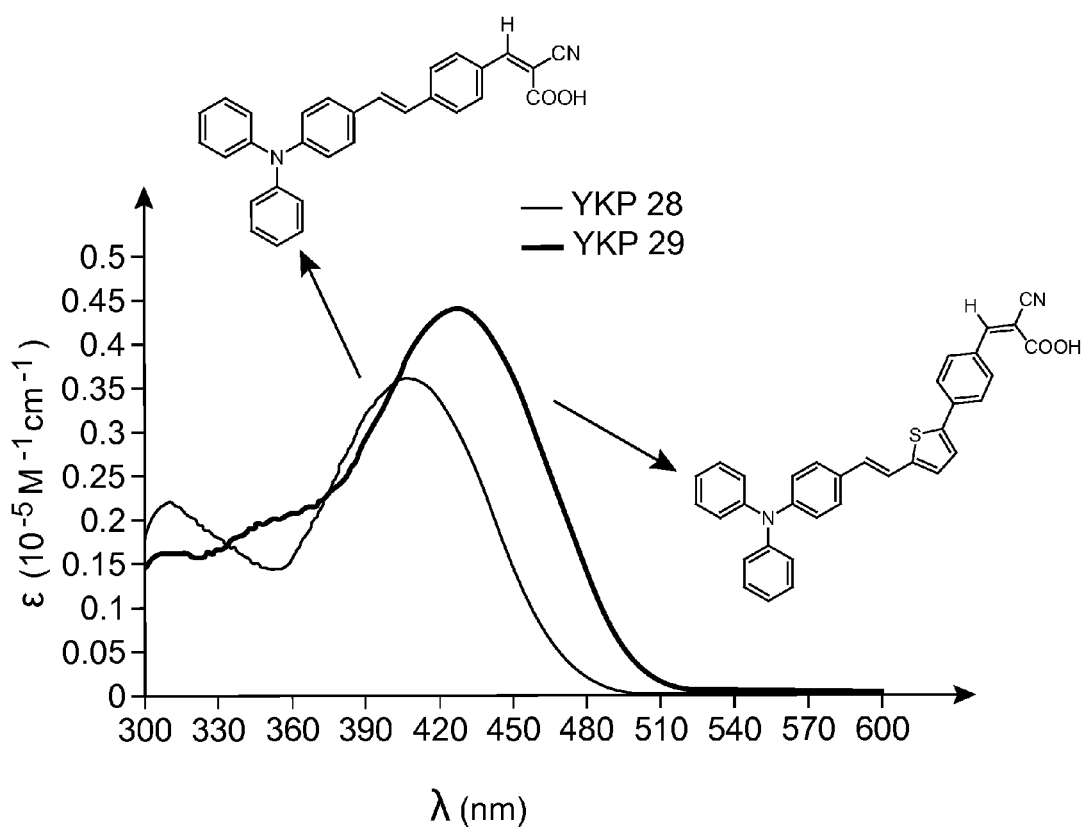
FIG. 2 shows the absorption spectrum of an organic colorant according to the present invention (YKP29) compared to the absorption spectrum of a control organic colorant (YKP28).

The introduction of thiophene units into the structure of the YKP28 makes it possible in fact to increase the electron delocalisation of the pi-conjugated system and has the result of shifting, into the visible part of the solar spectrum, the maximum absorption band (λmax) and increasing, in a significant manner, the molar absorption coefficient, as perfectly illustrated in FIG. 2.

In this case, a shift of 20 nm of the absorption spectrum of the colorant in ethanol solution is observed, which passes from 407 nm for the compound YKP28 to 427 nm for the compound YKP29. Moreover, an increase in the molar absorption coefficient is observed; a coefficient of 36100 $M^{-1}·cm^{-1}$ is measured in the case of YKP28 compared to 44600 $M^{-1}·cm^{-1}$ in the case of YKP29, i.e. an increase of 24%.

B. Photovoltaic Conversion Yields.

In order to prove that the colorants having an improved molar absorption coefficient make it possible to improve the photovoltaic conversion outputs, the use of said colorants in sensitized solar cells was achieved by employing the following device structure:

Sensitization with the derivative of ruthenium N719 or the colorants YKP28 and YKP29 of an electrode of $TiO_2$ on FTO.

Setting with polymer shims and counter electrode and filling with electrolyte liquid containing the redox couple and, more particularly, the redox couple $I^-/I_3^-$.

During the optimisation of the devices, it is observed that the thickness of the $TiO_2$ layer may be reduced in a significant manner with said organic colorants, which have high molar absorption coefficients. The optimal performances with $TiO_2$ electrodes are obtained for an oxide thickness of 5 μm in the case of organic colorants compared to 12 μm in the case of the ruthenium based reference compound. This is very advantageous economically because a reduction in the thicknesses of $TiO_2$ makes it possible to reduce the price of the cells.

In an interesting manner, the compound YKP29 has highly improved outputs (Table 1 hereafter) and this is a direct consequence of its improved capacity to capture photons, its molar absorption coefficient being higher and its absorption range shifted into the visible part.

The fill factor (FF) is also known as the quality factor: it reflects the ability of the cell to efficiently evacuate photogenerated charges, it is the ratio between the maximum power which may be obtained with a cell over the real power.

TABLE 1

| Colorant | $V_{OC}$ (mV) | $J_{SC}$ (mA/cm$^2$) | FF | eff (%) | surface |
|---|---|---|---|---|---|
| N719 | 773 | 17.02 | 0.643 | 9.04 | 0.360 |
| YKP 28 | 626 | 12.03 | 0.677 | 5.09 | 0.362 |
| YKP 29 | 646 | 14.34 | 0.687 | 5.96 | 0.357 |

The fact that compounds with high molar absorption coefficients show better performances at low thickness of TiO$_2$ is particularly interesting for the development of solid electrolyte cells.

Indeed it is possible to replace a liquid electrolyte which comprises numerous drawbacks in terms of application (leaks, corrosion, evaporation) by a solid p-type conductor electrolyte. It is generally the compound SpiroOMeTAD that is conventionally employed as p-type conductor [14]. In the case of solid electrolyte devices, a limiting factor concerns the penetration of the electrolyte into the mesoporous oxide layer. It is extremely difficult to impregnate layers of thicknesses greater than 3 µm by solid electrolytes. It is thus advantageous to use organic colorants with high absorption coefficients to make it possible to reduce the thickness without however losing light collection efficiency.

VIII. Colorants According to the Invention and Solid Electrolyte Cells

VIII.1. Materials and Methods

Solid electrolyte devices were produced with colorants according to the invention and compared to a reference molecule in the field: D102.

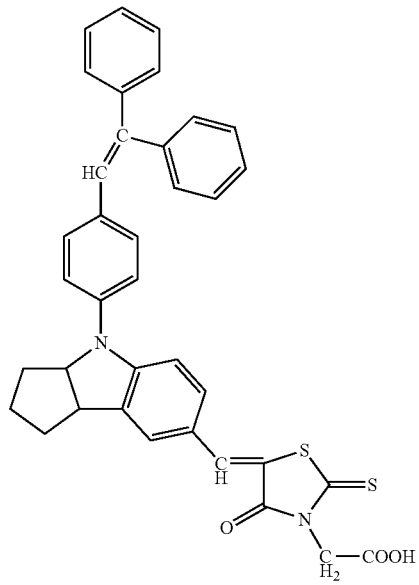

D102

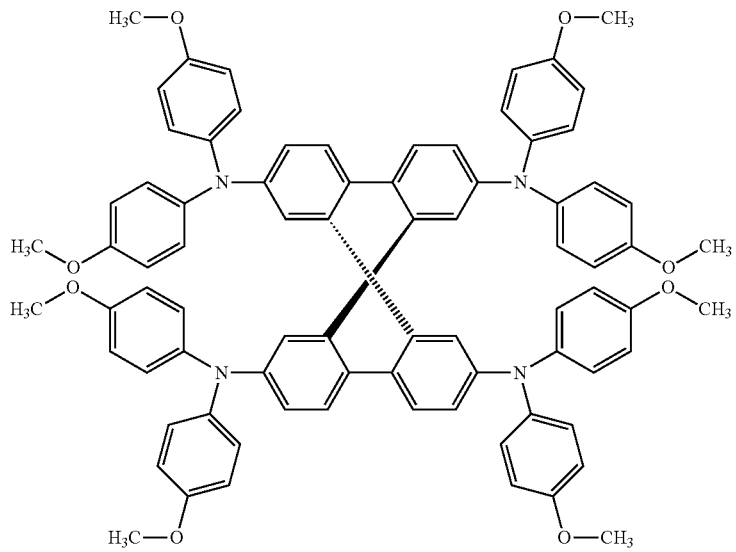

spiro-OMeTAD

Structure of the Compounds Used

The procedure employed has the following main steps:
- deposition of compact layers of $TiO_2$ (250 nm) (hole blocker) by spray pyrolysis on etched glass/FTO substrates;
- deposition of porous layers of $TiO_2$ from a commercially available adhesive of DYESOL mark and calcination heat treatment, thickness obtained 3 μm;
- sensitization with a derivative of Indoline D102 sold by Mitsubishi Paper Mills (Japan), the colorant YKP28 or the colorant YKP29, particularly between 5 and 24 h, ideally between 12 and 16 h;
- filling of the pores with the molecular glass 2,2',7,7'-tetrakis(N,N-dip-methoxypheny-amine)-9,9'-spirobifluorene designated "spiro-OMeTAD" (Merck);
- deposition of a gold counter electrode (of several hundreds of nanometers) by evaporation under vacuum ($10^{-6}$ mbar). The active surface is 0.2 $cm^2$.

VIII.2. Results Obtained

The results obtained are presented in FIG. 3 and Table 2 below.

TABLE 2

| Colorant | $V_{OC}$ (mV) | $J_{SC}$ (mA/$cm^2$) | FF | eff (%) |
|---|---|---|---|---|
| D102 | 830 | 8.03 | 0.67 | 4.5 |
| YKP28 | 670 | 5.56 | 0.48 | 1.8 |
| YKP29 | 740 | 8.10 | 0.62 | 3.7 |

Figure 3:
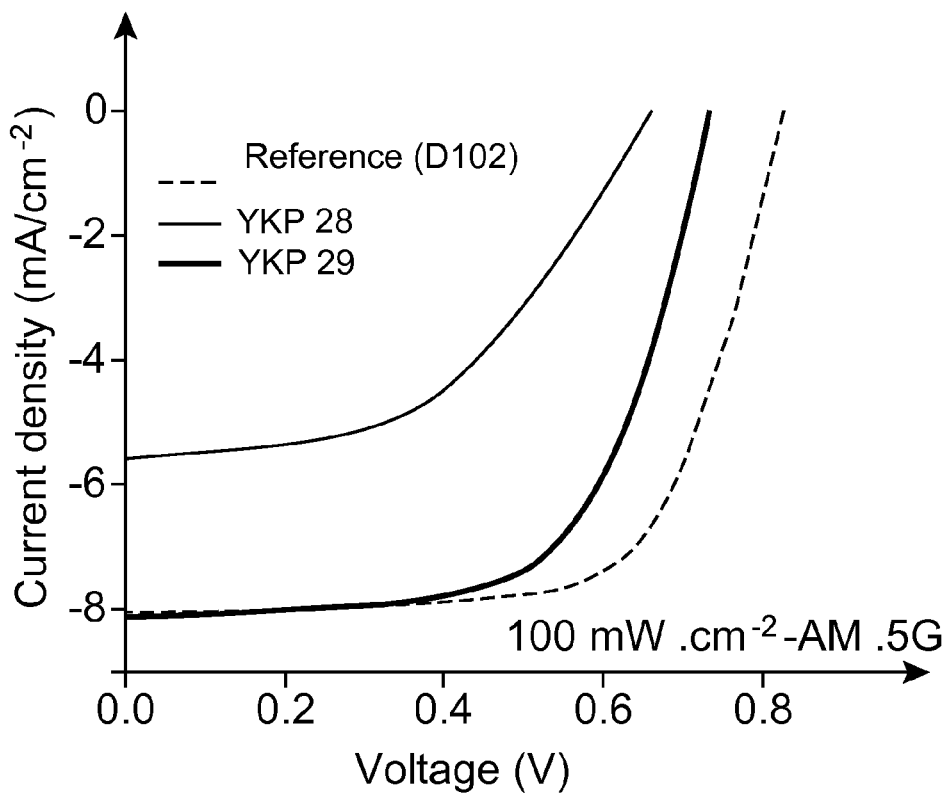
FIG. 3 shows the current density delivered by photovoltaic cells comprising an organic colorant according to the present invention (YKP29) or control organic colorants (YKP28 and D102).

From the results presented in FIG. 3 and Table 2, it appears that the molecule YKP29 according to the invention makes it possible to improve the current density delivered by the cells even though the overall yield is less than the D102 employed as reference.

It should also be noted that the molecule YKP29 according to the invention exhibits significantly improved outputs compared to the YKP28 molecule published in 2008.

VIII.3. Results Obtained with Another Metal Oxide

This example of use makes it possible to prove that the colorants according to the invention are also very efficient for the sensitization of other types of metal oxides such as $Zn_2SnO_4$.

The first convincing demonstration of the use of $Zn_2SnO_4$ in colorant sensitized type cells dates from 2007 [15]. In this work, it is the organometallic compound N719 which is employed as a reference and a maximum output of 3.7% was obtained.

Cells with $Zn_2SnO_4$ (ZTO) electrodes sensitized by YKP28 and YKP29 colorants were produced and the efficiencies compared with that of N719 in the same conditions. The following procedure was employed:
- deposition of solutions containing a polymer and the precursors of $Zn_2SnO_4$ in solution by electrospray on etched glass/FTO substrates;
- calcination heat treatment, thickness obtained of 3 μm;
- sensitization with the derivative of ruthenium N719 or our colorants;
- setting with polymer shims and counter electrode and filling with electrolyte liquid containing the redox couple $I^-/I_3^-$.

Table 3 hereafter reports the efficiencies of the cells and demonstrates the superiority of the colorant YKP29 comprising a chromophore of the invention.

TABLE 3

| Colorant | $V_{OC}$ (mV) | $J_{SC}$ (mA/$cm^2$) | FF (%) | eff (%) |
|---|---|---|---|---|
| N719 | 756 | 2.85 | 65.7 | 1.41 |
| YKP 28 | 750 | 6.20 | 71.9 | 3.35 |
| YKP 29 | 717 | 8.11 | 63.2 | 3.67 |

VIII.4. Other Results

Preliminary results (non-optimized) obtained in a solid electrolyte configuration with molecules according to the invention (GB043 and GB062) and the derivative of Indoline D102 presented in FIG. 4 and in Table 4 below.

TABLE 4

| Colorant | $V_{OC}$ (mV) | $J_{SC}$ (mA/$cm^2$) | eff (%) |
|---|---|---|---|
| D102 | 560 | 7.42 | 2.2 |
| GB043 | 610 | 7.11 | 2.4 |
| GB062 | 690 | 11.42 | 3.3 |

Figure 4:
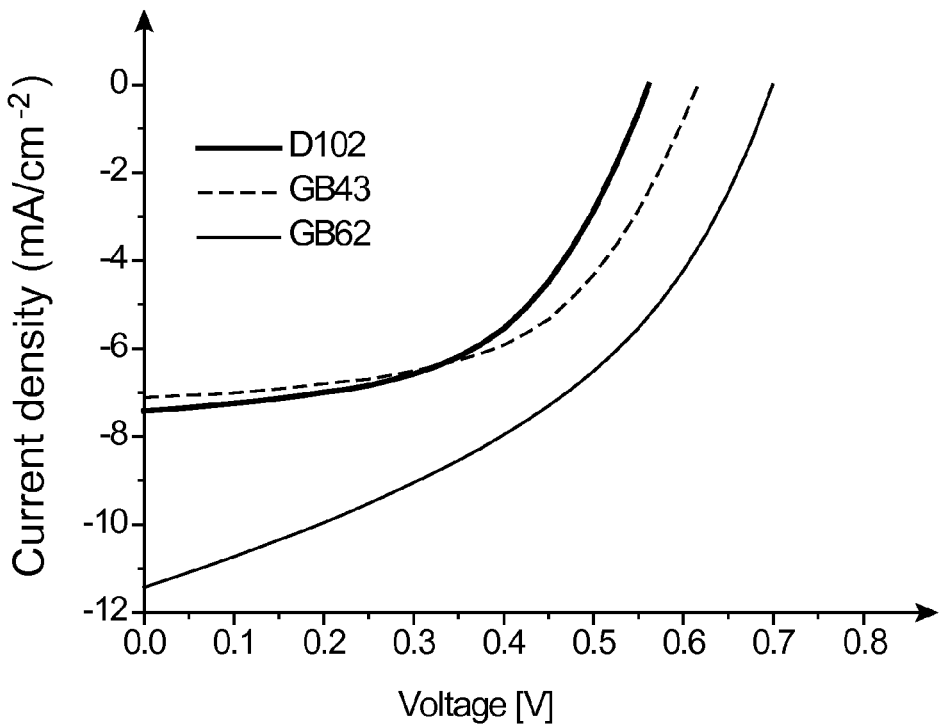
FIG. 4 shows the current density supplied by photovoltaic cells comprising organic colorants according to the present invention (GB043 and GB062) or a control organic colorant (D102).

From the results presented in FIG. 4 and Table 4, it would appear that the compounds of the invention exhibit greater photovoltaic conversion efficiencies than the reference D102 tested under the same conditions. Advantageously, the cells using the compounds of the invention exhibit higher open circuit voltages than that of the commercial reference (D102).

BIBLIOGRAPHY

[1] O'Regan and Grätzel, 1991, "A low-cost, high-efficiency solar cell based on dye-sensitized colloidal $TiO_2$ films", Nature, vol. 353, pages 737-740.

[2] Grätzel, 2009, "Recent advances in sensitized mesoscopic solar cells", Acc. Chem. Res., vol. 42, pages 1788-1798.

[3] Mishra et al, 2009, "Metal-Free Organic Dyes for Dye-Sensitized Solar Cells: From Structure: Property Relationships to Design Rules", Angew. Chem. Int. Ed., vol. 48, pages 2474-2499.

[4] Yan et al, 2010, "Effect of surface etching on the efficiency of ZnO-based dye-sensitized solar cells", Langmuir, vol. 26, pages 7153-7156.

[5] Ooyama et Harima, 2009, "Molecular designs and syntheses of organic dyes for dye-sensitized solar cells", Eur. J. Org. Chem., vol. 2009, pages 2903-2934.

[6] Wang et al, 2005, "A high molar extinction coefficient sensitizer for stable dye-sensitized solar cells", J. Am. Chem. Soc., vol. 127, pages 808-809.

[7] International application WO 2009/109499 in the name of BASF SE and published on Sep. 11, 2009.

[8] Chen et al, 2007, "Effect of tetrahydroquinoline dyes structure on the performance of organic dye-sensitized solar cells", Chem. Mater., vol. 19, pages 4007-4015.

[9] Wu et al, 2010, "Efficient and stable dye-sensitized solar cells based on phenothiazine sensitizers with thiophene units", J. Mater. Chem., vol. 20, pages 1772-1779.

[10] Xu et al, 2008, "New triphenylamine-based dyes for dye-sensitivized solar cells", J. Phys. Chem. C, vol. 112, pages 874-880.

[11] Liu et al, 2008, "Simple organic molecules bearing a 3,4-ethyledioxythiophene linker for efficient dye-sensitivized solar cells", Chem. Commun., vol. 2008, pages 5152-5154.

[12] Zeng et al, 2010, "Efficient dye-sensitized solar cells with an organic photosensitizer featuring orderly conjugated ethylenedioxythiophene and dithienosilole blocks", Chem. Mater., vol. 22, pages 1915-1925.

[13] Chen et al, 2010, "High molar extinction coefficient branchlike organic dyes containing di(p-tolyl)phenylamine donor for dye-sensitized solar cells applications", J. Phys. Chem. C, vol. 114, pages 3280-3286.

[14] Cappel et al, 2009, "Dye regeneration by Spiro-MeO-TAD in solid state dye-sensitized solar cells studied by photoinduced absorption spectroscopy and spectroelectrochemistry", J. Phys. Chem. C, vol. 113, pages 6275-6281.

[15] Tan et al, 2007, "Zinc stannate ($Zn_2SnO_4$) Dye-Sensitized Solar Cells", J. Am. Chem. Soc., vol. 129, pages 4162-4163.

[16] Kalyanasundaram K., 2010, "Dye Sensitized Solar Cells", (ed.), EPFL Press, ISBN: 978-2-940222-36-0 CRC Press ISBN 978-1-4398-0866-5.

The invention claimed is:

1. Organic colorant corresponding to the following structure (I):

eD-pi-conjugated chromophore-L-A    (I)

in which
eD represents an electron donor segment,
L represents a covalent bond or a spacer segment,
A represents an electron attractor segment able to form a covalent bond with a semi-conductor,
wherein the pi-conjugated chromophore comprises at least two aromatic rings, wherein at least one is a thiophene ring, providing that, when one of the two aromatic rings comprised in the pi-conjugated chromophore is of thiophene type, said chromophore has at least one unit chosen from:

(X)

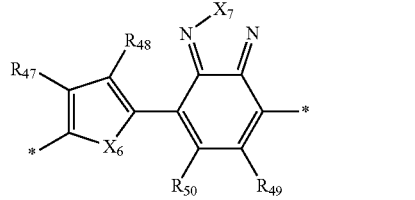

(XI)

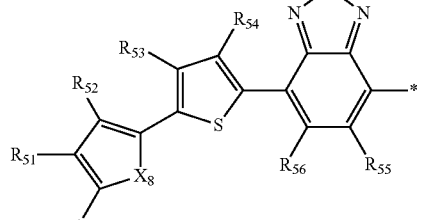

(XII)

in which
the radicals $R_{47}$ to $R_{64}$, identical or different, represent a hydrogen, an alkyl group optionally substituted or an aryl group optionally substituted, $X_8$ is chosen from S, Se and O, and $X_6$ and $X_7$ are such that one of the two represents S and the other is either Se, or O.

2. Organic colorant according to claim 1, wherein said electron donor segment (eD) is an amino group of $(Z_1)(Z_2)$ N-type, with $Z_1$ and $Z_2$, identical or different, representing an alkyl group optionally substituted or an aryl group optionally substituted.

3. Organic colorant according to claim 1, said electron acceptor segment (A) is a carboxylic acid group, a cyanoacrylic acid group, a phosphonic group, a dithiocarboic group or a group corresponding to any of the following formula:

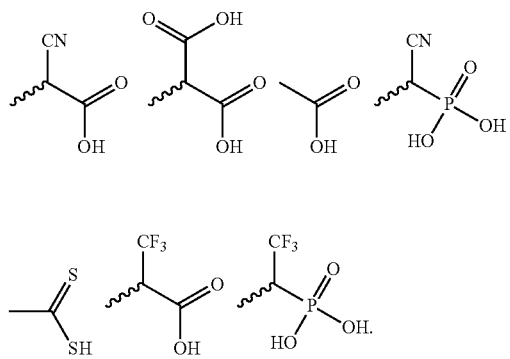

4. Organic colorant according to claim 1, wherein said spacer L is a pi-conjugated function.

5. Organic colorant according to claim 1, wherein said colorant comprises a unit which corresponds to all or part of the spacer L or to a part of the pi-conjugated chromophore or to the electron acceptor segment (i.e. unit -L-A) corresponding to any of the following formulae:

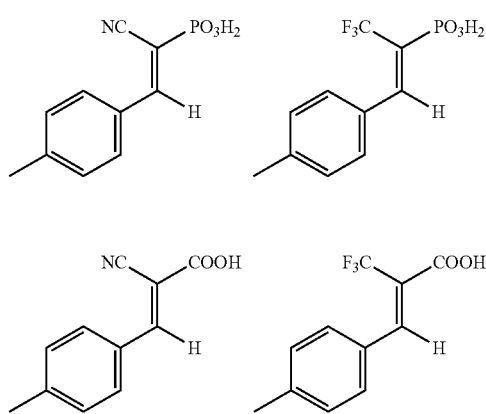

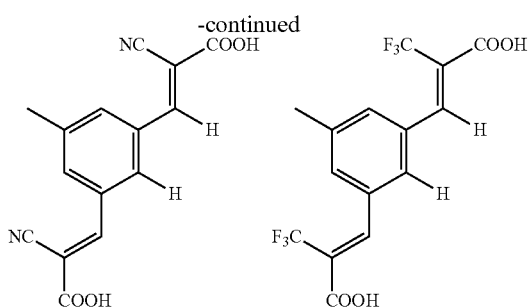
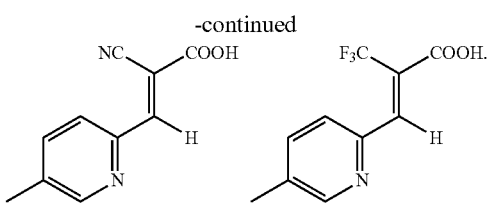
6. Organic colorant according to claim 1, said organic colorant is selected from the group consisting of the following compounds:
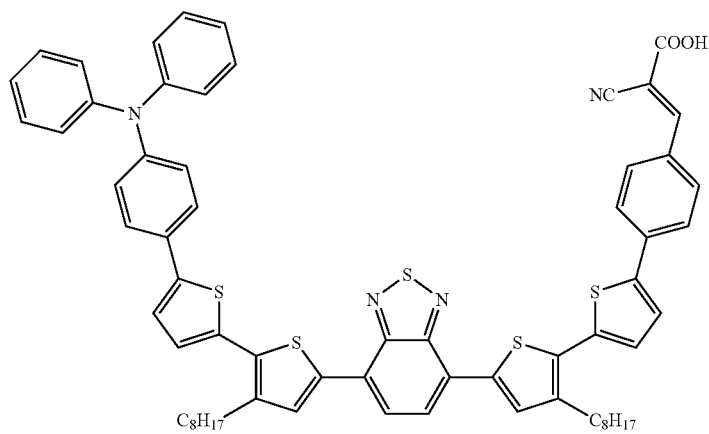
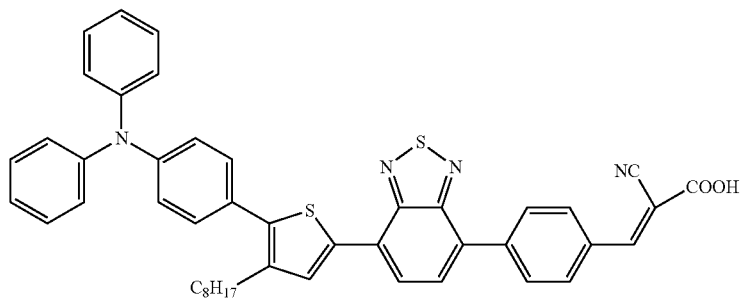
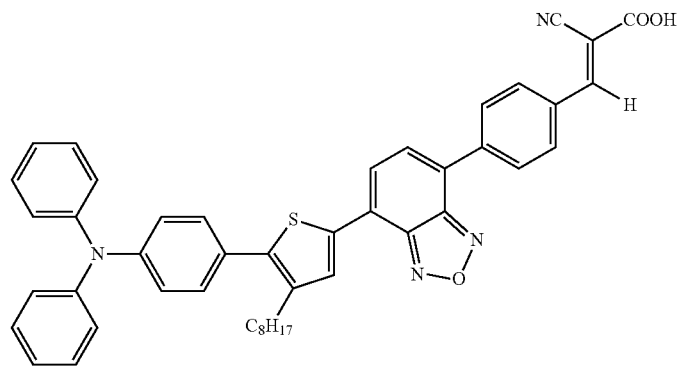

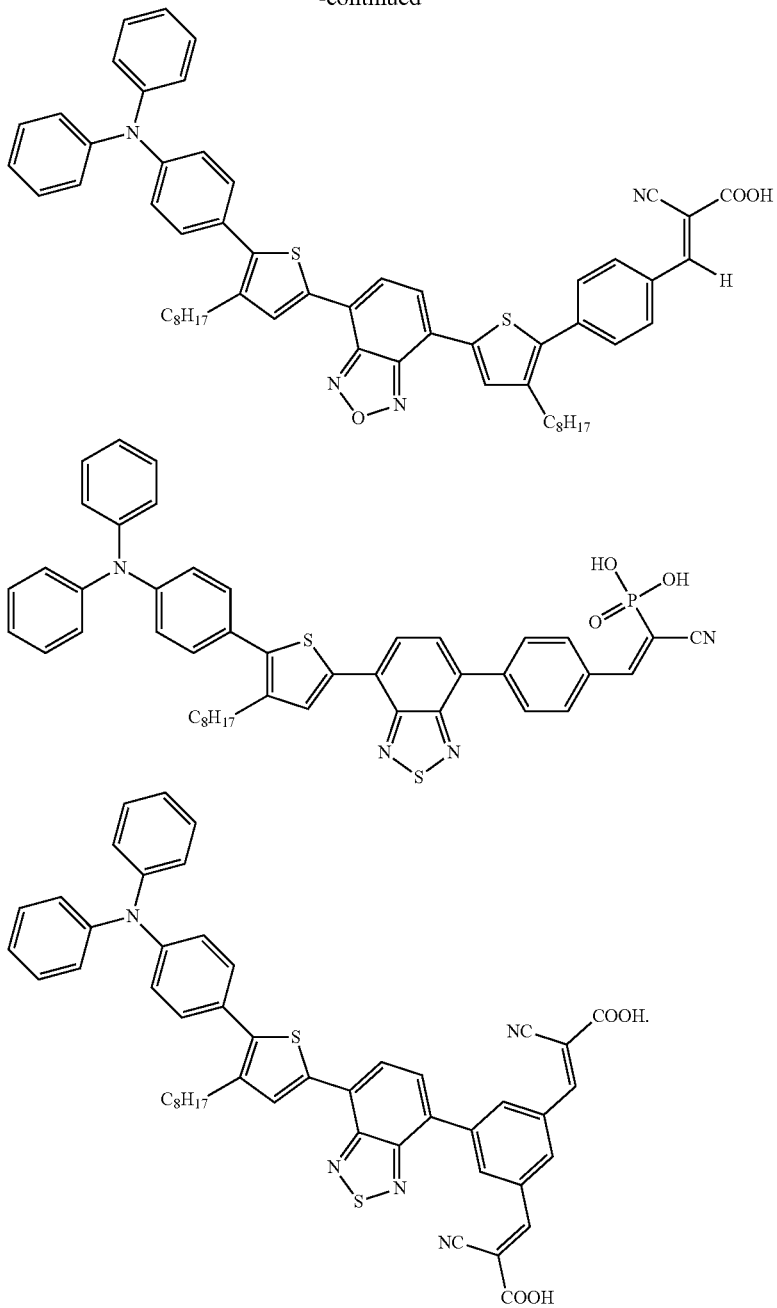

7. Photovoltaic device having a nanostructured semi-conductor metal oxide layer sensitized by an organic colorant as defined in claim 1.

8. Photovoltaic device according to claim 7, wherein said photovoltaic device further comprises two electrodes, designated anode and counter electrode, and separated from each other by an electrolyte and optionally polymer shims.

9. Photovoltaic device according to claim 7, wherein said semi-conductor metal oxide is a binary, tertiary or quaternary metal oxide.

10. Photovoltaic device according to claim 7, wherein said nanostructured semi-conductor metal oxide layer is in the form of a mesoporous layer deposited on said anode.

11. Photovoltaic device according to claim 7, wherein said electrolyte is a liquid, an ionic liquid, a gel or a solid.

12. Organic colorant according to claim 1, wherein said spacer L is an optionally substituted alkenylene or alkynylene chain or an arylene chain optionally substituted.

* * * * *

UNITED STATES PATENT AND TRADEMARK OFFICE
CERTIFICATE OF CORRECTION

| | |
|---|---|
| PATENT NO. | : 9,171,676 B2 |
| APPLICATION NO. | : 14/356031 |
| DATED | : October 27, 2015 |
| INVENTOR(S) | : Renaud Demadrille et al. |

Page 1 of 1

It is certified that error appears in the above-identified patent and that said Letters Patent is hereby corrected as shown below:

Title Page, Item 56, OTHER PUBLICATIONS: "Carpel, U., et al.," should be
-- Cappel, U., et al., --.

Signed and Sealed this
Second Day of February, 2016

Michelle K. Lee
*Director of the United States Patent and Trademark Office*